US008837222B2

(12) United States Patent
Tanzawa

(10) Patent No.: US 8,837,222 B2
(45) Date of Patent: Sep. 16, 2014

(54) METHODS AND APPARATUSES INCLUDING A SELECT TRANSISTOR HAVING A BODY REGION INCLUDING MONOCRYSTALLINE SEMICONDUCTOR MATERIAL AND/OR AT LEAST A PORTION OF ITS GATE LOCATED IN A SUBSTRATE

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 310 days.

(21) Appl. No.: 13/282,237

(22) Filed: Oct. 26, 2011

(65) Prior Publication Data

US 2013/0107620 A1 May 2, 2013

(51) Int. Cl.
*G11C 16/04* (2006.01)
*H01L 21/04* (2006.01)
*H01L 27/115* (2006.01)

(52) U.S. Cl.
CPC ................ *G11C 16/04* (2013.01); *H01L 21/04* (2013.01); *H01L 27/11524* (2013.01); *H01L 27/11556* (2013.01); *G11C 16/0408* (2013.01)
USPC ................................ 365/185.17; 365/185.11

(58) Field of Classification Search
USPC ........................... 365/185.17, 185.11, 185.01
See application file for complete search history.

(56) References Cited

U.S. PATENT DOCUMENTS

| | | | | |
|---|---|---|---|---|
| 5,338,959 | A | 8/1994 | Kim et al. | |
| 6,952,038 | B2 | 10/2005 | Hsu et al. | |
| 7,023,739 | B2 | 4/2006 | Chen et al. | |
| 7,554,873 | B2 | 6/2009 | Lee et al. | |
| 7,919,809 | B2 | 4/2011 | Lee et al. | |
| 7,923,767 | B2 | 4/2011 | Higashitani | |
| 2001/0000111 | A1 * | 4/2001 | Blanchard | 257/286 |
| 2004/0124466 | A1 | 7/2004 | Walker et al. | |
| 2004/0125629 | A1 * | 7/2004 | Scheuerlein et al. | 365/17 |
| 2009/0097309 | A1 * | 4/2009 | Mizukami et al. | 365/184 |

FOREIGN PATENT DOCUMENTS

| | | |
|---|---|---|
| CN | 100365818 | 1/2008 |

* cited by examiner

*Primary Examiner* — Vu Le
(74) *Attorney, Agent, or Firm* — Schwegman Lundberg & Woessner, P.A.

(57) ABSTRACT

Some embodiments include apparatuses and methods having a memory cell string including memory cells located in different levels of the apparatuses and a select transistor coupled to the memory cell string. In at least one of such apparatuses, the select transistor can include a body region including a monocrystalline semiconductor material. Other embodiments including additional apparatuses and methods are described.

20 Claims, 58 Drawing Sheets

200B

300A

400A

400B

500

500

500

500

500

500

1500

2200

2200

2200

2200

3300

3300

3800

METHODS AND APPARATUSES INCLUDING A SELECT TRANSISTOR HAVING A BODY REGION INCLUDING MONOCRYSTALLINE SEMICONDUCTOR MATERIAL AND/OR AT LEAST A PORTION OF ITS GATE LOCATED IN A SUBSTRATE

BACKGROUND

Memory devices, such as flash memory, are widely used in computers and many electronic products. Such memory devices have numerous memory cells. Information can be stored into the memory cells in a write operation. The stored information can be retrieved in a read operation or can be cleared in an erase operation. As memory cell density increases for a given device area, producing these memory devices to suit some performance preferences may pose a challenge.

BRIEF DESCRIPTION OF THE DRAWINGS

FIG. 5 through FIG. 14B show processes of forming a memory device (e.g., the memory device of FIG. 2A) with a shared bottom source select gate, according to an embodiment of the invention.

DETAILED DESCRIPTION

Figure 1:
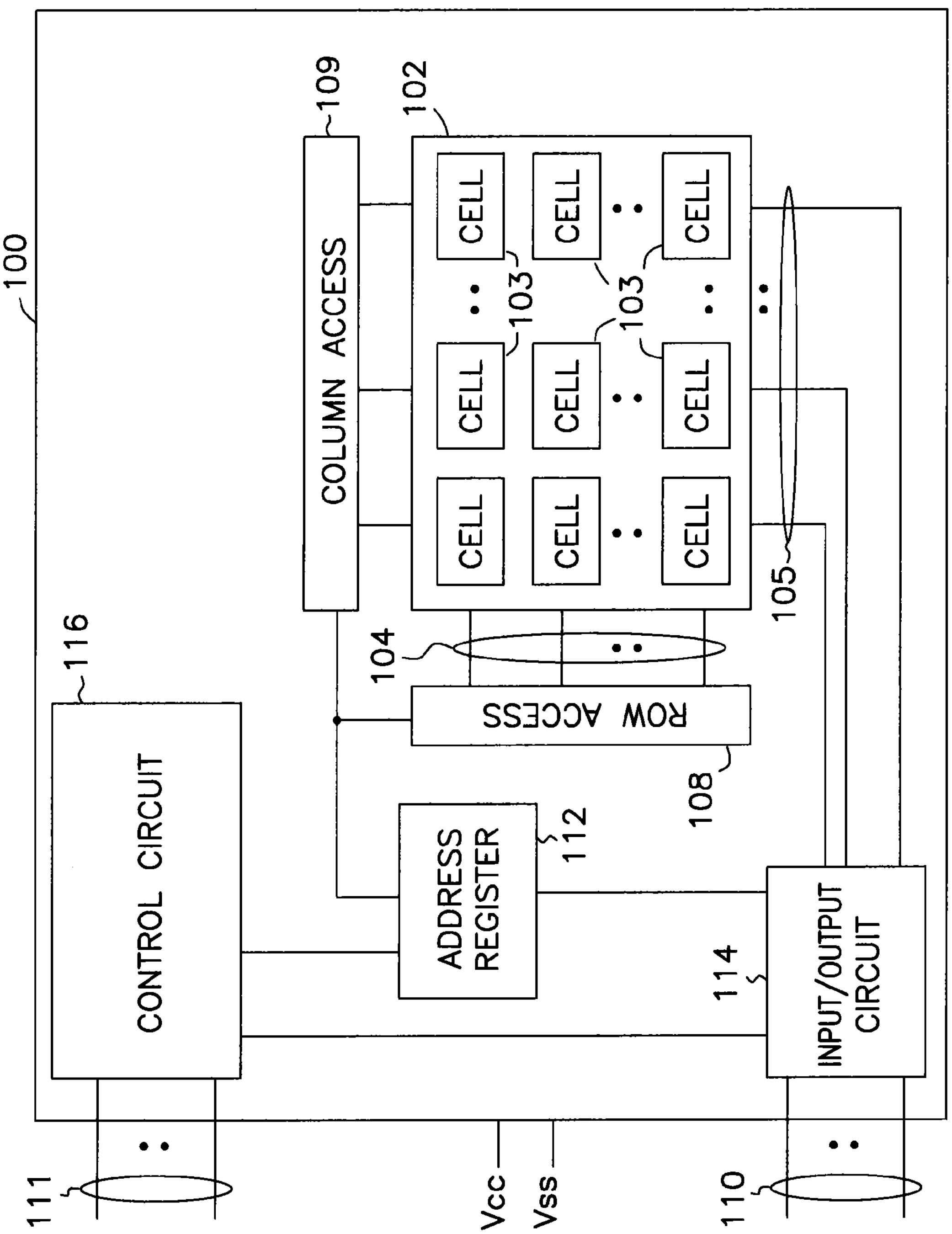
FIG. 1 shows a block diagram of a memory device, according to an embodiment of the invention.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

At least a portion of memory device 100 can include structures similar to or identical to memory devices described below with reference to FIG. 2A through FIG. 40.

Figure 2A:
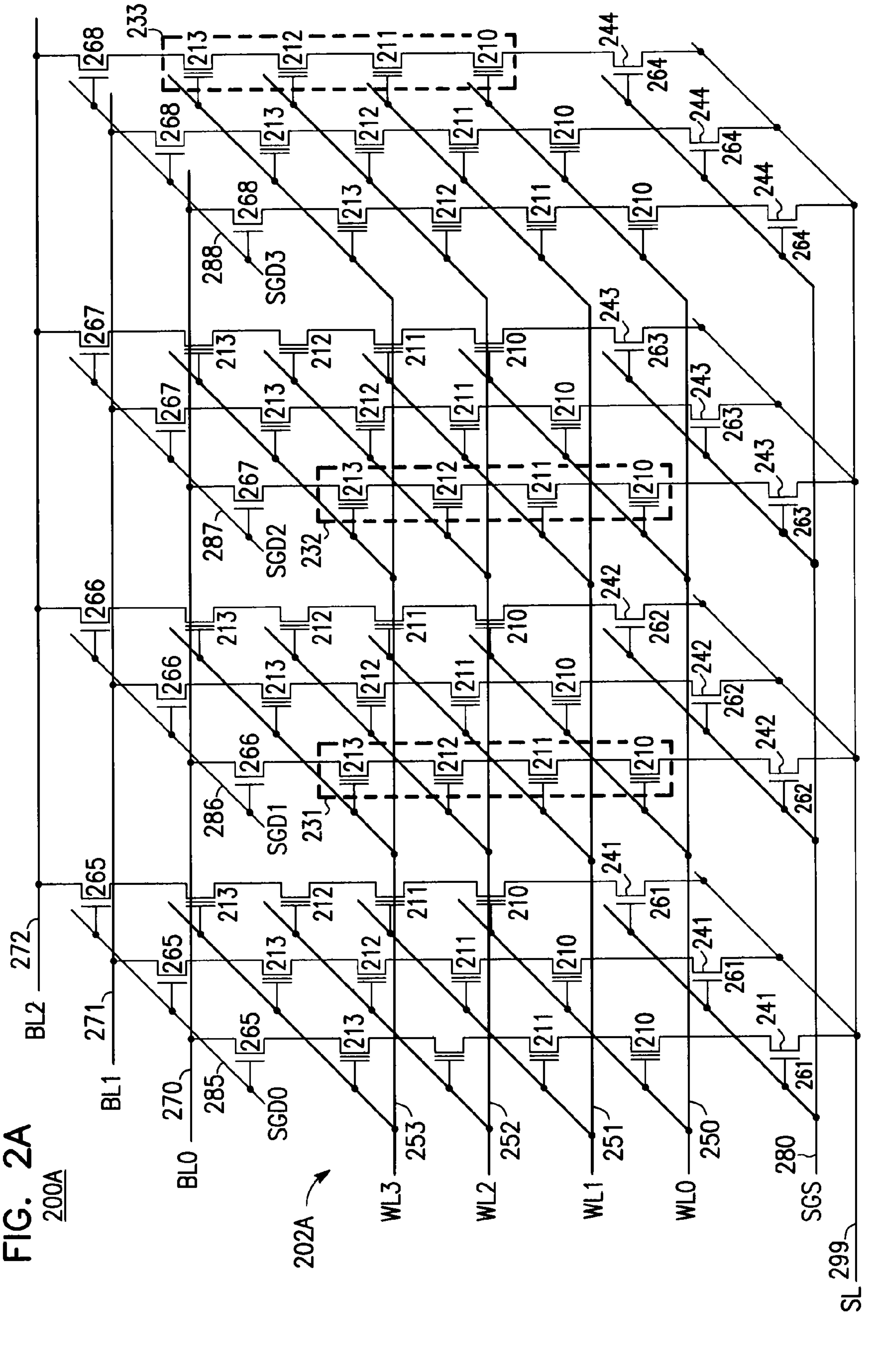
FIG. 2A shows a schematic diagram of a portion of a memory device having a memory array with a shared bottom source select gate, according to an embodiment of the invention.

FIG. 2A shows a schematic diagram of a portion of a memory device 200A having a memory array 202A with a gate 280 (e.g., a shared bottom source select gate), according to an embodiment of the invention. Gate 280 can form part of a select line (e.g., source select line) of memory device 200A. Memory device 200A can include control gates 250, 251, 252, and 253 that can carry corresponding signals WL0, WL1, WL2, and WL3. Each of control gates 250, 251, 252, and 253 can form part of a respective access line of memory device 200A. Memory device 200A can include lines 270, 271, and 272 that carry signals BL0, BL1, and BL2, respectively. Each of lines 270, 271, and 272 can form part of a respective data line of memory device 200A. FIG. 2A shows four control gates 250, 251, 252, and 253 and three lines 270, 271, and 272 as an example. The number of such control gates and lines can vary.

Memory device 200A can include memory cells 210, 211, 212, and 213, and transistors (e.g., select transistors) 261 through 268. Memory cells 210, 211, 212, and 213 can be arranged in memory cell strings, such as memory cell strings 231, 232, and 233. For simplicity, in FIG. 2A, only three of the memory cell strings are labeled (231, 232, and 233).

Each memory cell string in memory device 200A can be coupled to two associated transistors among transistors 261 through 268. For example, memory cell string 231 can be coupled to transistor 262 (directly under string 231) and transistor 266 (directly over string 231).

FIG. 2A shows an example of twelve memory cell strings and four memory cells 210, 211, 212, and 213 in each memory cell string. The number of such memory cell strings and number of such memory cells in each memory cell string can vary.

As shown in FIG. 2A, transistors 261, 262, 263, and 264 can share the same gate 280. Thus, transistors 261, 262, 263, and 264 can be controlled (e.g., turned on or turned off) by the same signal, such as an SGS signal (e.g., source select gate signal) associated with gate 280. Transistors 261, 262, 263, and 264 can include body regions 241, 242, 243, and 244, respectively. During a memory operation, such as a read or write operation, transistors 261, 262, 263, and 264 and can be turned on (e.g., by activating an SGS signal) to couple the memory cell strings of memory device 200A to a line 299 through body regions 241, 242, 243, and 244. Transistors 261, 262, 263, and 264 can be turned off (e.g., by deactivating the SGS signal) to decouple the memory cell strings of memory device 200A from line 299. Line 299 can form part of a source (e.g., a source line) of memory device 200A and can carry a signal, such as signal SL (e.g., source line signal).

Transistors 265, 266, 267, and 268 can include separate gates (e.g., drain select gates) 285, 286, 287, and 288. However, transistors 265 can share the same gate 285. Transistors 266 can share the same gate 286. Transistors 267 can share the same gate 287. Transistors 268 can share the same gate 288. Each of gates 285, 286, 287, and 288 can form part of a respective select line (e.g., drain select line) of memory device 200A.

Transistors 265, 266, 267, and 268 and can be controlled (e.g., turned on or turned off) by corresponding SGD0, SGD1, SGD2, and SGD3 signals (e.g., drain select gate signals) in order to selectively couple the memory cell strings of memory device 200A to their respective lines 270, 271, and 272, during a memory operation, such as a read or write operation. For example, during a memory operation, the SGD1 signal can be activated to couple memory cell string 231 to line 270. The SGD0, SGD2, and SGD3 signals can be deactivated to decouple the other memory cell strings from line 270. During a memory operation (e.g., a read or write operation), only one of the SGD0, SGD1, SGD2, and SGD3 signals can be activated at a time.

Memory cells 210, 211, 212, and 213 can be physically located in multiple levels of memory device 200A, such that memory cells 210, 211, 212, and 213 in the same memory cell string can be stacked over each other in multiple levels of memory device 200A.

Memory device 200A can include structures similar to or identical to the structures of memory device 500 described below with reference to FIG. 5 through FIG. 14B.

Figure 2B:
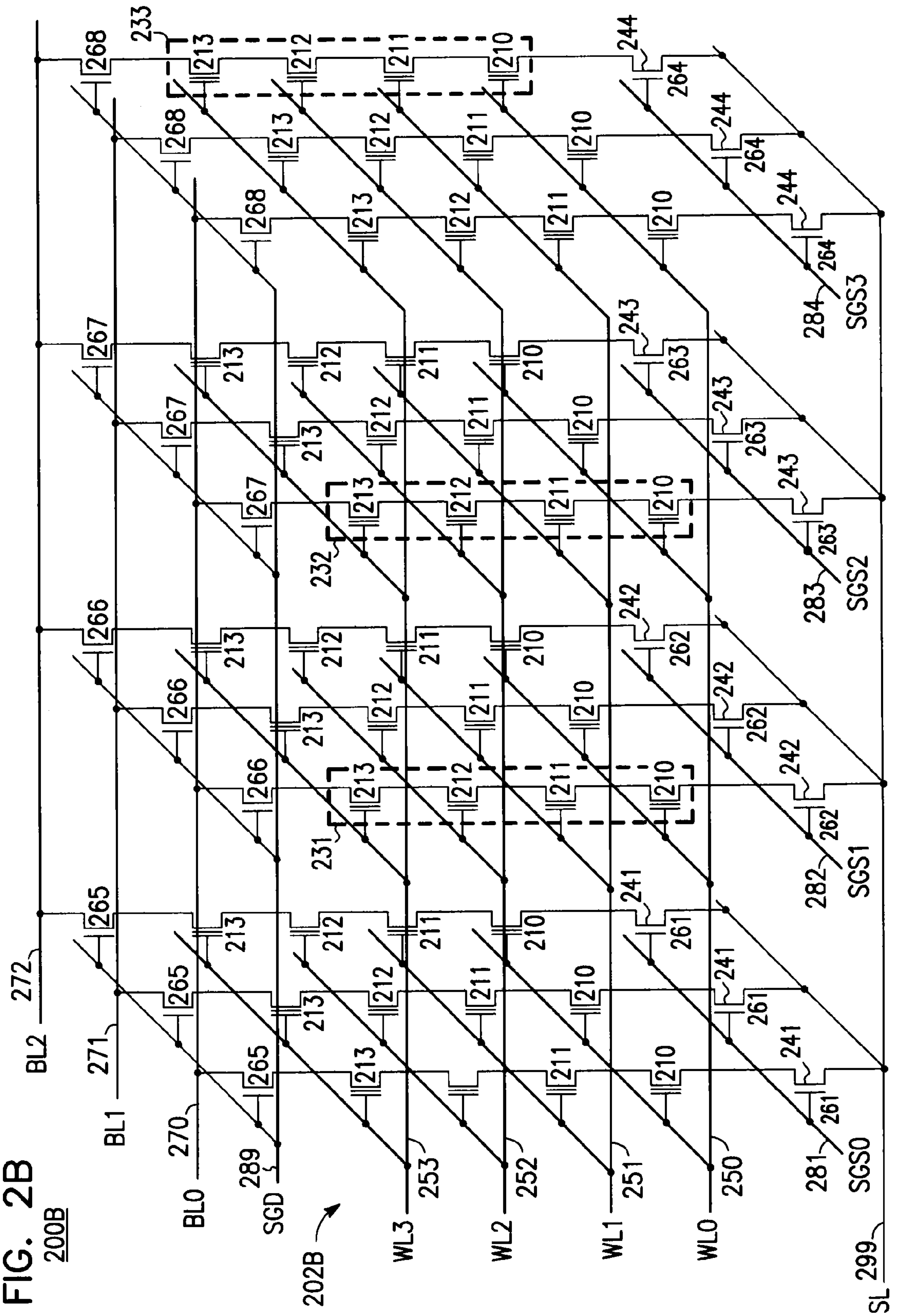
FIG. 2B shows a schematic diagram of a portion of a memory device having a memory array with a shared top drain select gate, according to an embodiment of the invention.

FIG. 2B shows a schematic diagram of a portion of a memory device 200B having a memory array 202B with a gate 289 (shared top drain select gate), according to an embodiment of the invention. Gate 289 can form part of a select line (e.g., drain select line) of memory device 200A. Memory device 200B includes elements that can be similar to or identical to those of memory device 200A of FIG. 2A. For simplicity, detailed description of similar or the identical elements between FIG. 2A and FIG. 2B is not repeated in the description of FIG. 2B.

As shown in FIG. 2B, transistors 265, 266, 267, and 268 can share the same gate 289. Thus, transistors 265, 266, 267, and 268 can be controlled (e.g., turned on or turned off) by the same signal, such as an SGD signal (e.g., source select gate signal) associated with gate 289. During a memory operation, such as a read or write operation, transistors 265, 266, 267, and 268 and can be turned on (e.g., by activating the SGD signal) to couple the memory cell strings of memory device 200B to their respective lines 270, 271, and 272. Transistors 265, 266, 267, and 268 and can be turned off (e.g., by deactivating the SGD signal) to decouple the memory cell strings of memory device 200B from lines 270, 271, and 272.

Transistors 261, 262, 263, and 264 can include separate gates (e.g., source select gates) 281, 282, 283, and 284. However, transistors 261 can share the same gate 281. Transistors 262 can share the same gate 282. Transistors 263 can share the same gate 283. Transistors 264 can share the same gate 284. Each of gates 281, 282, 283, and 284 can form part of a respective select line (e.g., source select line) of memory device 200A.

Transistors 261, 262, 263, and 264 and can be controlled (e.g., turned on or turned off) by corresponding SGS0, SGS1, SGS2, and SGS3 signals (e.g., source select gate signals) in order to selectively couple the memory cell strings of memory device 200B to line 299, during a memory operation, such as a read or write operation. For example, during a memory operation, the SGS1 signal can be activated to couple memory cell string 231 to line 299. The SGS0, SGS2, and SGS3 signals can be deactivated to decouple the other memory cell strings from line 299. During a memory operation (e.g., a read or write operation), only one of the SGS0, SGS1, SGS2, and SGS3 signals can be activated at a time.

Memory device 200B can include structures similar to or identical to the structures of memory device 1500 described below with reference to FIG. 15A through FIG. 21B.

Figure 3A:
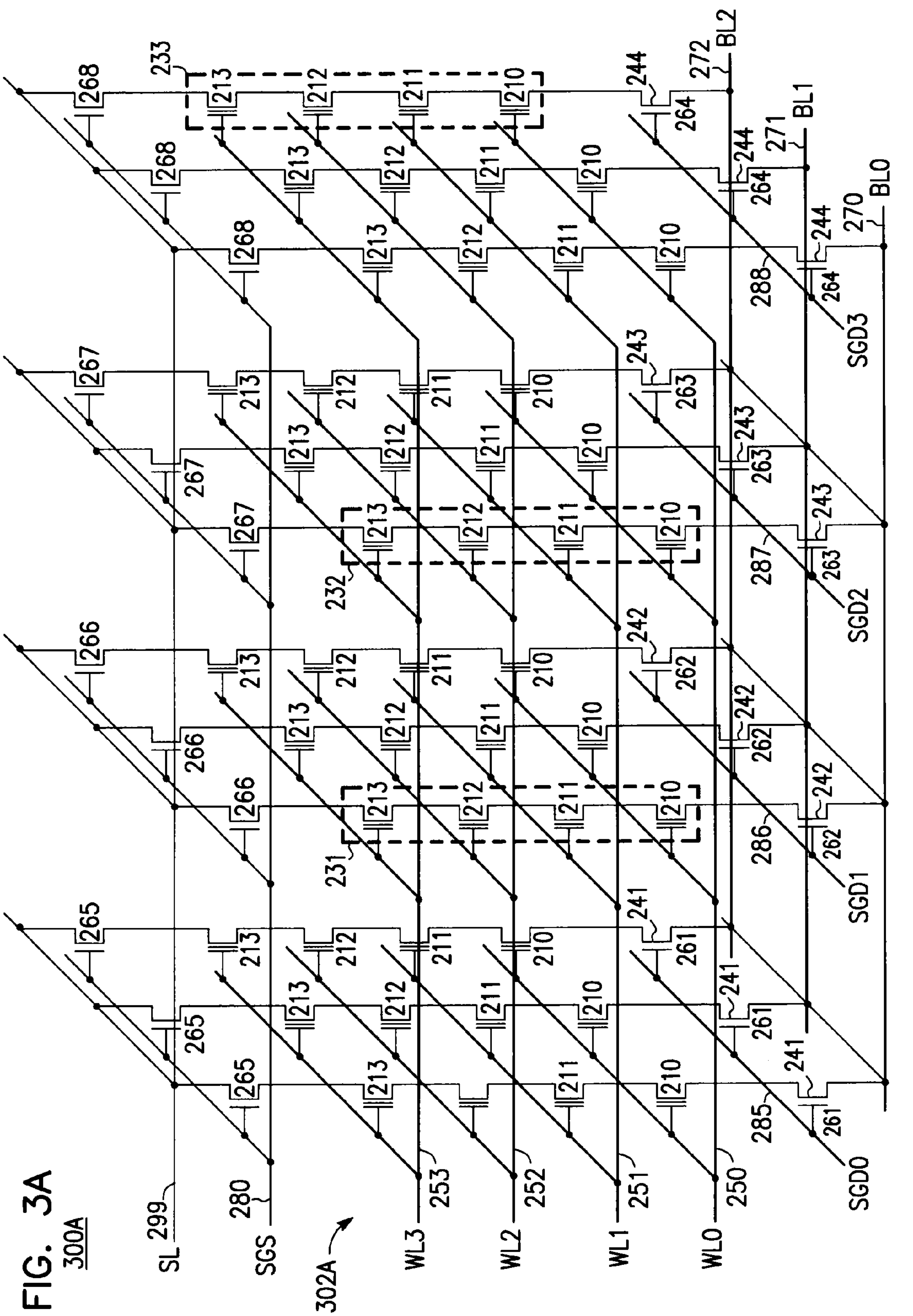
FIG. 3A shows a schematic diagram of a portion of a memory device having a memory array with a shared top source select gate, according to an embodiment of the invention.

FIG. 3A shows a schematic diagram of a portion of a memory device 300A having a memory array 302A with gate 280 (e.g., shared top source select gate), according to an embodiment of the invention. Memory device 300A can be an example variation of memory device 200A of FIG. 2A. For example, gate 280 of FIG. 3A can be physically located on the top of memory array 302A and gates 285, 286, 287, and 288 can be physically located at the bottom of memory array 302A. In FIG. 2A, these positions are reversed. Gate 280 of FIG. 2A can be physically located on at the bottom of memory array 202A and gates 285, 286, 287, and 288 can be physically located on the top of memory array 202A.

Memory device 300A can include structures similar to or identical to the structures of memory device 2200 described below with reference to FIG. 22A through FIG. 27.

Figure 3B:
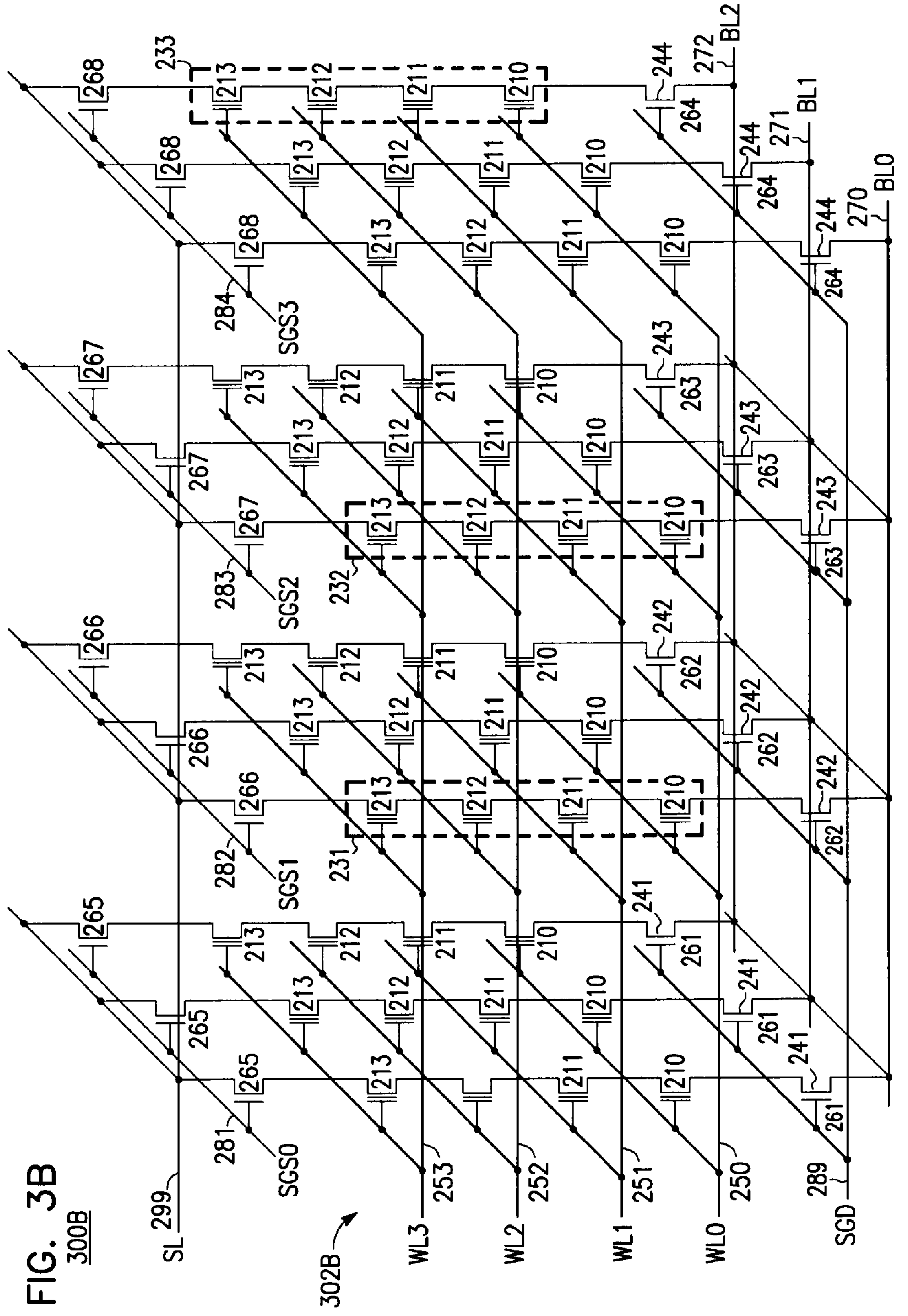
FIG. 3B shows a schematic diagram of a portion of a memory device having a memory array with a shared bottom drain select gate, according to an embodiment of the invention.

FIG. 3B shows a schematic diagram of a portion of a memory device 300B having a memory array 302B with gate 289 (e.g., shared bottom drain select gate), according to an embodiment of the invention. Memory device 300B can be an example variation of memory device 200B of FIG. 2B. For example, gate 289 of FIG. 3B can be physically located at the bottom memory array 302B and gates 281, 282, 283, and 284 can be physically located on the top of memory array 302B. In FIG. 2B, these positions are reversed. Gate 289 of FIG. 2B can be physically located on the top of memory array 202B and gates 281, 282, 283, and 284 can be physically located at the bottom of memory array 202B.

Memory device 300B can include structures similar to or identical to the structures of memory device 2800 described below with reference to FIG. 28A through FIG. 32.

Figure 4A:
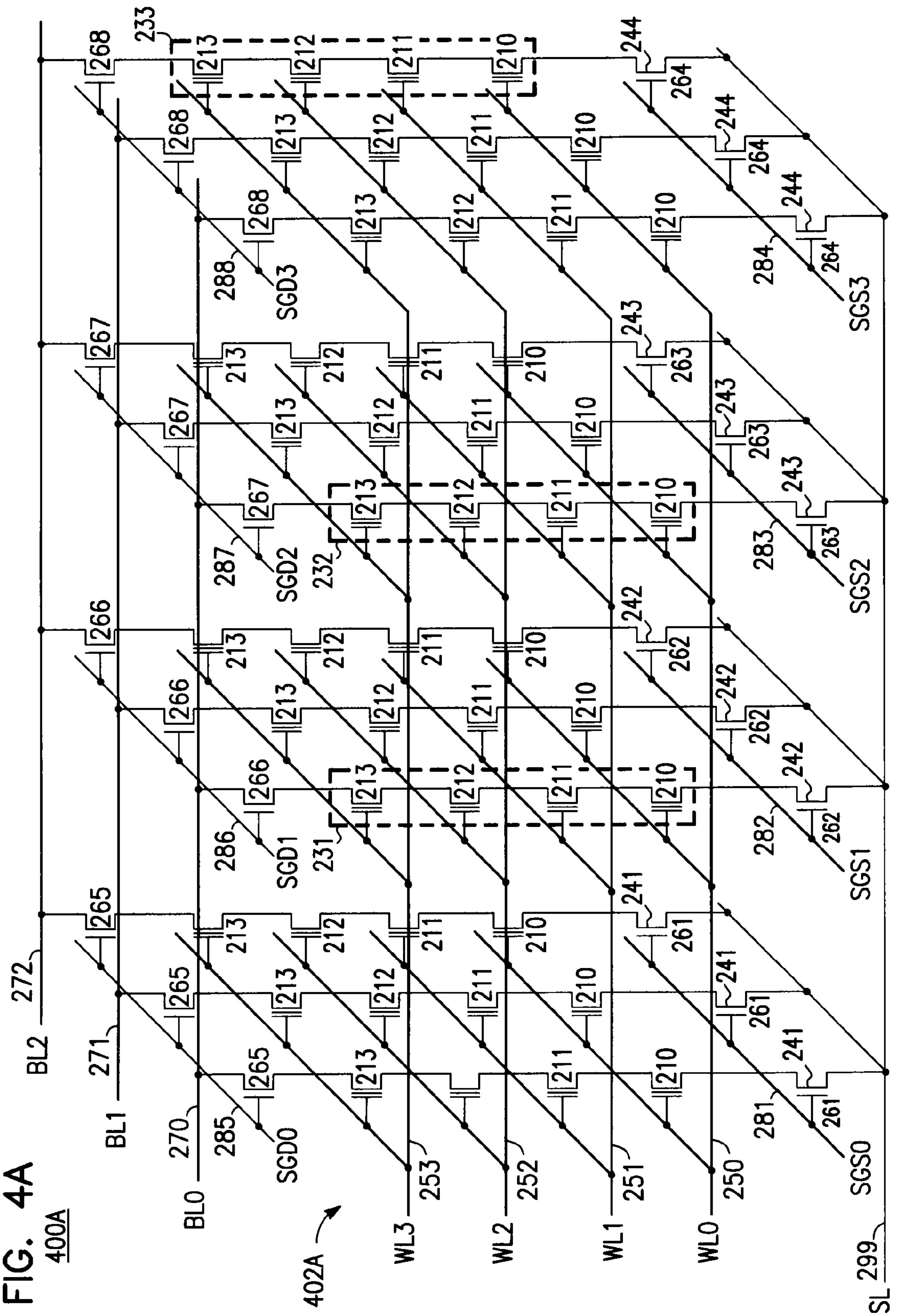
FIG. 4A shows a schematic diagram of a portion of a memory device having a memory array with separate top drain select gates and separate bottom source select gates, according to an embodiment of the invention.

FIG. 4A shows a schematic diagram of a portion of a memory device 400A having a memory array 402A with gates 285 through 288 (e.g., drain select gates) located on the top of memory array 402A and gates 281 through 284 (e.g., source select gates) located at the bottom of memory array 402A, according to an embodiment of the invention. Memory device 400A includes elements that can be similar to or identical to those of memory device 200A of FIG. 2A and memory device 200B of FIG. 2B. For simplicity, detailed description of similar or the identical elements between FIG. 2A, FIG. 2B, and FIG. 4A is not repeated in the description of FIG. 4A.

As shown in FIG. 4A, memory device 400A can include gates 281, 282, 283, and 284 (similar to those of FIG. 2A) that can be physically located at the bottom of memory array 402A and gates 285, 286, 287, and 288 (similarly to those of FIG. 2B) can be physically located on the top of memory array 402A.

Memory device 400A can include structures similar to or identical to the structures of memory device 3300 described below with reference to FIG. 33A through FIG. 37B.

Figure 4B:
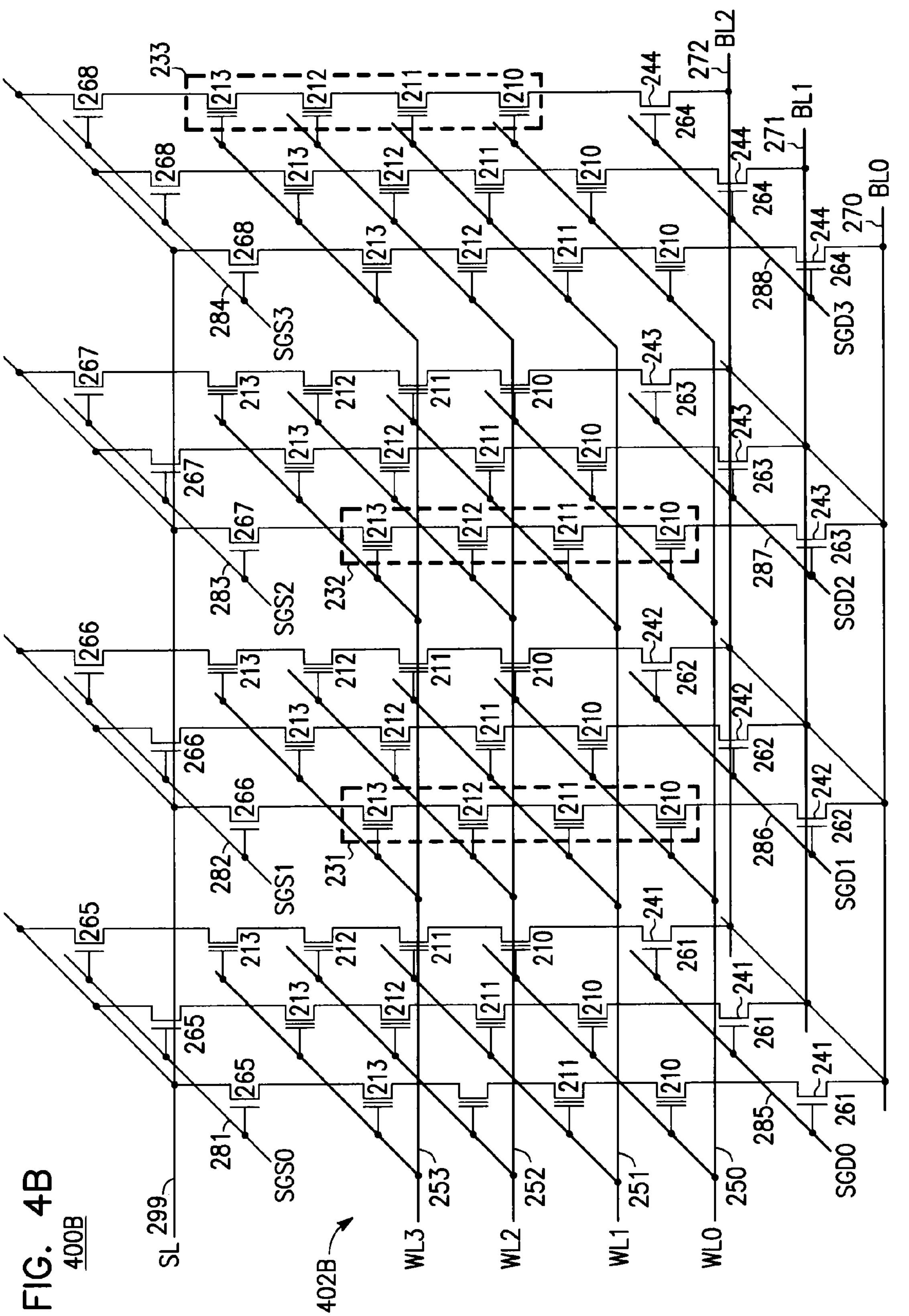
FIG. 4B shows a schematic diagram of a portion of a memory device having a memory array with separate top source select gates and separate bottom drain select gates, according to an embodiment of the invention.

FIG. 4B shows a schematic diagram of a portion of a memory device 400B having a memory array 402B with gates 281 through 284 (e.g., source select gates) located on the top of memory array 402B and gates 285 through 288 (e.g., drain select gates) located at the bottom of memory array 402B, according to an embodiment of the invention.

Memory device 400B can be an example variation of memory device 400A of FIG. 4A. For example, as shown in FIG. 4B, gates 281 through 284 can be physically located on the top of memory array 400A and gates 285 through 288 can be physically located at the bottom of memory array 400A. In FIG. 4A, these positions are reversed. Gates 285 through 288 of FIG. 4A can be physically located on the top of memory array 400A and gates 281 through 284 can be physically located at the bottom of memory array 400A.

Memory device 400B can include structures similar to or identical to the structures of memory device 3800 described below with reference to FIG. 38 through FIG. 40.

FIG. 5 through FIG. 14B show processes of forming a memory device 500, according to an embodiment of the invention. The processes described with reference to FIG. 5 through FIG. 14B can also be used to form memory device 200A of FIG. 2A with a shared bottom source select gate (e.g., gate 280 in FIG. 2A).

Figures 5, 6A, 6B:
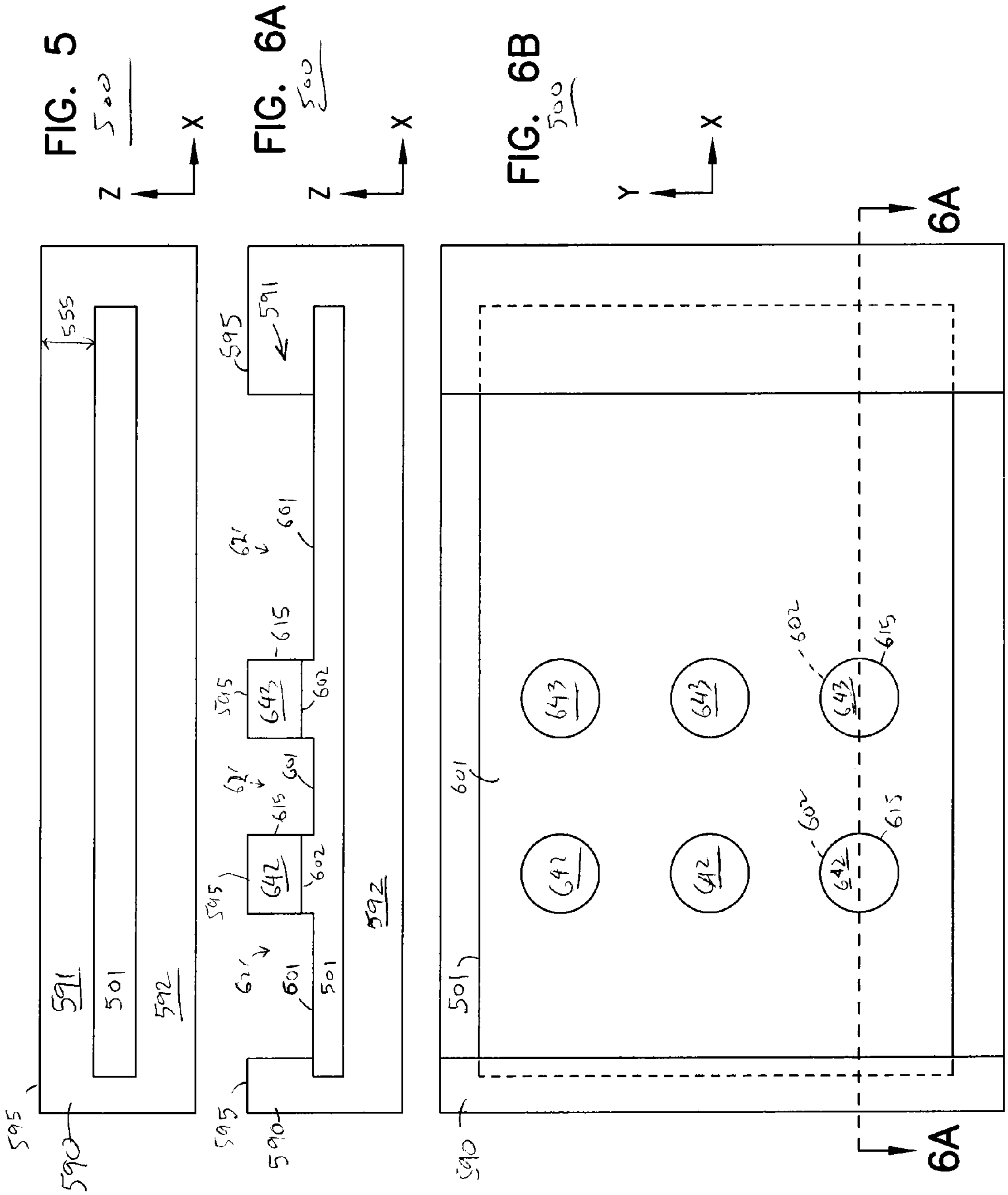

FIG. 5 shows memory device 500 having a substrate 590 and a material 501 formed in substrate 590. Substrate 590 can include a monocrystalline (also referred to as single-crystal) semiconductor material. For example, substrate 590 can include monocrystalline silicon (also referred to as single-crystal silicon). The monocrystalline semiconductor material of substrate 590 can include impurities, such that substrate 590 can have a specific conductivity type (e.g. n-type or p-type). A doping process, such as implantation, can be use to include impurities in the monocrystalline semiconductor material of substrate 590. For example, substrate 590 can include monocrystalline silicon doped with boron (B) impurities (or other impurities), such that substrate 590 can be a p-type monocrystalline silicon.

As shown in FIG. 5, material 501 can be formed in a location between substrate portions 591 and 592 at a depth 555 relative to surface 595 of substrate 590 in the z-direction. The z-direction can extends in a direction associated with the thickness of substrate 590. FIG. 5 also shows an x-direction, which is parallel to surface 595 and perpendicular to the z-direction. Substrate portions 591 and 592 are part of substrate 590. Thus, substrate portions 591 and 592 can include the same material as that of substrate 590. Substrate 590 and material 501 can include monocrystalline semiconductor materials of different conductivity types. For example, substrate 590 can include a p-type monocrystalline silicon, and material 501 can include an n-type monocrystalline silicon.

Forming material 501 in substrate 590 can include inserting (e.g., implanting) n-type impurities into p-type substrate 590. Examples of n-type impurities include an element such as phosphorus (P) or arsenic (As). Substrate 590 can include a p-type monocrystalline semiconductor material before material 501 is formed. Thus, material 501 can include an n-type monocrystalline semiconductor material after n-type impurities are inserted into substrate 590. Substrate portion 591 (overlying material 501) and substrate portion 592 (under material 501), which have not been inserted with n-type impurities, can remain a p-type monocrystalline semiconductor material.

FIG. 6A and FIG. 6B show memory device 500 after pedestals 642 and 643 have been formed. FIG. 6B shows a top view of memory device 500 of FIG. 6A. Each of pedestals 642 and 643 can have a sidewall 615. FIG. 6B shows sidewall 615 of each of pedestals 642 and 643 being a circular sidewall, as an example. Sidewall 615, however, can have a different shape (e.g., polygonal or other shapes).

Forming pedestals 642 and 643 can include removing (e.g., etching) material from part of substrate portion 591 at locations 621 to expose a portion 601 of material 501 at locations 621. The remaining parts (e.g., parts that have not been removed) of substrate portion 591 form pedestals 642 and 643 overlying portions 602 of material 501 that are unexposed. FIG. 6B shows six pedestals 642 and 643 arranged in a matrix pattern in the x-direction and a y-direction and, as an example. The number of such pedestals can vary.

As shown in FIG. 6A and FIG. 6B, pedestals 642 and 643 can be separated from each other. Each of pedestals 642 and 643 can include a base directly contacting a respective portion 602 of material 501. Since substrate portion 591 is part of substrate 590 and since pedestals 642 and 643 are formed from substrate portion 591, pedestals 642 and 643 can include the same material as that of substrate 590. For example, pedestals 642 and 643 can include a monocrystalline semiconductor material (e.g., p-type monocrystalline silicon) that is the same as the monocrystalline semiconductor material of substrate 590.

Figure 7A:
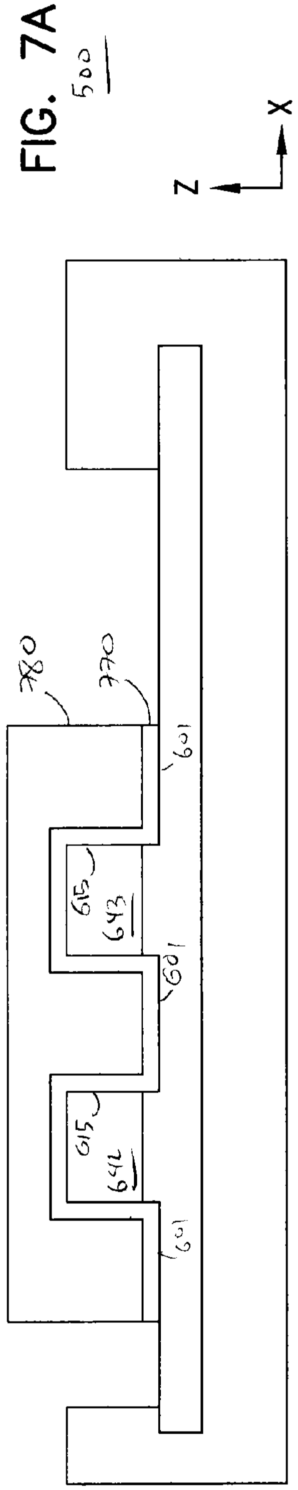
Figure 7B:
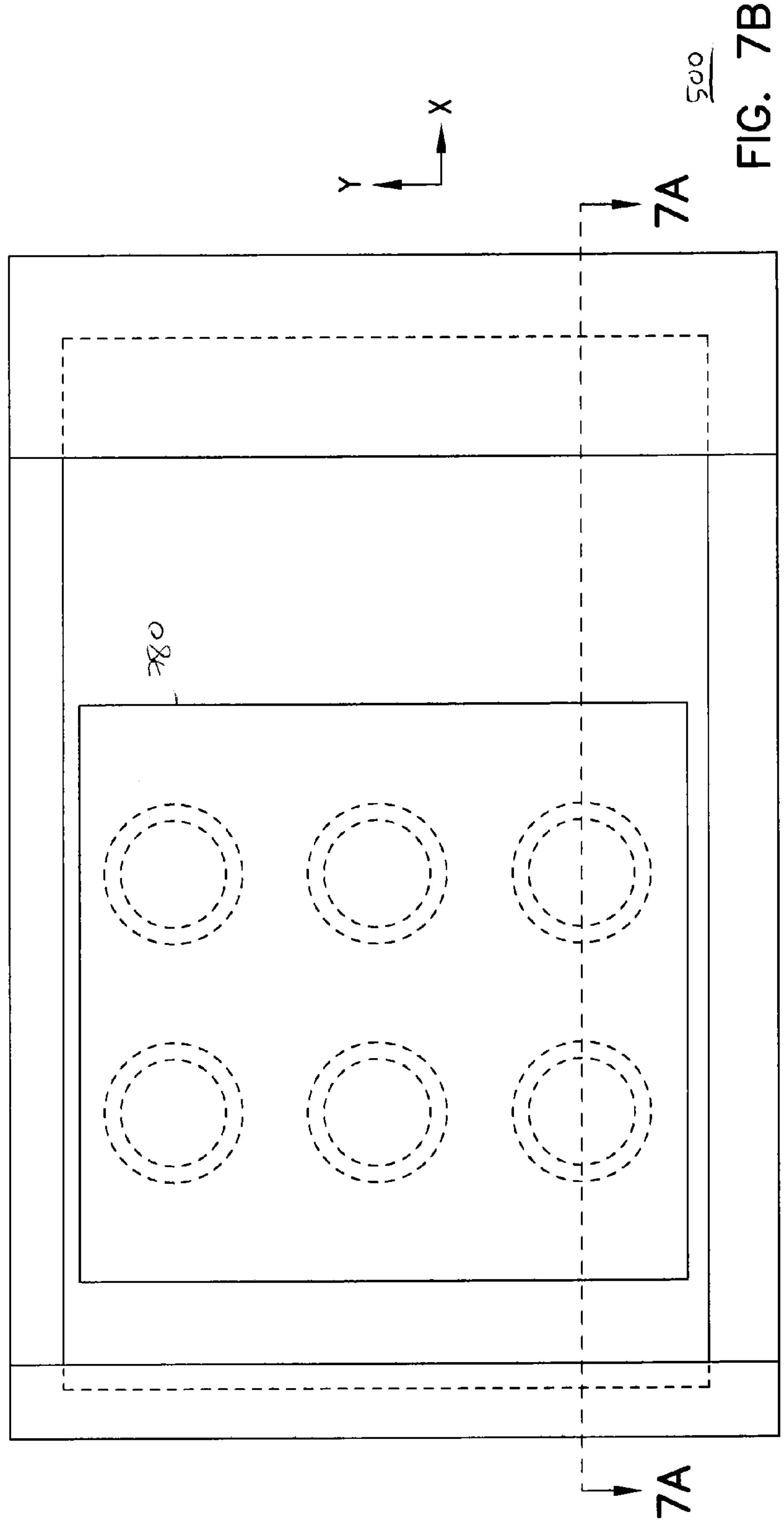

FIG. 7A and FIG. 7B show memory device 500 after materials 770 and 780 have been formed. FIG. 7B shows a top view of memory device 500 of FIG. 7A. Forming materials 770 and 780 can include depositing material 770 over pedestals 642 and 643, conformal to sidewalls 615, and over portion 601 of material 501. Then, material 780 can be formed (e.g., deposited) over material 770. At least a portion of material 780 can be formed in a location between pedestals 642 and 643. Material 770 can include dielectric material(s) (e.g., an oxide of silicon or other dielectric material). Material 780 can include conductive material(s) (e.g., conductively doped polycrystalline silicon (also referred to as polysilicon) or other conductive material).

Figure 8A:
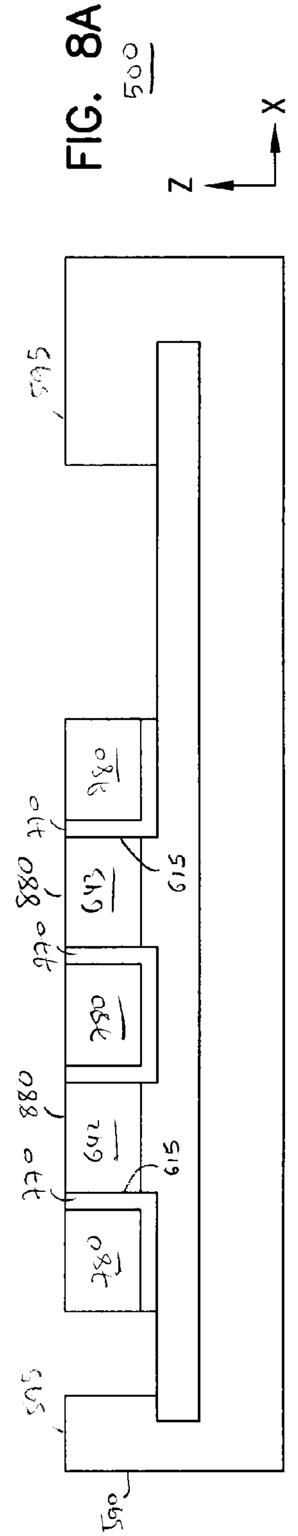
Figure 8B:
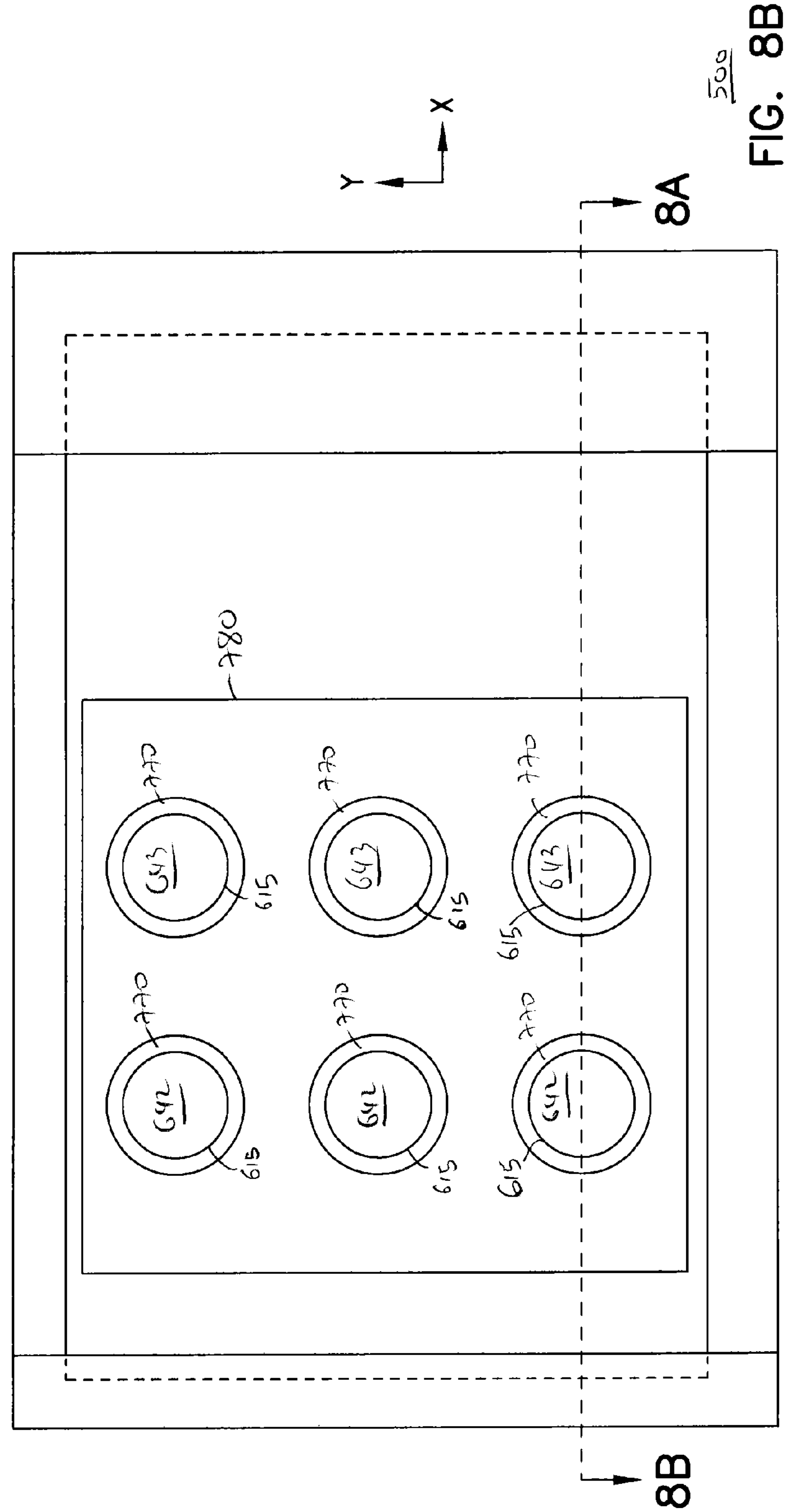

FIG. 8A and FIG. 8B show memory device 500 after materials 770 and 780 have been planarized (e.g., through chemical mechanical polishing (CMP), through an etch back process, or through other technique). FIG. 8B shows a top view of memory device 500 of FIG. 8A. As shown in FIG. 8A and FIG. 8B, after materials 770 and 780 has been planarized, surface 880 of each of pedestals 642 and 643 are exposed. Surface 880 can be on the same plane as surface 595 of substrate 590. Material 780 can surround at least a portion (e.g., surround sidewall 615) of each of pedestals 642 and 643.

Figure 9:
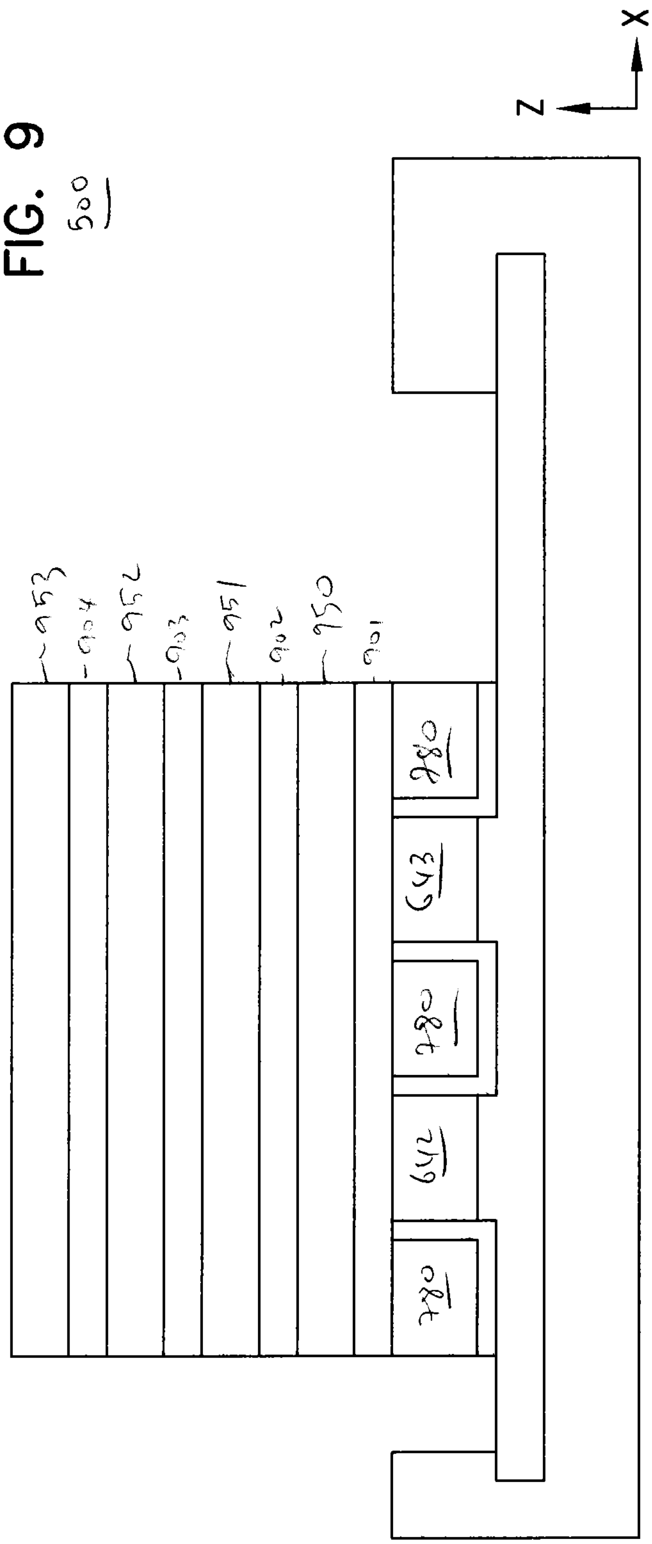

FIG. 9 shows memory device 500 after materials 901, 902, 903, 904, 950, 951, 952, and 953 have been formed. Forming these materials can include alternately depositing materials 901, 902, 903, and 904 and materials 950, 951, 952, and 953, such that they can be arranged in a stack (e.g., one layer over another), as shown in FIG. 9. Materials 901, 902, 903, and 904 can include dielectric material(s) (e.g., an oxide of silicon or other dielectric material). Materials 950, 951, 952, and 953 can include conductive material(s) (e.g., conductively doped polycrystalline silicon or other conductive material).

Figure 10A:
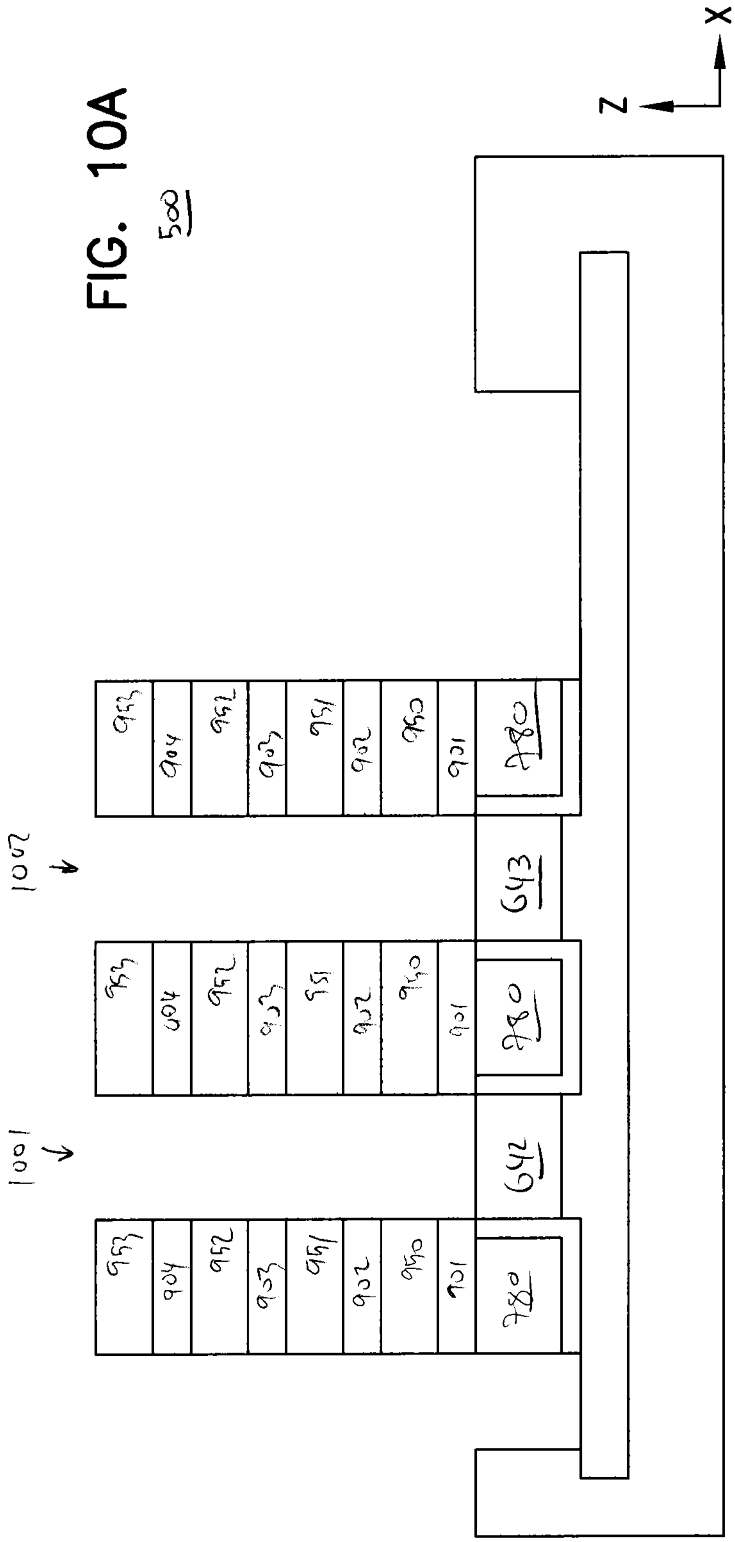
Figure 10B:
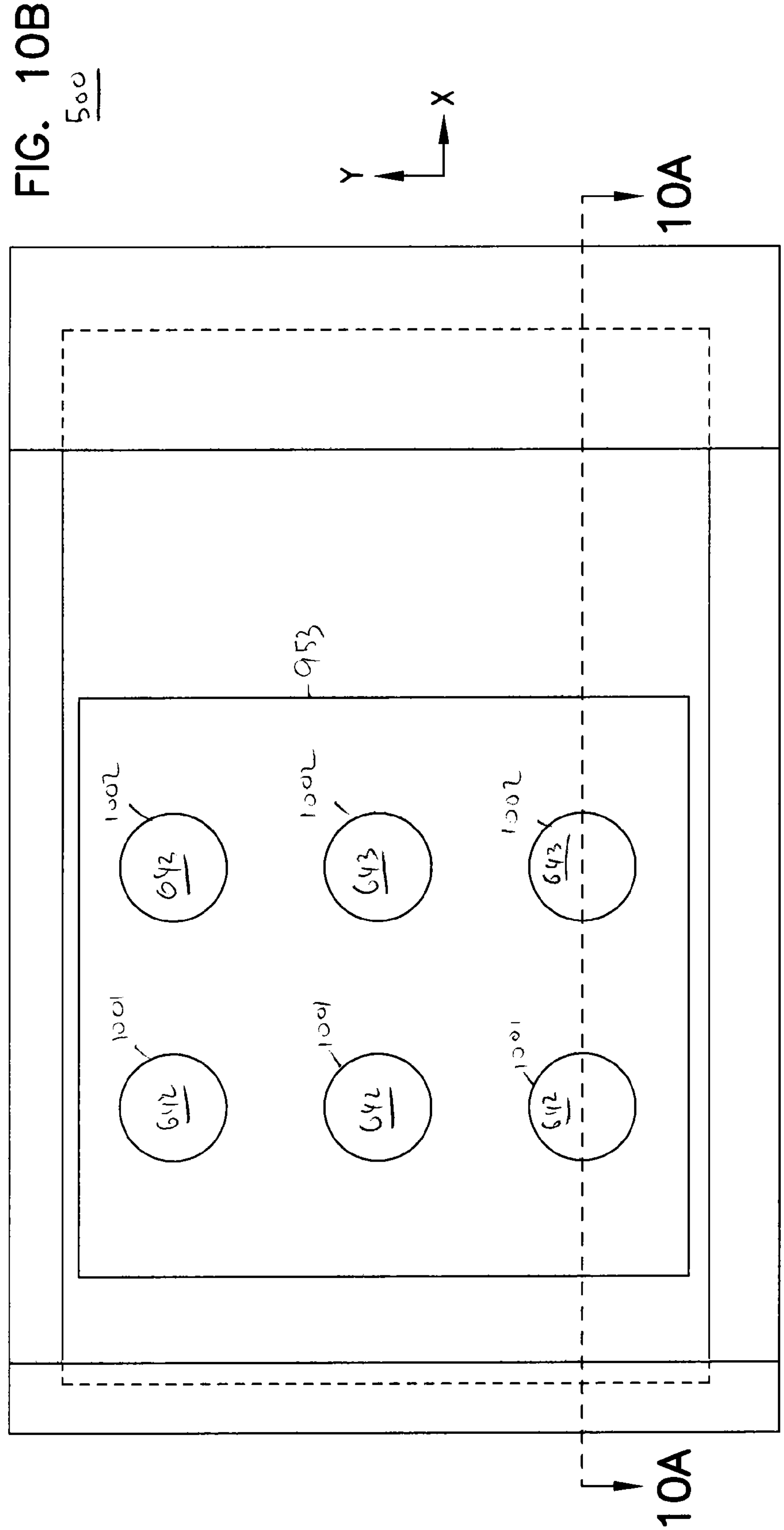

FIG. 10A and FIG. 10B show memory device 500 after holes 1001 and 1002 have been formed. FIG. 10B shows a top view of memory device 500 of FIG. 10A. Holes 1001 and 1002 can be formed such they can be aligned substantially directly (e.g., directly) over corresponding pedestals 642 and 643, as illustrated in FIG. 10A and FIG. 10B. A mask (e.g., photoresist) can be used during a formation of holes 1001 and 1002. For example, a mask with openings can be placed over material 953, such that the openings of the mask can be aligned over pedestals 642 and 643. Then, forming holes 1001 and 1102 can include removing (e.g., etching) part of each of materials 901, 902, 903, 904, 950, 951, 952, and 953 at the openings of the mask to expose pedestals 642 and 643 through holes 1001 and 1002. The degree of alignment of holes 1001 and 1002 over pedestals 642 and 643 (e.g., directly over pedestals 642 and 643) can be based on the alignment of openings of a mask used during formation of holes 1001 and 1002. Other technique (e.g., drilling) can be used to form holes 1001 and 1002.

Figure 11A:
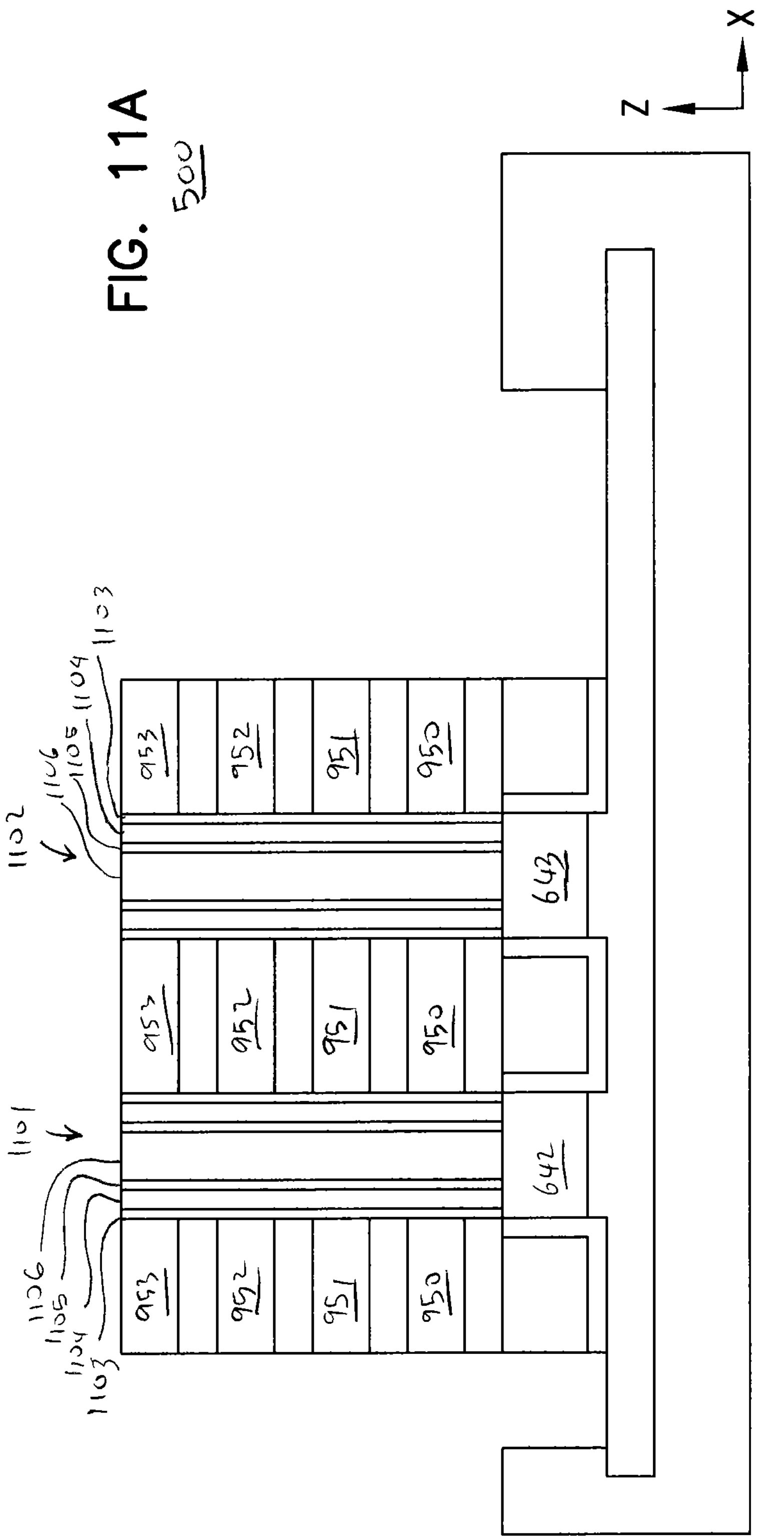
Figure 11B:
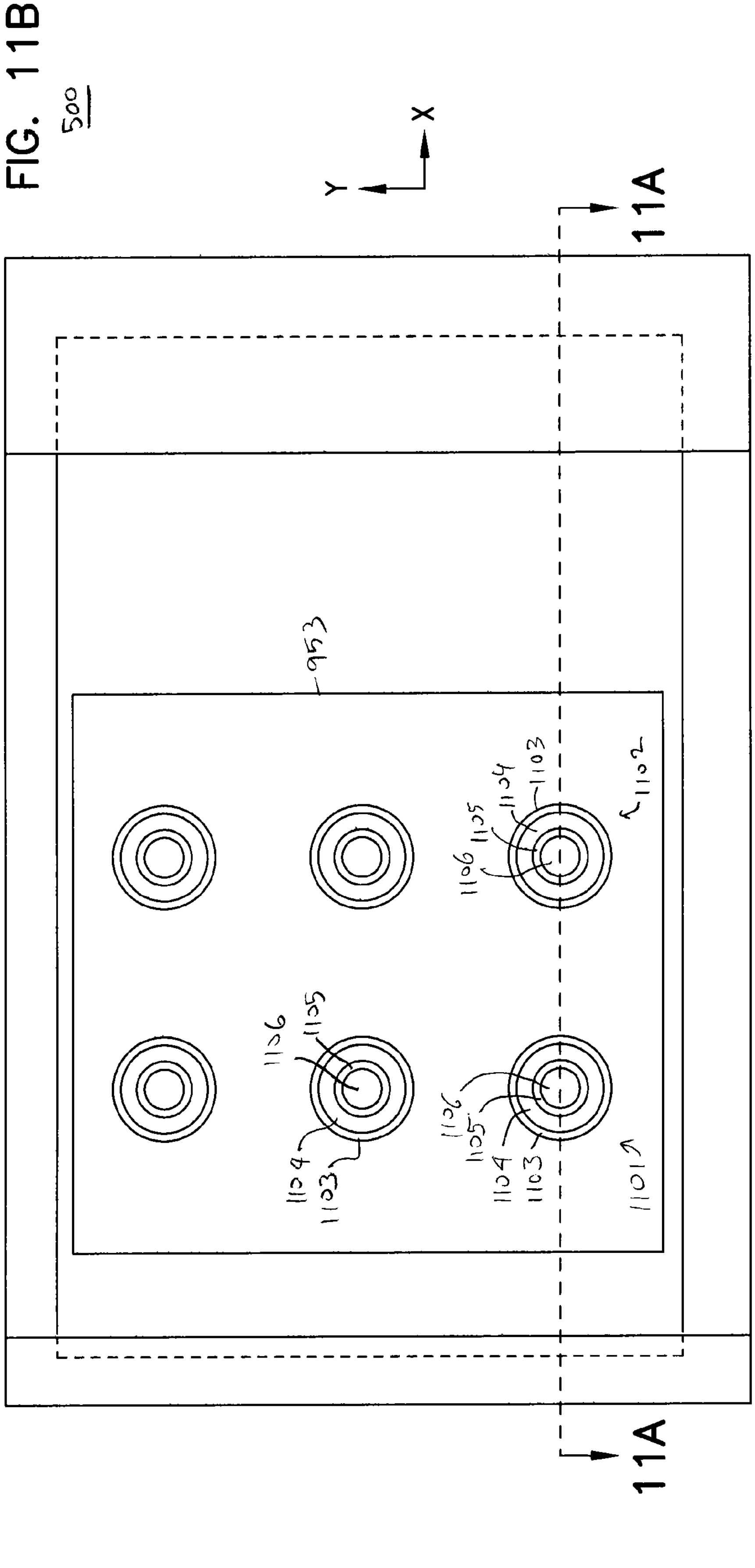

FIG. 11A and FIG. 11B show memory device 500 after pillars 1101 and 1102 have been formed. FIG. 11B shows a top view of memory device 500 of FIG. 11A. Pillar 1101 can directly contact pedestal 642. Pillar 1102 can directly contact pedestal 643. Forming pillars 1101 and 1102 can include forming materials 1103, 1104, 1105 and 1106 in holes 1001 and 1002 (FIG. 10A). Materials 1103, 1104, 1105 and 1106 can be formed in a sequential order. For example, materials 1103, 1104, 1105 and 1106, in this order, can be deposited one after another in holes 1001 and 1002.

Material 1103 can include a charge blocking material(s) (e.g., a dielectric material such as silicon nitride) that is capable of blocking a tunnel of a charge.

Material 1104 can include a charge storage material(s) that can provide a charge storage function to represent a value of information stored in a memory cell (e.g., a memory cell 210, 211, 212, or 213 of FIG. 2A). For example, material 1104 can include conductively doped polycrystalline silicon, which can be either a p-type polycrystalline silicon or an n-type polycrystalline silicon. The polycrystalline silicon can be configured to operate as a floating gate (e.g., to store charge) in a memory cell.

Material 1105 can include a tunnel dielectric material(s) (e.g., an oxide of silicon) that is capable of allowing tunneling of a charge (e.g., electrons).

Material 1106 can include a conductive material(s) that is capable of providing a conduction of current. For example, material 1004 can include conductively doped polycrystalline silicon, which can be either a p-type polycrystalline silicon or an n-type polycrystalline silicon.

Figure 12A:
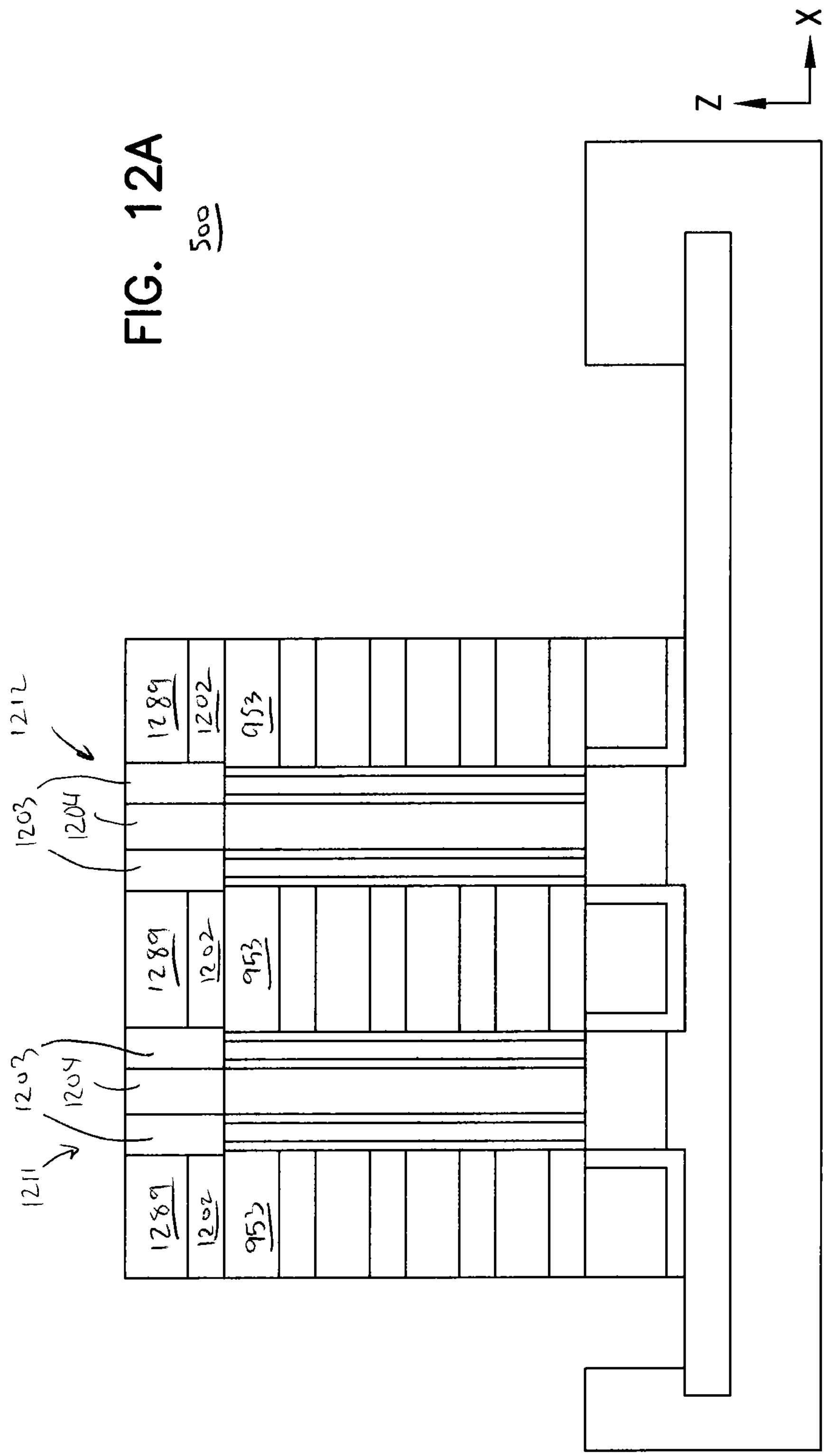
Figure 12B:
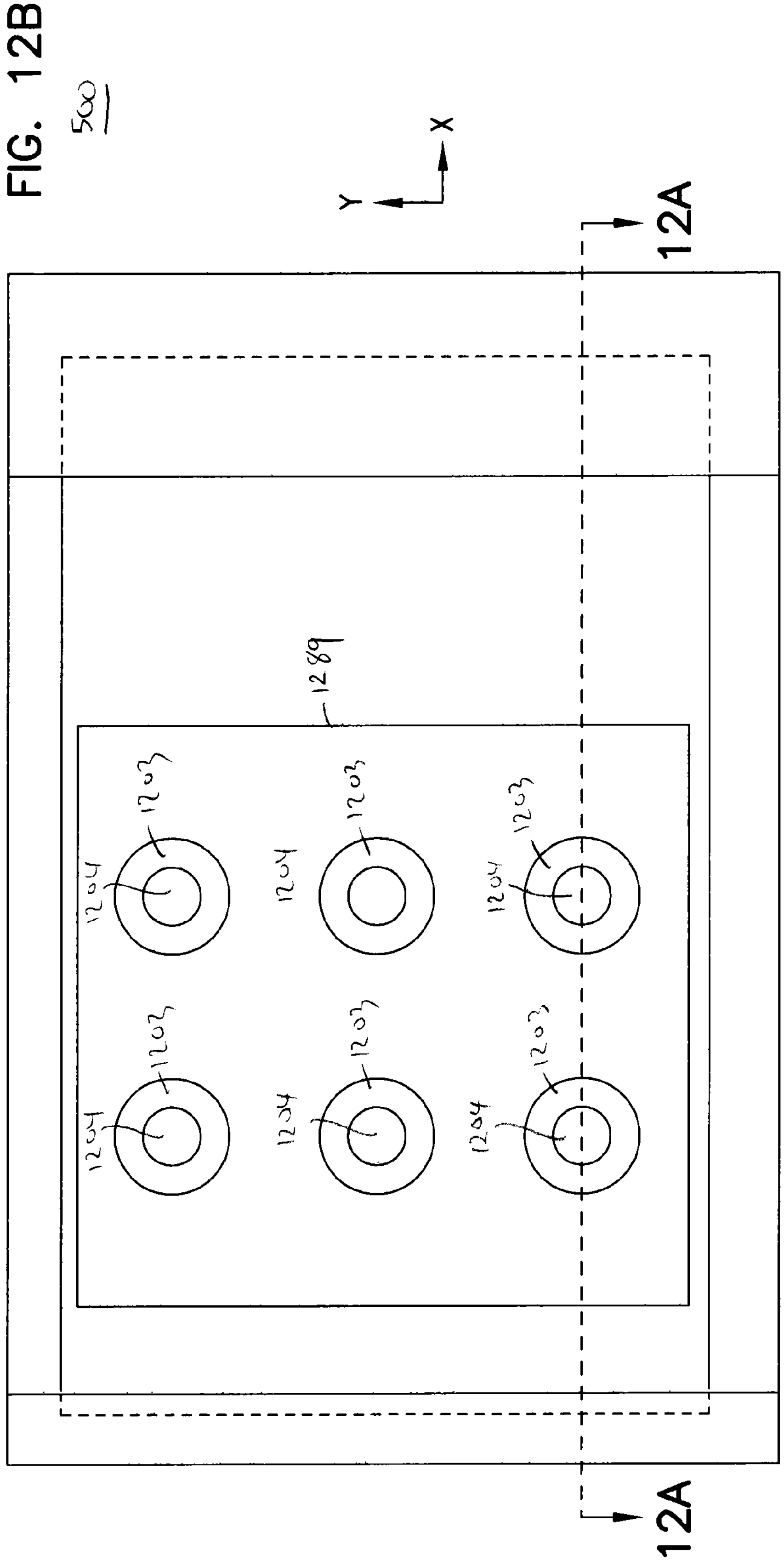

FIG. 12A and FIG. 12B show memory device 500 after materials 1202, 1203, 1204, and 1289 have been formed. FIG. 12B shows a top view of memory device 500 of FIG. 12A. Forming materials 1202, 1203, 1204, and 1289 can include depositing material 1202 over pillars 1101 and 1102 (FIG. 11A) and material 953. Then, material 1289 can be deposited over material 1202. After materials 1202 and 1289 are formed, holes 1211 and 1212 can be formed (e.g., by etching or drilling) in materials 1202 and 1289 to expose pillars 1101 and 1102. Then, materials 1203 and 1204 can be formed to fill holes 1211 and 1212. For example, after holes 1211 and 1212 have been formed, material 1203 can be deposited on sidewalls of holes 1211 and 1212. Then, material 1204 can be deposited in holes 1211 and 1212, such that material 1203 is between materials 1204 and 1289. Material 1204 can directly contact material 1106 of pillars 1101 and 1102 (FIG. 11A).

Materials 1202 and 1203 can include a dielectric material (s) (e.g., an oxide of silicon).

Material 1289 can include a conductive material(s). Material 1289 and material 1106 (FIG. 11A) can include the same material. For example, material 1289 can include conductively doped polycrystalline silicon, which can be either a p-type polycrystalline silicon or an n-type polycrystalline silicon.

Material 1204 can include a conductive material(s). Material 1204 and materials 950, 951, 952, and 953 (FIG. 9A) can include the same material (e.g., conductively doped polycrystalline silicon or other conductive material).

Figure 13A:
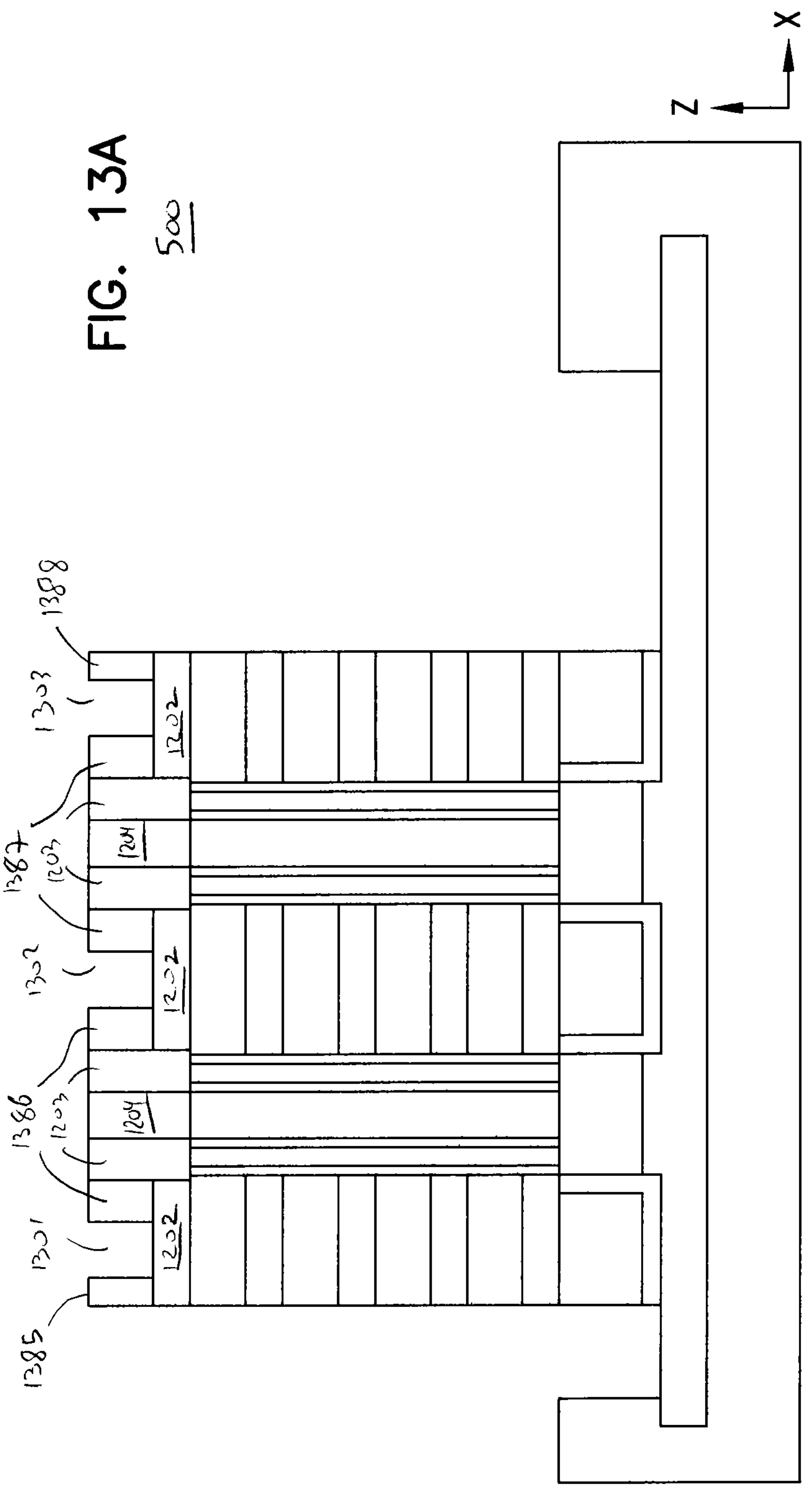
Figure 13B:
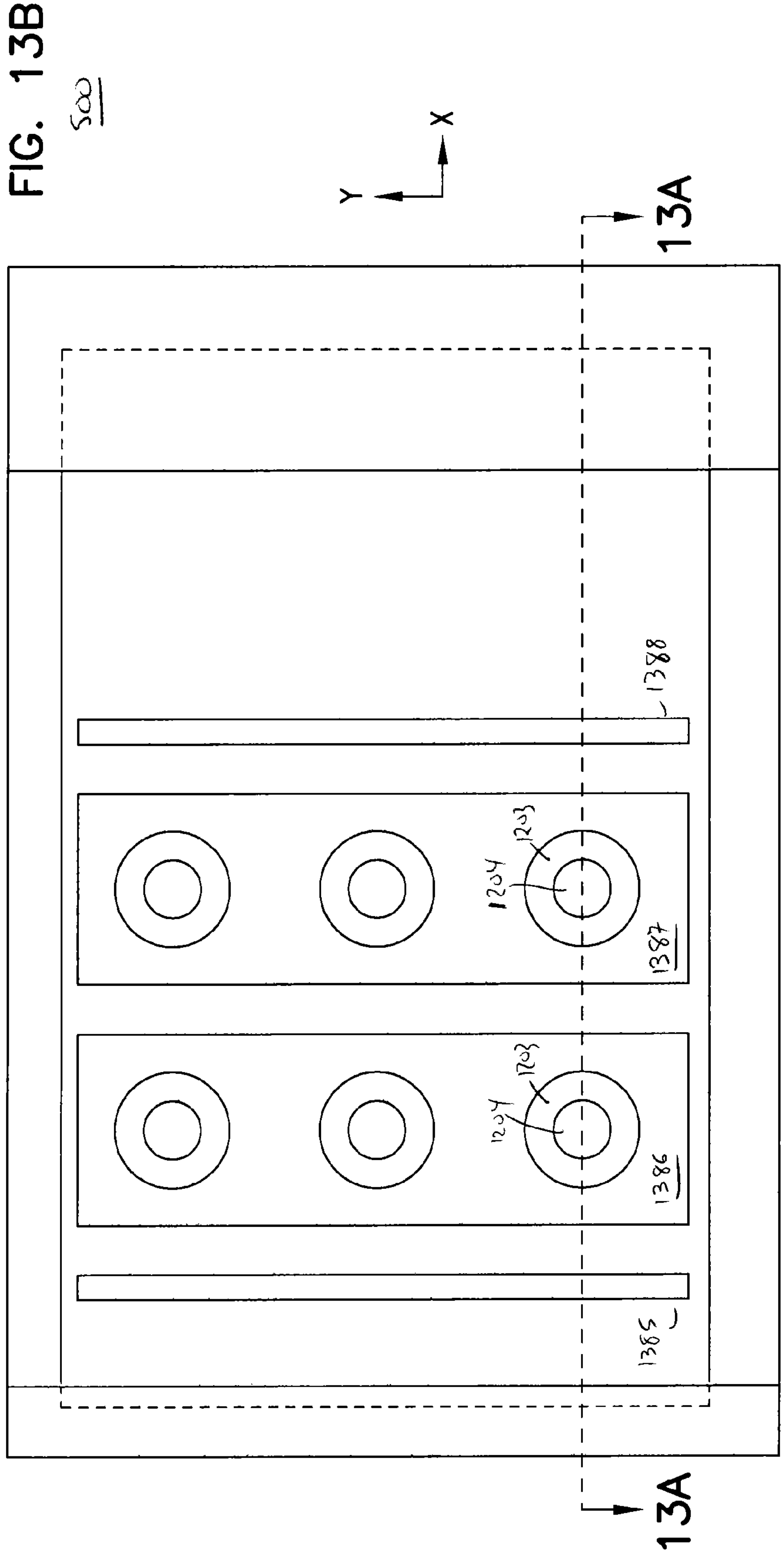

FIG. 13A and FIG. 13B show memory device 500 after material portions 1385, 1386, 1387, and 1388 have been formed. FIG. 13B shows a top view of memory device 500 of FIG. 13A. Forming material portions 1385, 1386, 1387, and 1388 can include removing (e.g., etching) part of material 1289 (FIG. 12A) at locations 1301, 1302, and 1303 (FIG. 13A), such that material portions 1385, 1386, 1387, and 1388 are separated from each other.

Figure 14A:
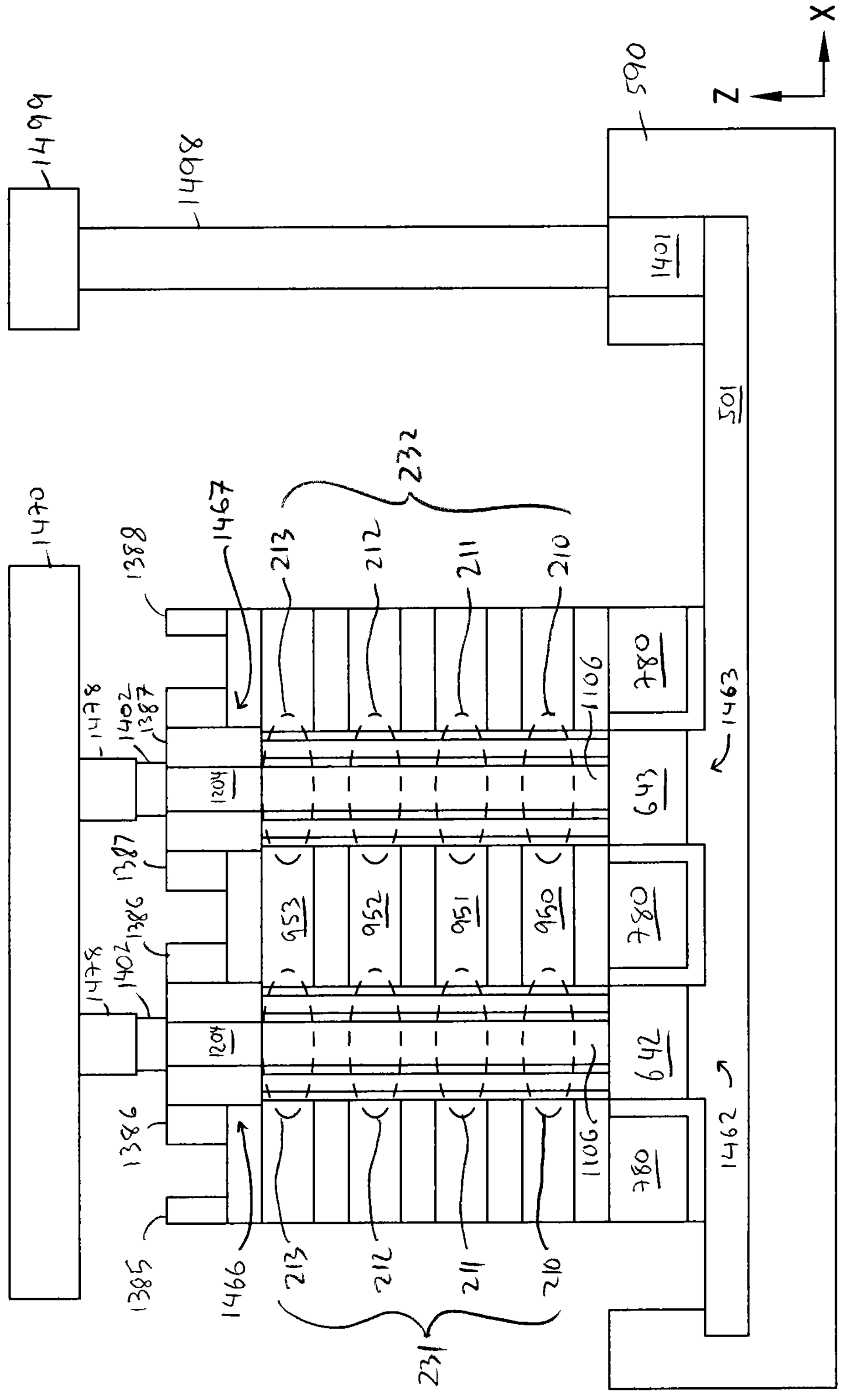
Figure 14B:
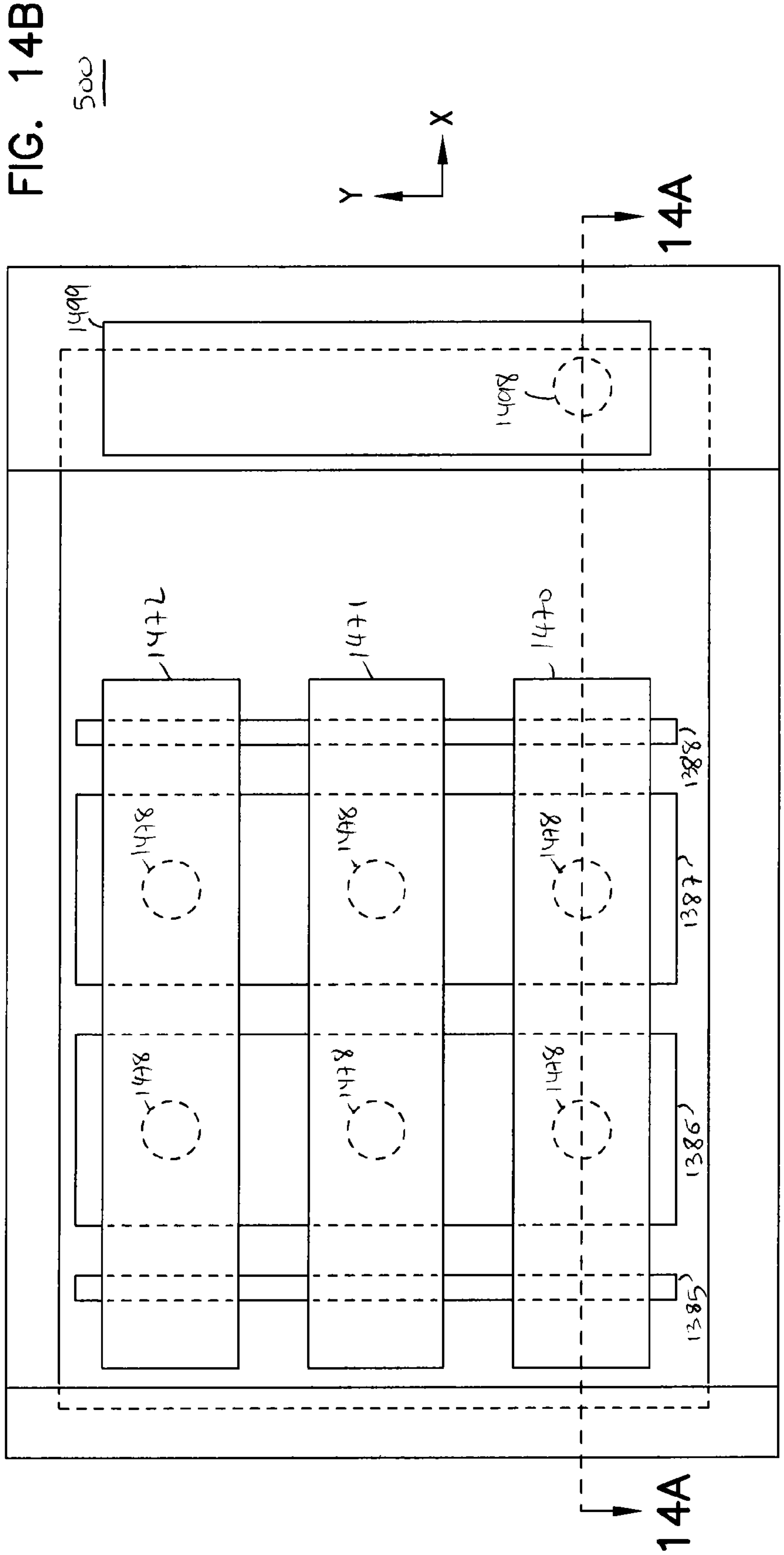
Figure 15A:
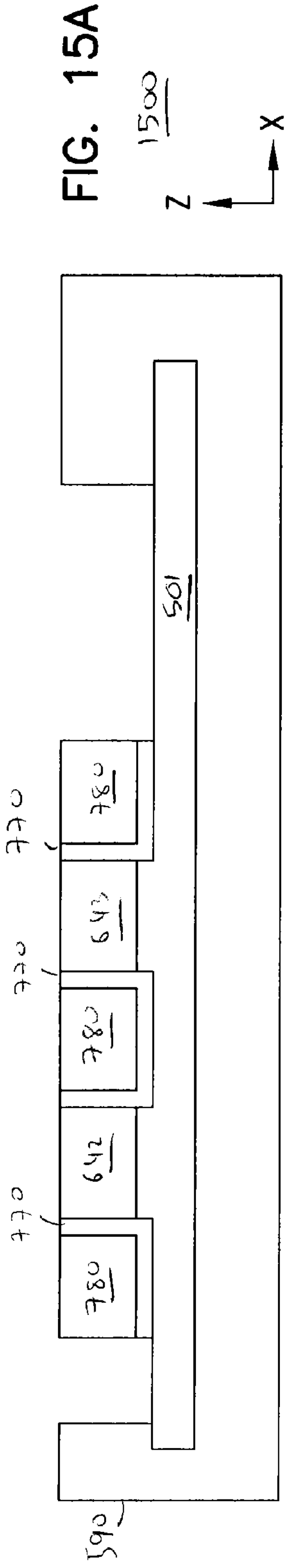
FIG. 15A through FIG. 21B show processes of forming a memory device (e.g., the memory device of FIG. 2B) with a shared top drain select gate, according to an embodiment of the invention.
Figure 15B:
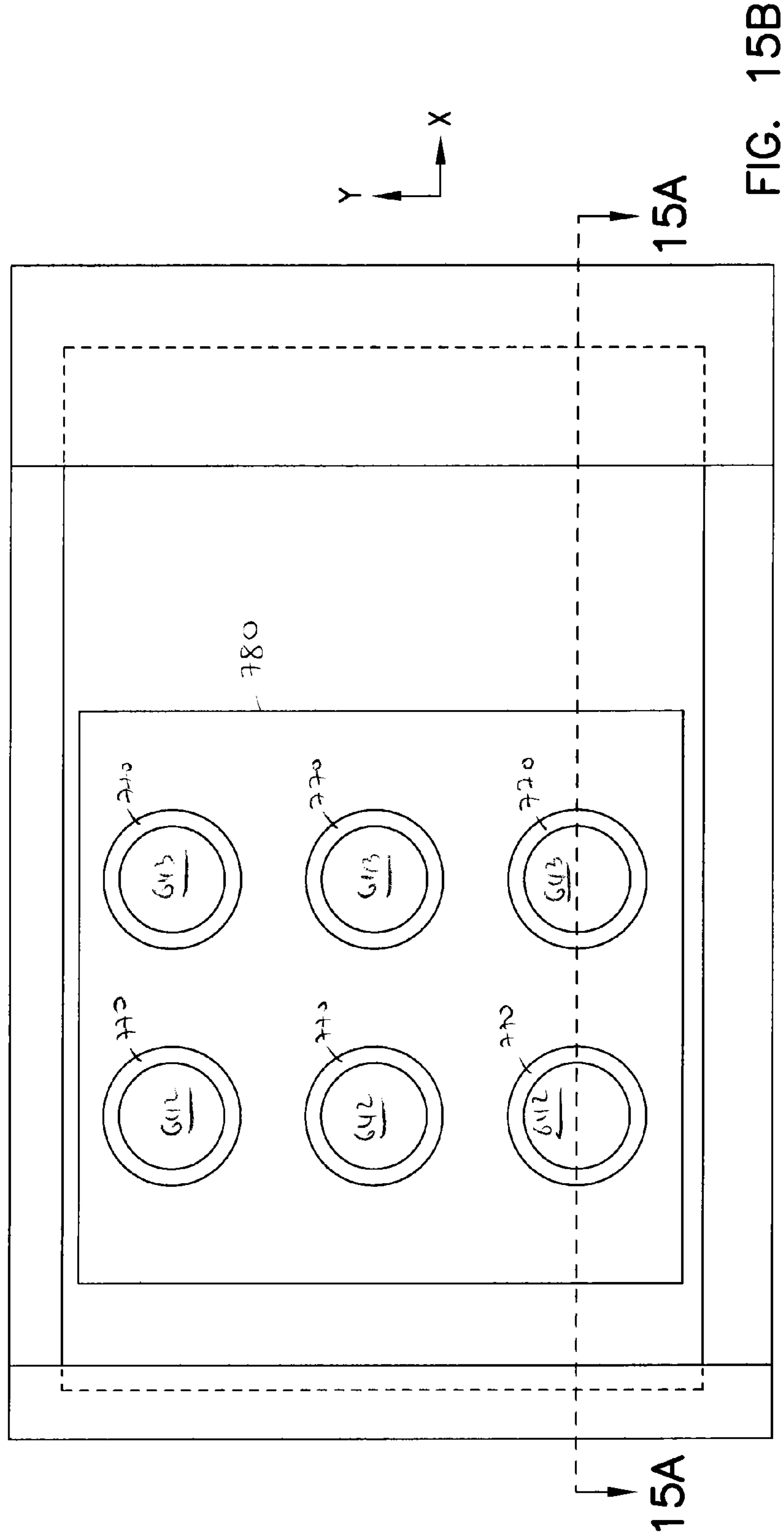

FIG. 14A and FIG. 14B show memory device 500 after materials 1401 and 1402, conductive contacts 1478 and 1498, and conductive lines 1470, 1471, 1472, and 1499 have been formed. FIG. 14B shows a top view of memory device 500 of FIG. 14A. Forming material 1401 can include inserting (e.g., implanting) impurities into a portion of substrate 590, such that such a portion of substrate 590 and the impurities can form material 1401 contacting material 501. Material 1401 can include the same conductivity type as that of material 501. For example, n-type impurities can be implanted into substrate 590, such that material 1401 can include n-type monocrystalline semiconductor (e.g., silicon) material.

Material 1402 can include conductive material(s), such as conductively doped polycrystalline silicon. Material 1402 can include a conductivity type that is different from the conductivity type of material 1204. For example, material 1402 can include n-type polycrystalline silicon and material 1204 can include p-type polycrystalline silicon.

Conductive contacts 1478 and 1498 and conductive lines 1470 and 1499 can include conductive material(s), such as metal or other conductive material. Conductive lines 1470, 1471, 1472, and 1499 can correspond to lines 270, 271, 272, and 299, respectively, of memory device 200A of FIG. 2A.

As shown in FIG. 14A, memory device 500 can include memory cells 210, 211, 212, and 213 located in different levels of memory device 500, such as different levels in the z-direction. Memory cells 210, 211, 212, and 213 can be arranged in a memory cell string 231 overlying pedestal 642 and a memory cell string 232 overlying pedestal 643. Memory cell strings 231 and 232 in FIG. 14A can correspond to memory cell string 231 and 232 of memory device 200A of FIG. 2A. In FIG. 14A, each of memory cell strings 231 and 232 can include a body (e.g., body located between materials 1204 and one of the pedestals 642 and 643) formed at least in part by material 1106 and contacting one of pedestals 642 and 643.

Materials 950, 951, 952, and 953 in FIG. 14A can form control gates that are located along the body (e.g., body formed at least in part by material 1106) of each of memory cell strings 231 and 232. These control gates (e.g., formed by materials 950, 951, 952, and 953) can correspond to control gates 250, 251, 252, and 253, respectively, associated with corresponding memory cell strings 231 and 232 of memory device 200A of FIG. 2A.

Material portions 1385, 1386, 1387, and 1388 in FIG. 14A can form gates (e.g., drain select gates) of memory device 500 that can correspond to gates 285, 286, 287, and 288, respectively, of memory device 200A of FIG. 2A. Material 780 in FIG. 14A can form a gate (e.g., source select gate) of memory device 500 that can correspond to gate 280 of memory device 200A of FIG. 2A.

Memory device 500 in FIG. 14A can include transistors 1462 and 1463. Transistor 1462 can include at least a part of pedestal 642 that can form a body region of transistor 1462. Transistor 1463 can include at least a part of pedestal 643 that can form a body region of transistor 1463. As described above with reference to FIG. 5 through FIG. 13B, pedestals 642 and 643 can include a monocrystalline semiconductor (e.g., silicon) material. A transistor (e.g., transistor 1462 or 1463 in FIG. 14A, or other transistor described herein) having a body region that includes a monocrystalline semiconductor material may reduce leakage current (e.g., $I_{OFF}$ current) associated with the transistor. Thus, the on-to-off current ratio (e.g., $I_{ON}/I_{OFF}$) associated with the transistor (e.g., transistor 1462 or 1463) may be improved (e.g., increased). This may improve (e.g., increase) the number of memory cells (such as memory cells 210, 211, 212, and 213) coupled to each data line (e.g., one of lines 1470, 1471, and 1472 in FIG. 14B or 270, 271, 272, and 273 in FIG. 2A) of memory device 500. Therefore, memory device 500 (or other memory device described herein) may have an increased memory cell density for a given device area.

As shown in FIG. 14A, transistors 1462 and 1463 can share the same gate (e.g., source select gate), which can be formed by material 780. As shown in FIG. 14A, at least a portion of the shared gate (e.g., formed by material 780) of transistors 1462 and 1463 can be located in substrate 590 and can surround at least a portion of the body regions of transistors 1462 and 1463 (e.g., body regions formed by at least a part of pedestal 642 and at least a part of pedestal 643, respectively). Transistors 1462 and 1463 can correspond to transistors 262 and 263, respectively, associated with corresponding memory cell strings 231 and 232 of memory device 200A of FIG. 2A.

Memory device 500 in FIG. 14A can include transistors 1466 and 1467. Transistor 1466 can include at least a part of material 1204 (e.g., part of material 1204 surrounded by material 1386) that can form a body region of transistor 1466. Transistor 1467 can include part of material 1204 (e.g., part of material 1204 surrounded by material 1387) that can form a body region of transistor 1467. Transistors 1466 and 1467 can include separate gates. For example, at least a part of material portion 1386 can form a gate of transistor 1466. At least a part of material portion 1387 can form a gate of transistor 1467. Transistor 1466 and 1467 can correspond to transistors 266 and 267, respectively, associated with corresponding memory cell strings 231 and 232 of memory device 200A of FIG. 2A.

FIG. 15A through FIG. 21B show processes of forming a memory device 1500, according to an embodiment of the invention. The processes described with reference to FIG. 15A through FIG. 21B can also be used to form memory device 200B of FIG. 2B with a shared top drain select gate (e.g., gate 289 in FIG. 2B).

Some of the processes used to form memory device 500 described above with reference to FIG. 5 through FIG. 14B can be used to form memory device 1500, described herein with reference to FIG. 15A through FIG. 21B. Thus, for simplicity, the same reference numbers are given to similar or identical materials and features associated with forming memory device 500 (FIG. 5 through FIG. 14B) and forming memory device 1500 (FIG. 15A through FIG. 21B). Detailed description of the processes associated with forming such similar or identical materials and features is not repeated in the description of FIG. 15A through FIG. 21B. For example, materials and features in FIG. 15A and FIG. 15B can be similar to those in FIG. 8A and FIG. 8B, including substrate 590, material 501, pedestals 642 and 643, and materials 770 and 780. The processes associated with forming the materials and features in FIG. 15A and FIG. 15B can be similar to or identical to those described above with reference to FIG. 5 through FIG. 8B.

Figures 16A, 16B:
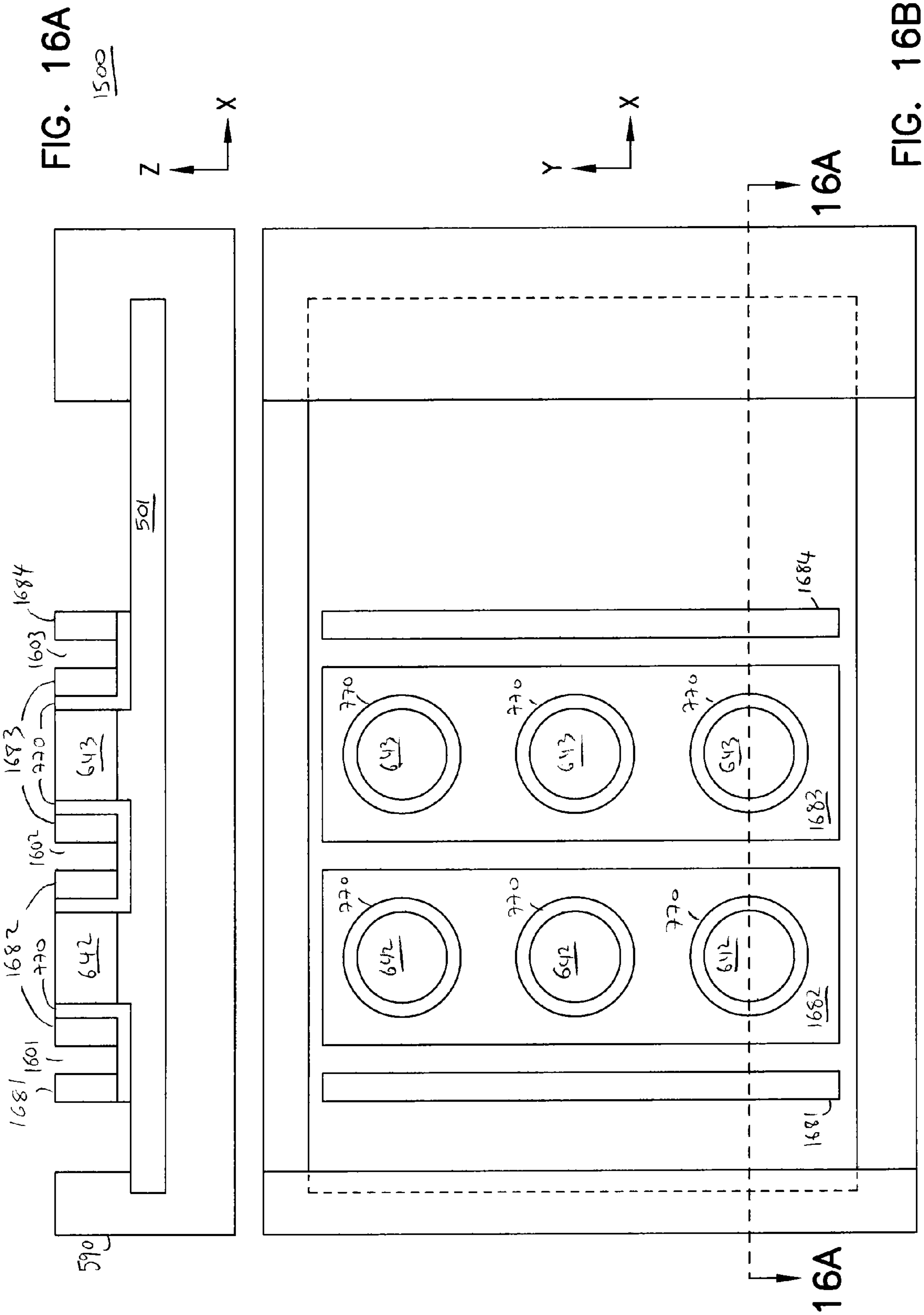

FIG. 16A and FIG. 16B show memory device 1500 after material portions 1681, 1682, 1683, and 1684 have been formed. FIG. 16B shows a top view of memory device 1500 of FIG. 16A. Forming material portions 1681, 1682, 1683, and 1684 can include removing (e.g., etching) part of material 780 at locations 1601, 1602, and 1603, such that material portions 1681, 1682, 1683, and 1684 are separated from each other.

Figure 17:
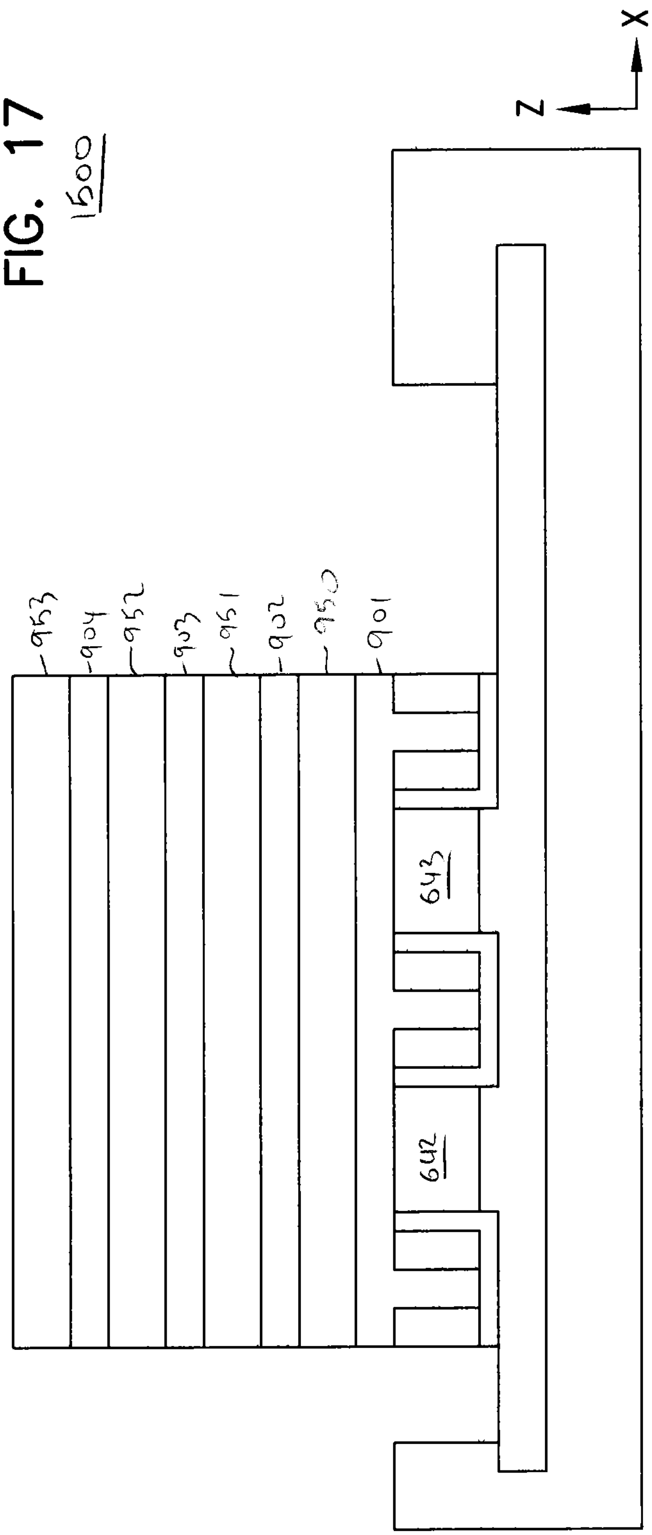

FIG. 17 shows memory device 1500 after materials 901, 902, 903, 904, 950, 951, 952, and 953 have been formed. The processes associated with forming materials 950, 951, 952, and 953 in FIG. 17 can be similar to or identical to those described above with reference to FIG. 9.

Figure 18A:
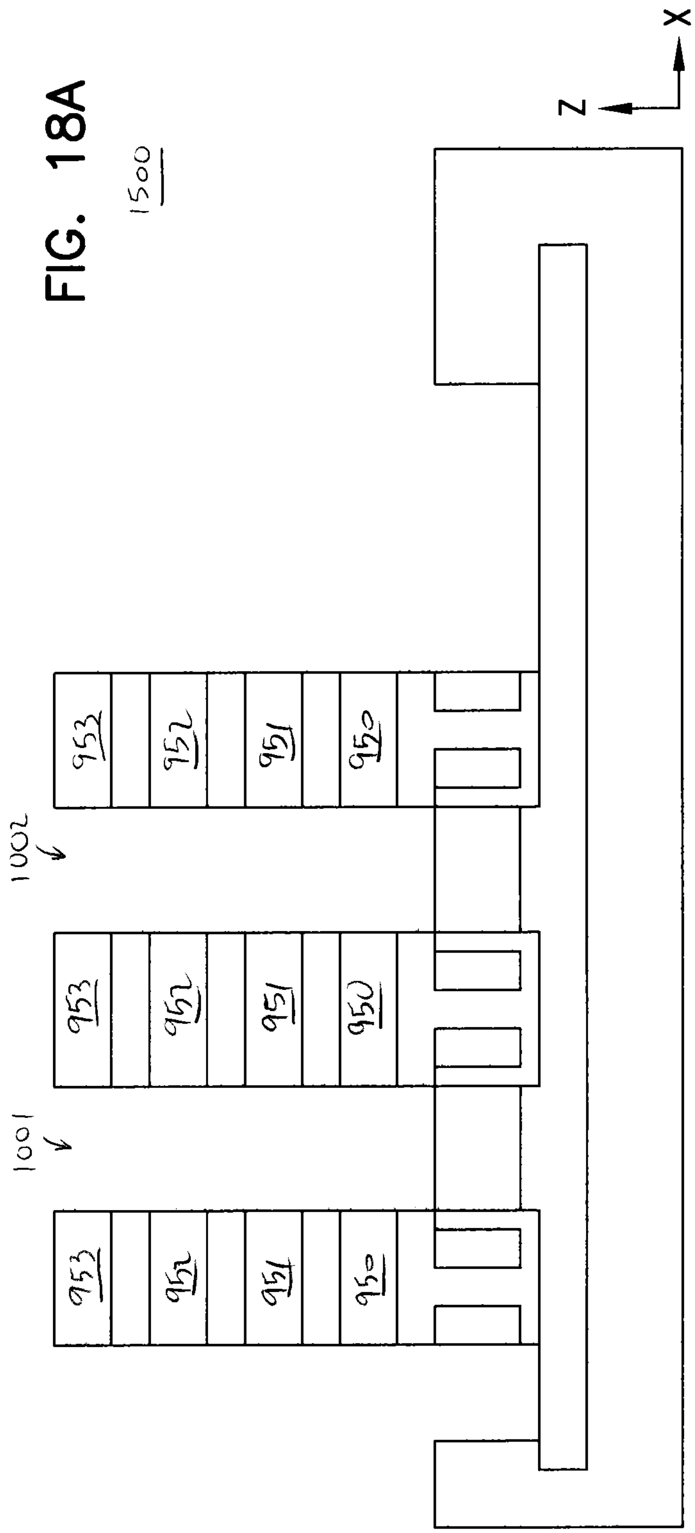
Figure 18B:
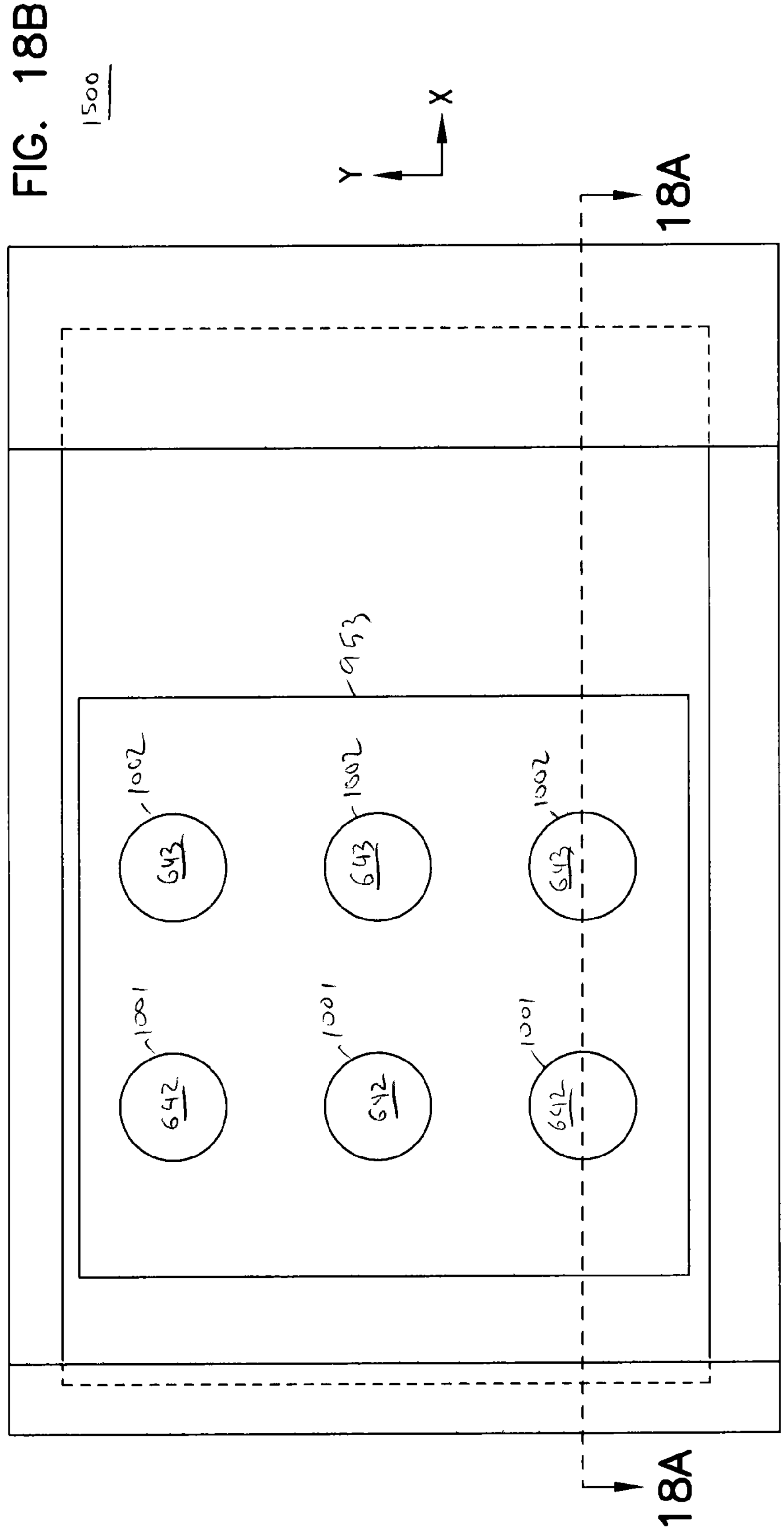

FIG. 18A and FIG. 18B show memory device 1500 after holes 1001 and 1002 have been formed. FIG. 18B shows a top view of memory device 1500 of FIG. 18A. The processes associated with forming holes 1001 and 1002 in FIG. 18A and FIG. 18B can be similar to or identical to those described above with reference to FIG. 10A and FIG. 10B.

Figure 19A:
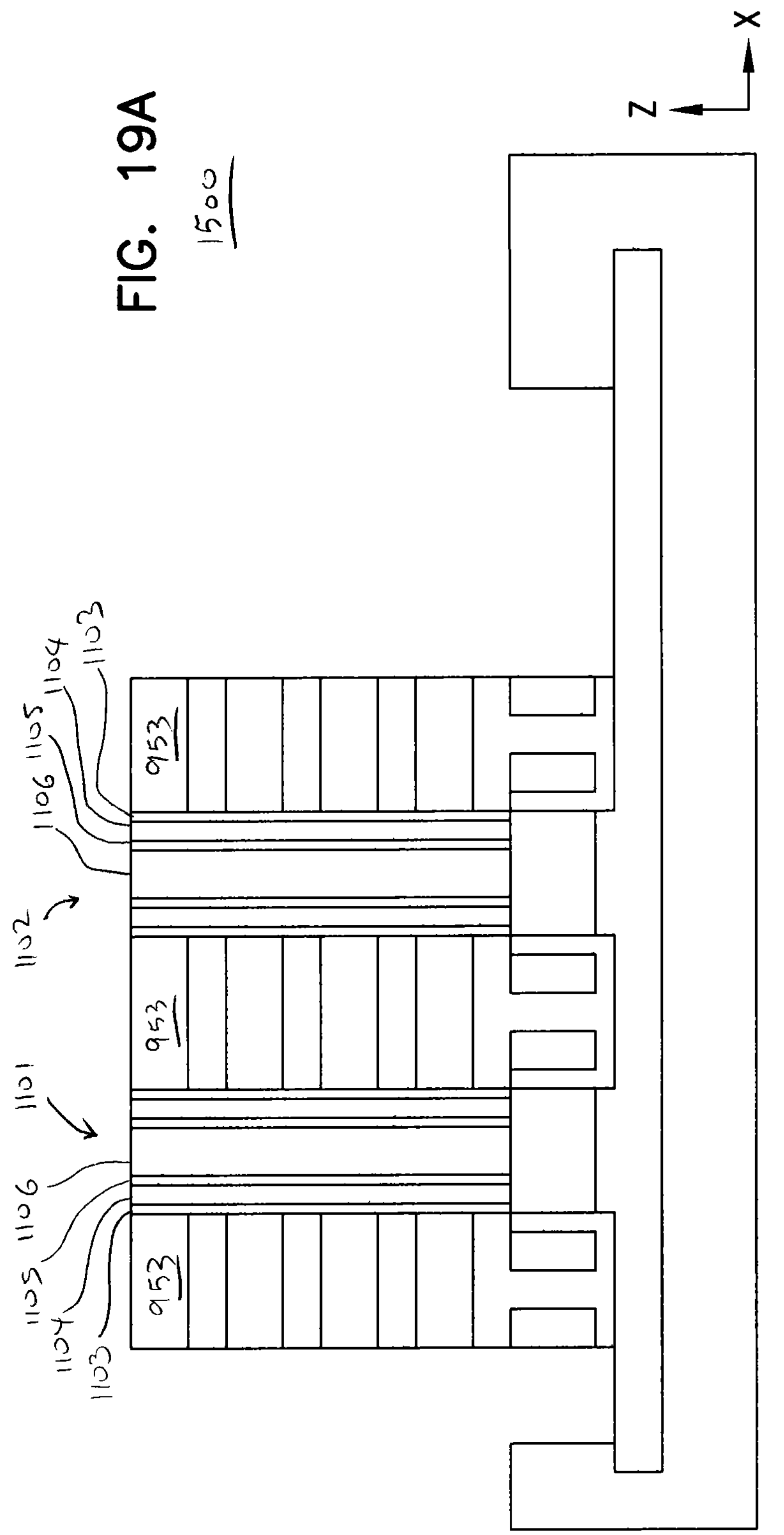
Figure 19B:
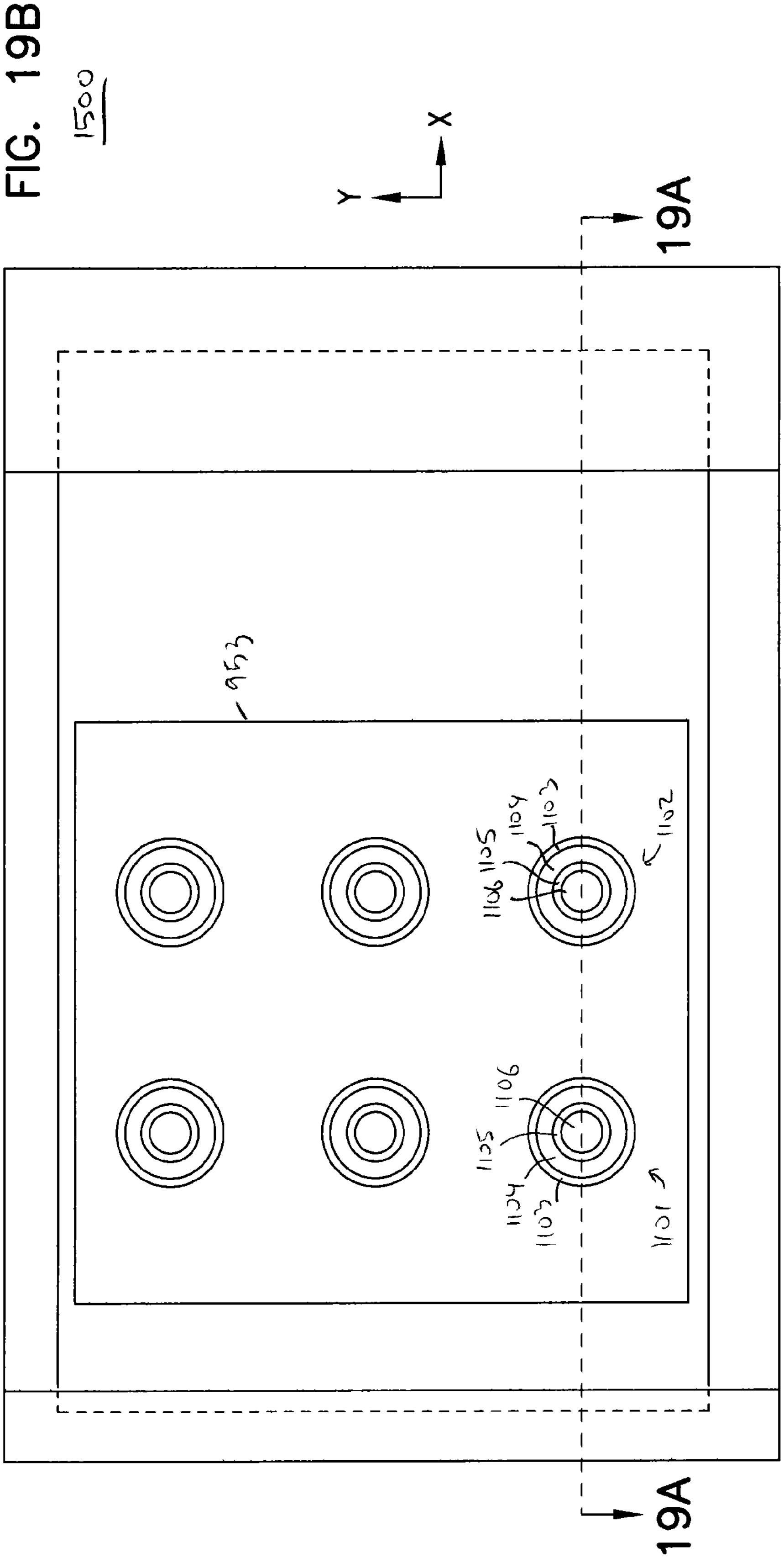

FIG. 19A and FIG. 19B show memory device 1500 after pillars 1101 and 1102 have been formed in holes 1001 and 1002. FIG. 19B shows a top view of memory device 1500 of FIG. 19A. As shown in FIG. 19A, each of pillars 1101 and 1102 can include materials 1103, 1104, 1105 and 1106. The processes associated with forming pillars 1101 and 1102 in FIG. 19A and FIG. 19B can be similar to or identical to those described above with reference to FIG. 11A and FIG. 11B.

Figure 20A:
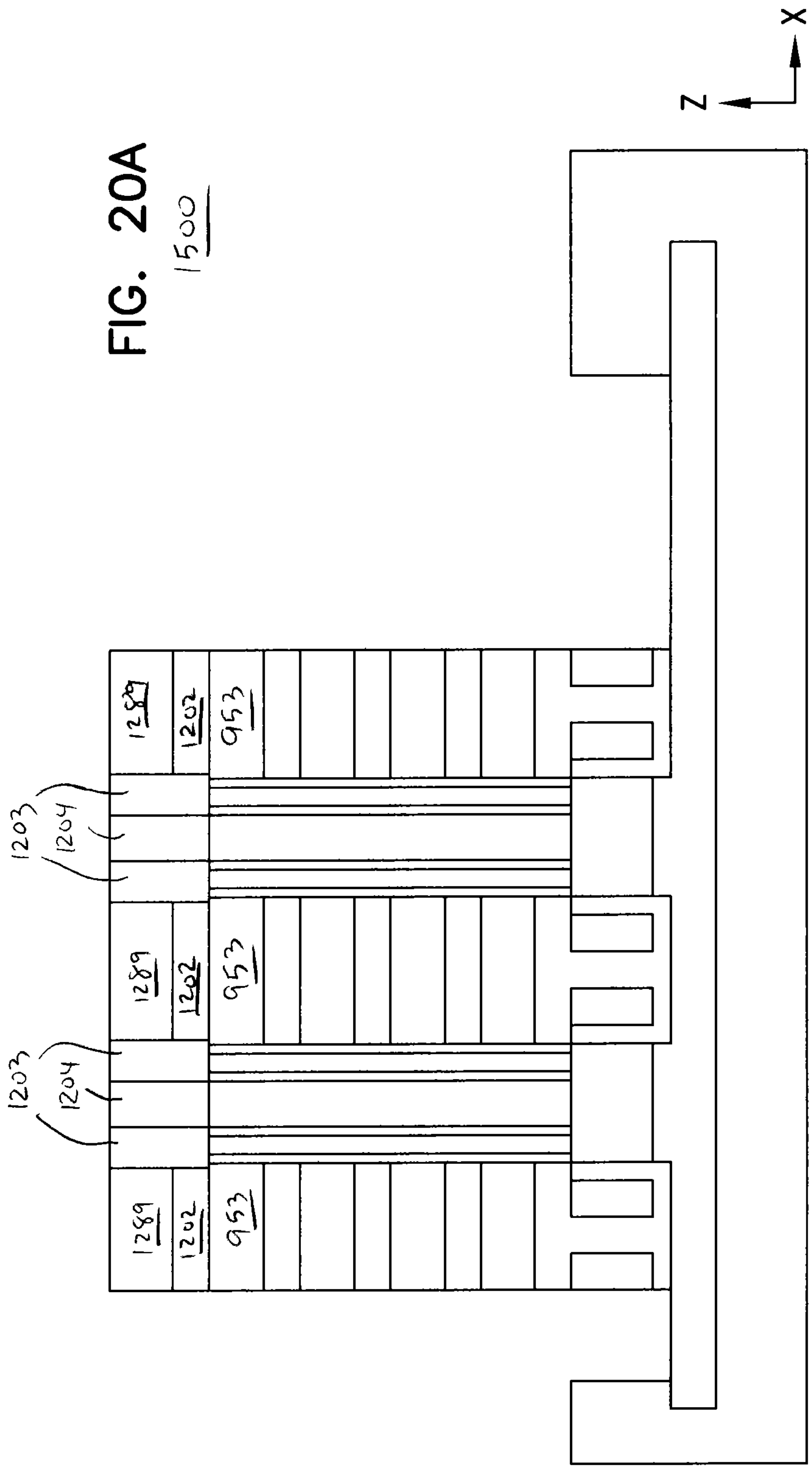
Figure 20B:
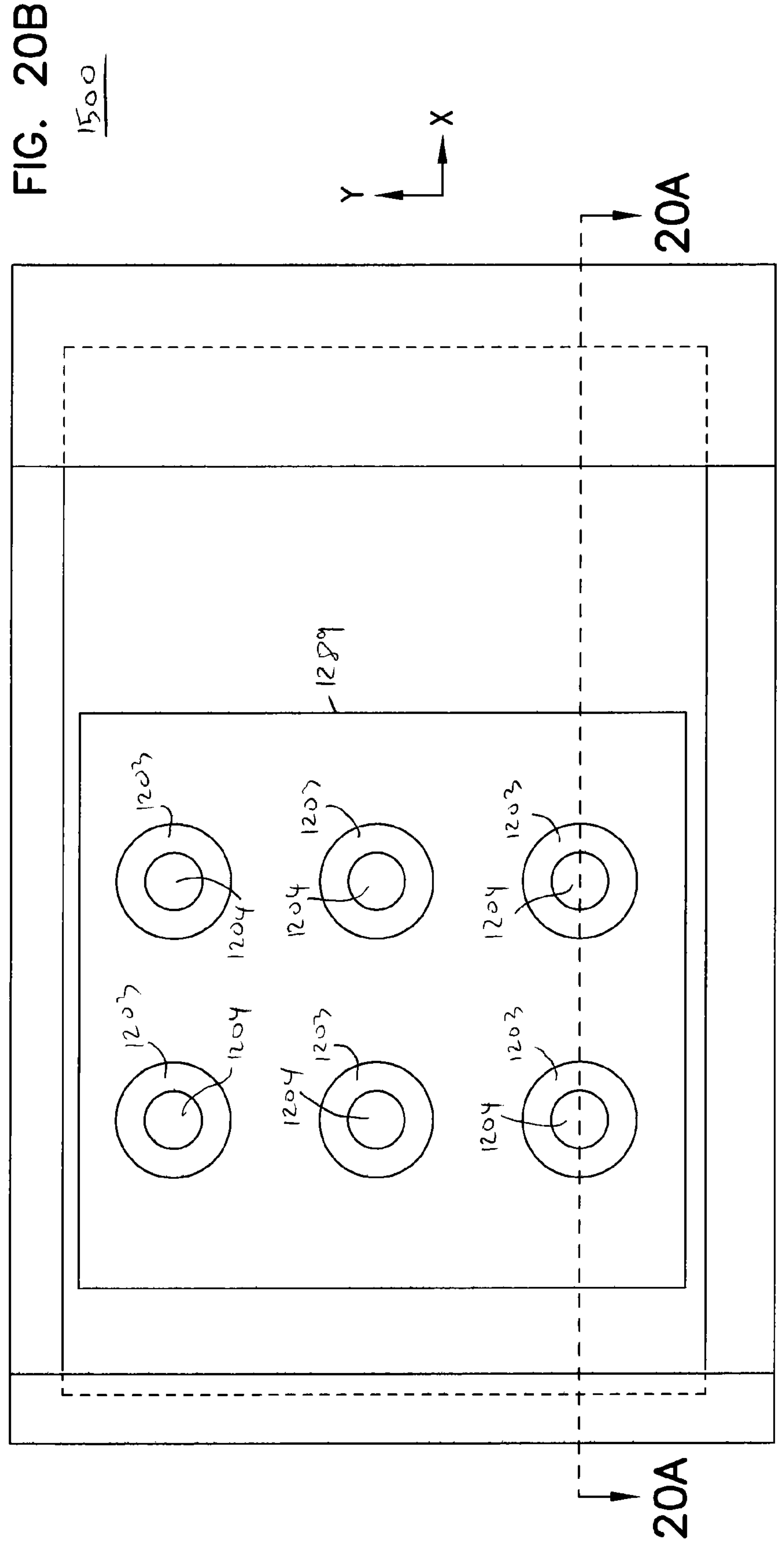

FIG. 20A and FIG. 20B show memory device 1500 after materials 1202, 1203, 1204, and 1289 have been formed. FIG. 20B shows a top view of memory device 1500 of FIG. 20A. The processes associated with forming materials 1202, 1203, 1204, and 1289 in FIG. 20A and FIG. 20B can be similar to or identical to those described above with reference to FIG. 12A and FIG. 12B.

Figure 21A:
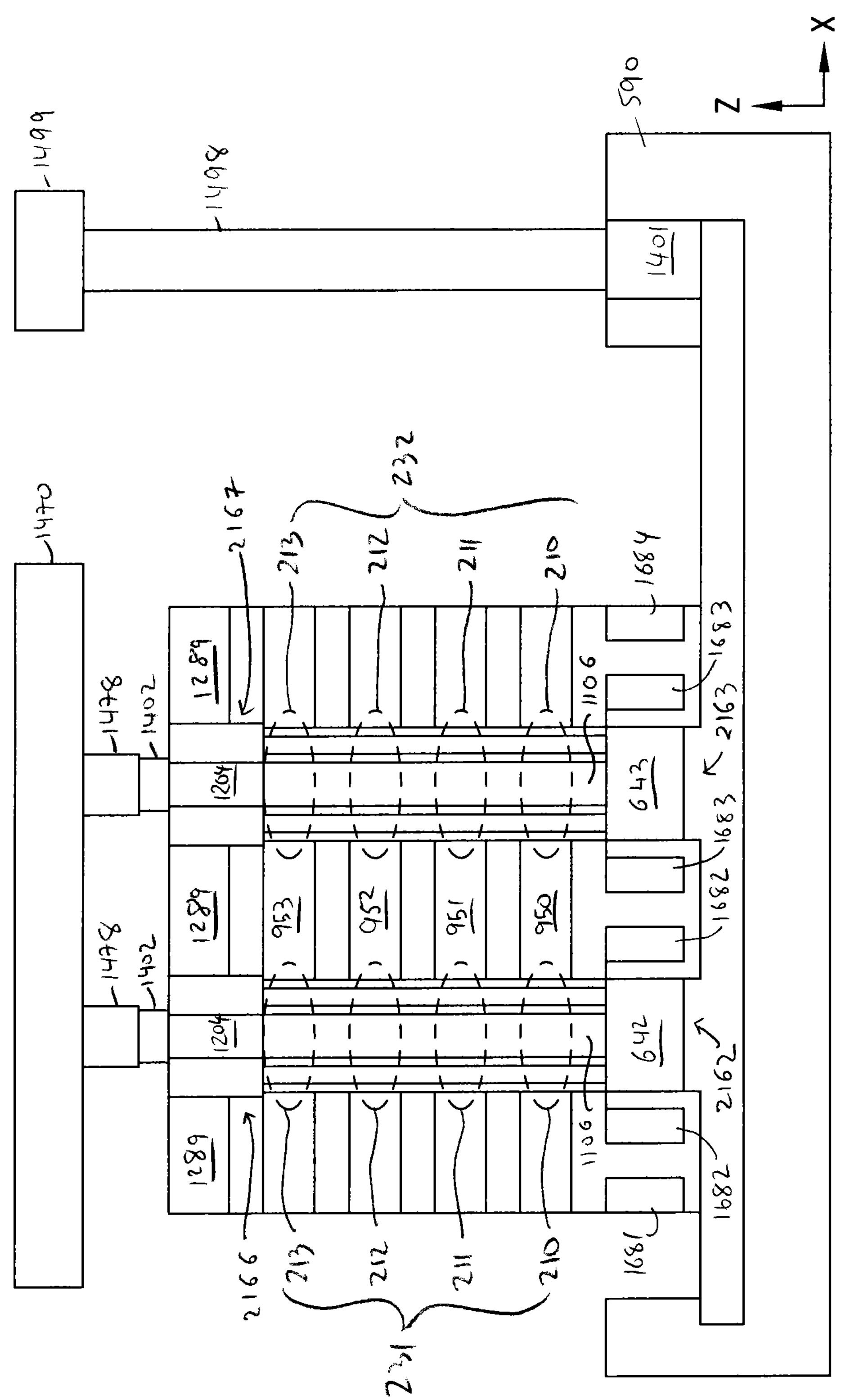
Figure 21B:
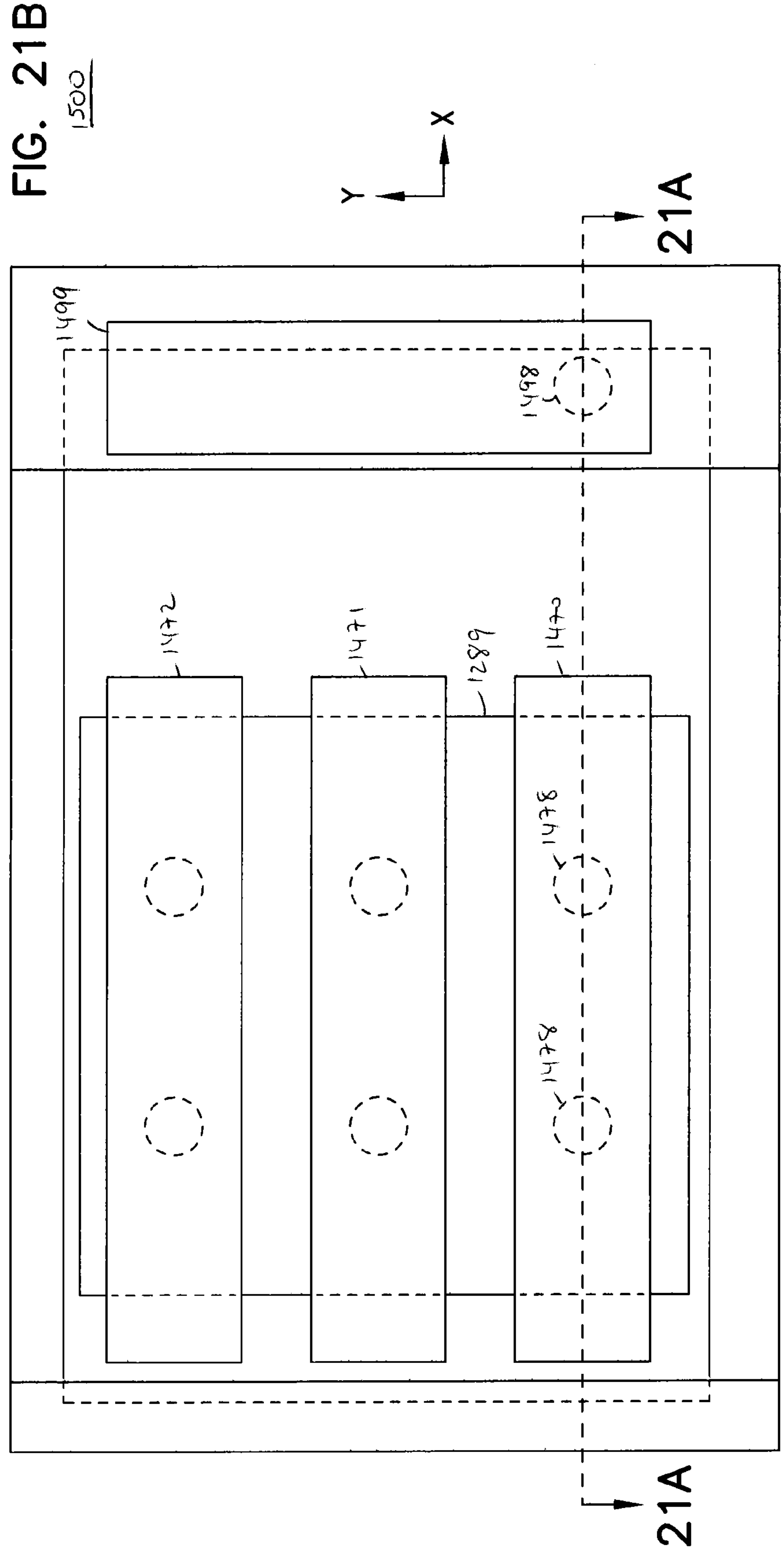

FIG. 21A and FIG. 21B show memory device 1500 after materials 1401 and 1402, conductive contacts 1478 and 1498, and conductive lines 1470, 1471, 1472, and 1499 have been formed. FIG. 21B shows a top view of memory device 1500 of FIG. 21A. The processes associated with forming materials 1401 and 1402, conductive contacts 1478 and 1498, and conductive lines 1470, 1471, 1472, and 1499 in FIG. 21A and FIG. 21B can be similar to or identical to those described above with reference to FIG. 14A and FIG. 14B.

As shown in FIG. 21A, memory device 1500 can include memory cells 210, 211, 212, and 213 located in different levels of memory device 1500, such as different levels in the z-direction. Memory cells 210, 211, 212, and 213 can be arranged in memory cell strings 231 and 232. Memory cell strings 231 and 232 in FIG. 21A can correspond to memory cell strings 231 and 232 of memory device 200B of FIG. 2B. In FIG. 21A, each of memory cell strings 231 and 232 can include a body (e.g., body located between materials 1204 and one of the pedestals 642 and 643) formed at least in part by material 1106 and contacting one of pedestals 642 and 643.

Conductive lines 1470, 1471, 1472, and 1499 can correspond to lines 270, 271, 272, and 299, respectively, of memory device 200B of FIG. 2B.

Materials 950, 951, 952, and 953 in FIG. 21A can form control gates that are located along the body (e.g., body formed at least in part by material 1106) of each of memory cell strings 231 and 232. These control gates (e.g., formed by materials 950, 951, 952, and 953) can correspond to control gates 250, 251, 252, and 253, respectively, associated with corresponding memory cell strings 231 and 232 of memory device 200B of FIG. 2B.

Material 1289 in FIG. 21A can form a gate (e.g., drain select gate) of memory device 1500 that can correspond to gate 289 of memory device 200B of FIG. 2B. Material portions 1681, 1682, 1683, and 1684 in FIG. 21A can form gates (e.g., source select gates) of memory device 1500 that can correspond to gates 281, 282, 283, and 284, respectively, of memory device 200B of FIG. 2B.

Memory device 1500 in FIG. 21A can include transistors 2162 and 2163. Transistor 2162 can include at least a part of pedestal 642 that can form a body region of transistor 2162. Transistor 2163 can include at least a part of pedestal 643 that can form a body region of transistor 2163. Transistors 2162 and 2163 can include separate gates. For example, at least a part of material portion 1682 can form a gate of transistor 2162. At least a part of material portion 1683 can form a gate of transistor 2163. As shown in FIG. 21A, at least a portion of the gate (e.g., formed by material portion 1682) of transistor 2162 can be located in substrate 590 and can surround at least a portion of the body region (e.g., body region formed by at least a part of pedestal 642) of transistor 2162. At least a portion of the gate (e.g., formed by material portion 1683) of transistor 2163 can be located in substrate 590 and can surround at least a portion of the body region (e.g., body region formed by at least a part of pedestal 643) of transistor 2163. Transistor 2162 and 2163 can correspond to transistors 262 and 263, respectively, associated with corresponding memory cell strings 231 and 232 of memory device 200B of FIG. 2B.

Memory device 1500 in FIG. 21A can include transistors 2166 and 2167. Transistor 2166 can include at least a part of material 1204 (overlying pedestal 642) that can form a body region of transistor 2166. Transistor 2167 can include part of material 1204 (overlying pedestal 643) that can form a body region of transistor 1466. Transistors 2166 and 2167 can share the same gate (e.g., drain select gate), which can be formed by material 1289. Transistors 2166 and 2167 can correspond to transistors 266 and 267, respectively, associated with corresponding memory cell strings 231 and 232 of memory device 200B of FIG. 2B.

FIG. 22A through FIG. 27 show processes of forming a memory device 2200, according to an embodiment of the invention. The processes described with reference to FIG. 22A through FIG. 27 can also be used to form memory device 300A of FIG. 3A with a shared top source select gate (e.g., gate 280 in FIG. 3A).

Figure 22A:
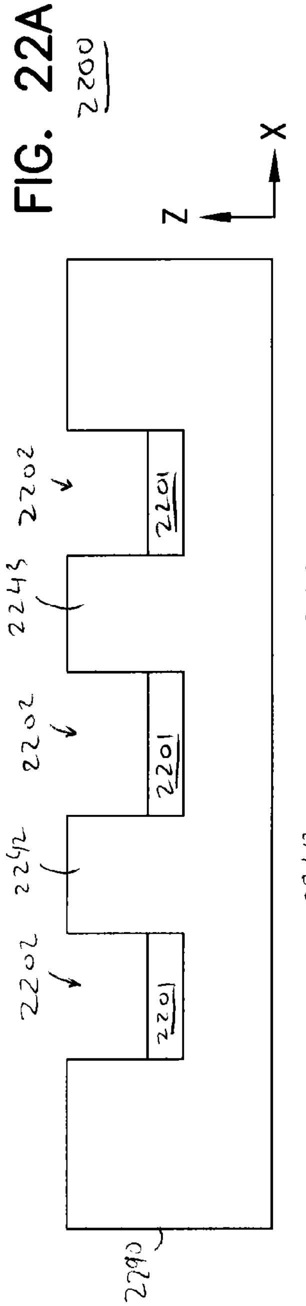
FIG. 22A through FIG. 27 show processes of forming a memory device (e.g., the memory device of FIG. 3A) with a shared top source select gate, according to an embodiment of the invention.
Figure 22B:
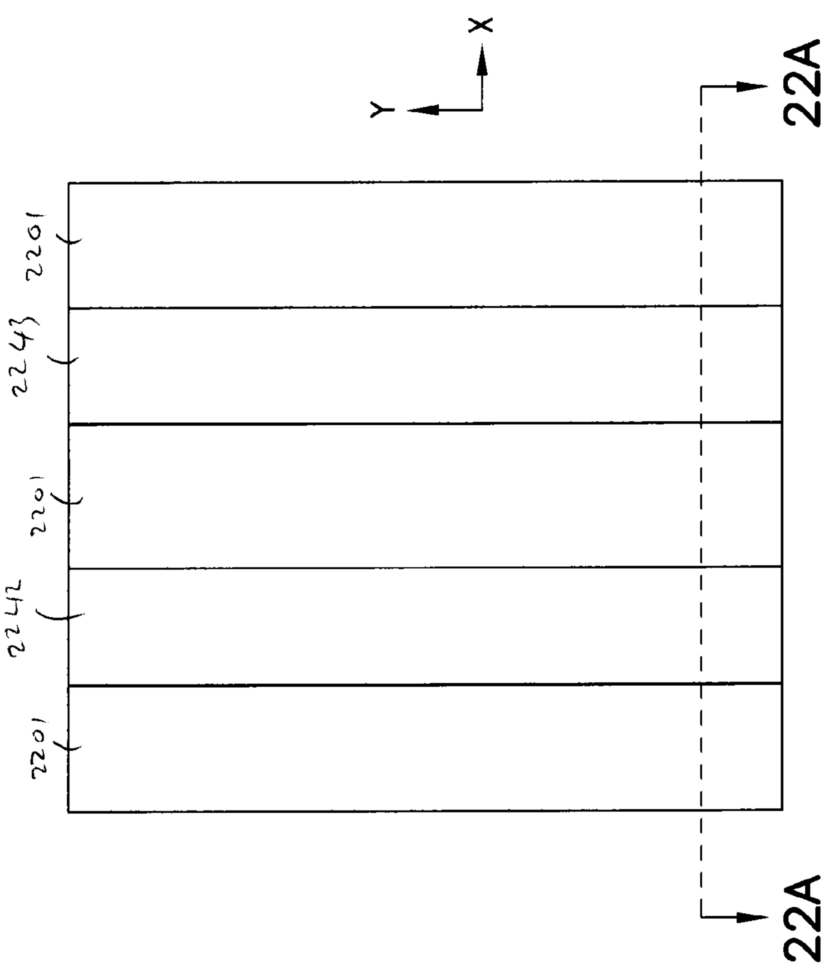

FIG. 22A shows memory device 2200 after a material 2201 and trenches 2202 have been formed in a substrate 2290. FIG. 22B shows a top view of a portion of memory device 2200 of FIG. 22A. Forming trenches 2202 can include removing (e.g., etching) a portion of substrate 2290 at trenches 2202, such that trenches 2202 can be separated from each other by substrate portions 2242 and 2243. Forming material 2201 can include inserting (e.g., implanting) impurity into a portion of the substrate 2290 at the bottom of trenches 2202, such that the portion of substrate 2290 at the bottom of trenches 2202 and the impurities can form material 2201. Substrate portions 2242 and 2243 are part of substrate 2290. Thus, substrate portions 2242 and 2243 can include the same material as that of substrate 2290. Substrate 2290 can include a material (e.g., p-type monocrystalline silicon) similar to or identical to that of substrate 590 of FIG. 5. Material 2201 can include a material (e.g., n-type monocrystalline silicon) similar to or identical to that of material 501 of FIG. 5.

Figure 23A:
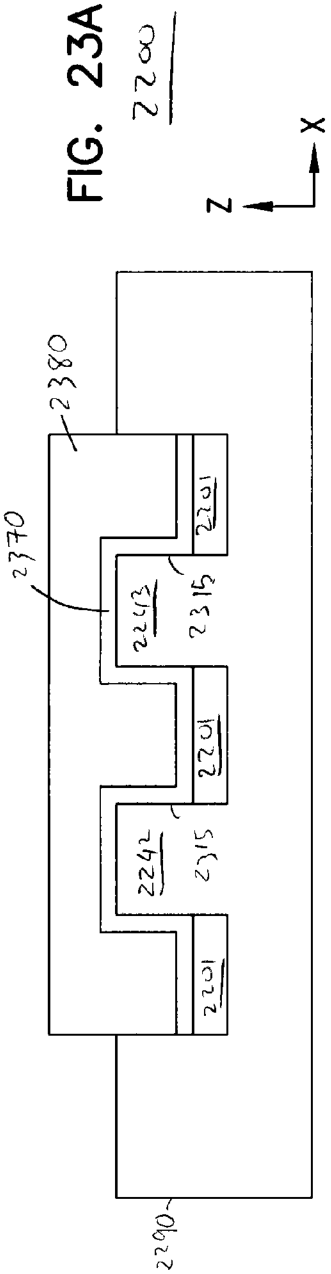
Figure 23B:
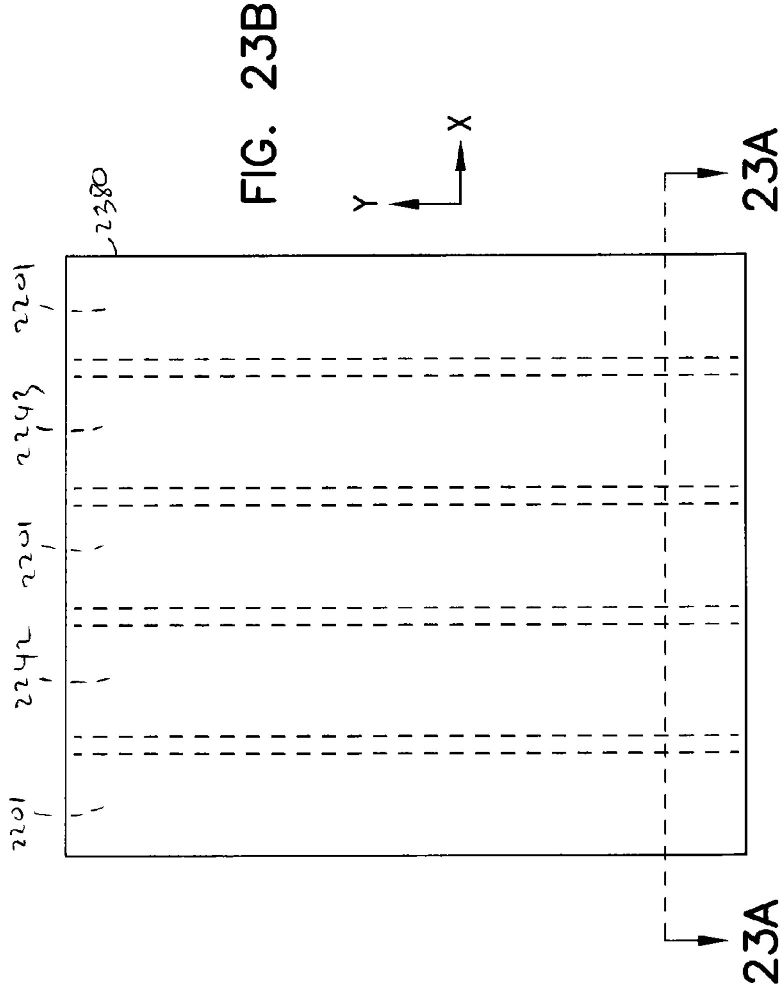

FIG. 23A and FIG. 23B show memory device 2200 after materials 2370 and 2380 have been formed. FIG. 23B shows a top view of a portion of memory device 2200 of FIG. 23A. Forming materials 2370 and 2380 can include depositing material 2370 over substrate portions 2242 and 2243, conformal to sidewalls 2315, and over material 2201. Then, material 2380 can be formed (e.g., deposited) over material 2370. At least a portion of material 2380 can be located in (e.g., formed in) trenches 2202. Material 2370 can include dielectric material(s) (e.g., an oxide of silicon or other dielectric material). Material 2380 can include conductive material(s) (e.g., conductively doped polycrystalline silicon or other conductive material).

Figure 24A:
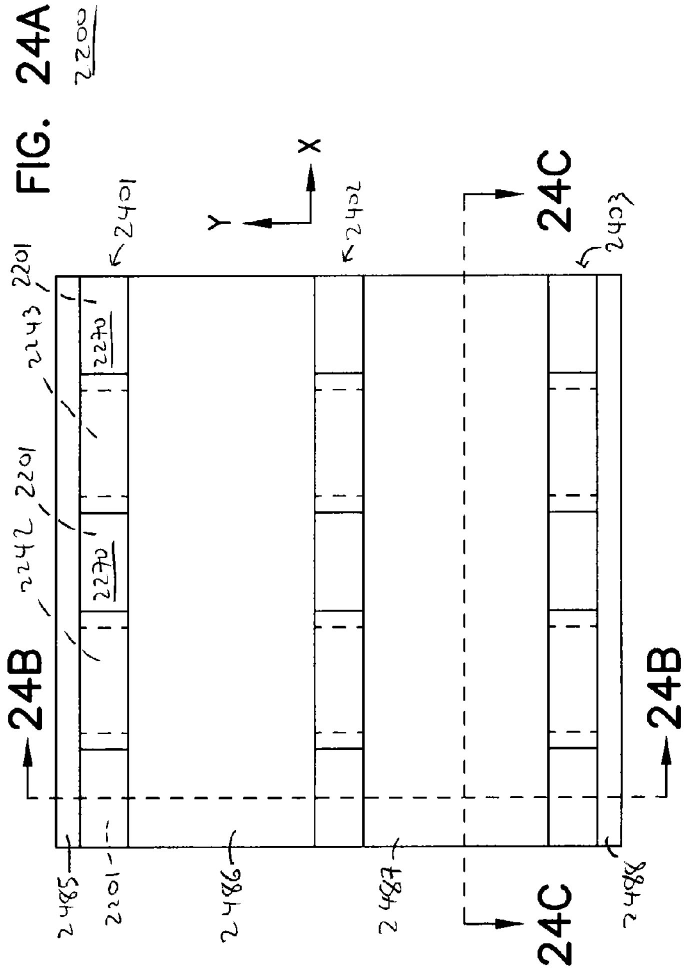
Figure 24B:
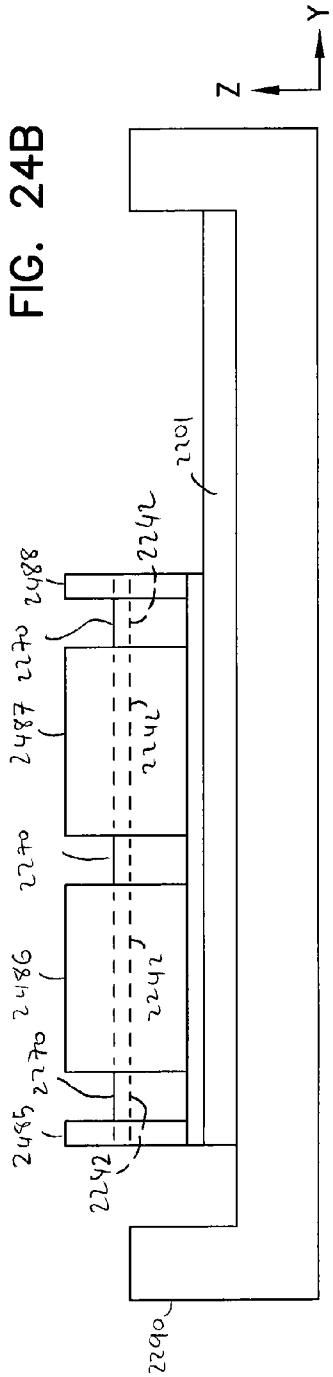
Figure 24C:
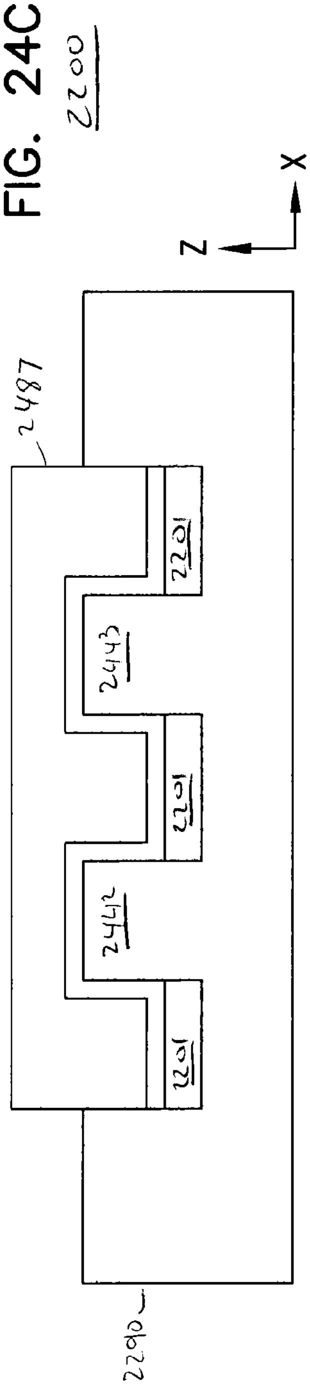

FIG. 24A, FIG. 24B, and FIG. 24C show memory device 2200 after material portions 2485, 2486, 2487, and 2488 have been formed. FIG. 24B shows a top view of memory device 2200 of FIG. 24A. FIG. 24C shows another view of memory device 2200 along line 24C of FIG. 24B. Forming material portions 2485, 2486, 2487, and 2488 in FIG. 24A can include separating material 2380 (FIG. 23B) into separate material portions, for example, by removing (e.g., etching) part of material 2380 (FIG. 23B) at locations 2401, 2402, and 2403 (FIG. 24A), such that material portions 2485, 2486, 2487, and 2488 can be separated from each other.

Some of the processes used to form memory device 500 described above with reference to FIG. 5 through FIG. 14B can be used to form memory device 2200 described herein with reference to FIG. 22A through FIG. 27. Thus, for simplicity, the same reference numbers are given to similar or identical materials and features associated with forming memory device 500 (FIG. 5 through FIG. 14B) and forming memory device 2200 (FIG. 22A through FIG. 27). Detailed description of the processes associated with forming such similar or identical materials and features is not repeated in the description of FIG. 22A through FIG. 27.

Figure 25:
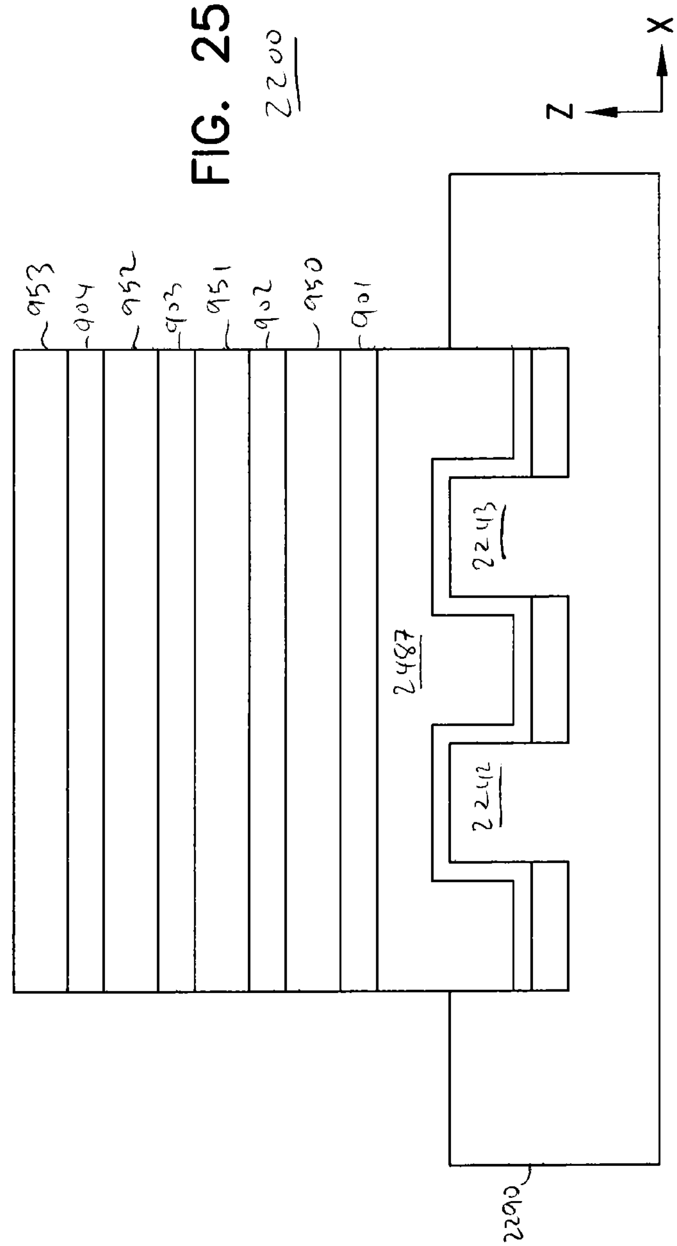

FIG. 25 shows memory device 2200 after materials 901, 902, 903, 904, 950, 951, 952, and 953 have been formed. The processes associated with forming materials 901, 902, 903, and 904 and materials 950, 951, 952, and 953 in FIG. 25 can be similar to or identical to those described above with reference to FIG. 9.

Figure 26A:
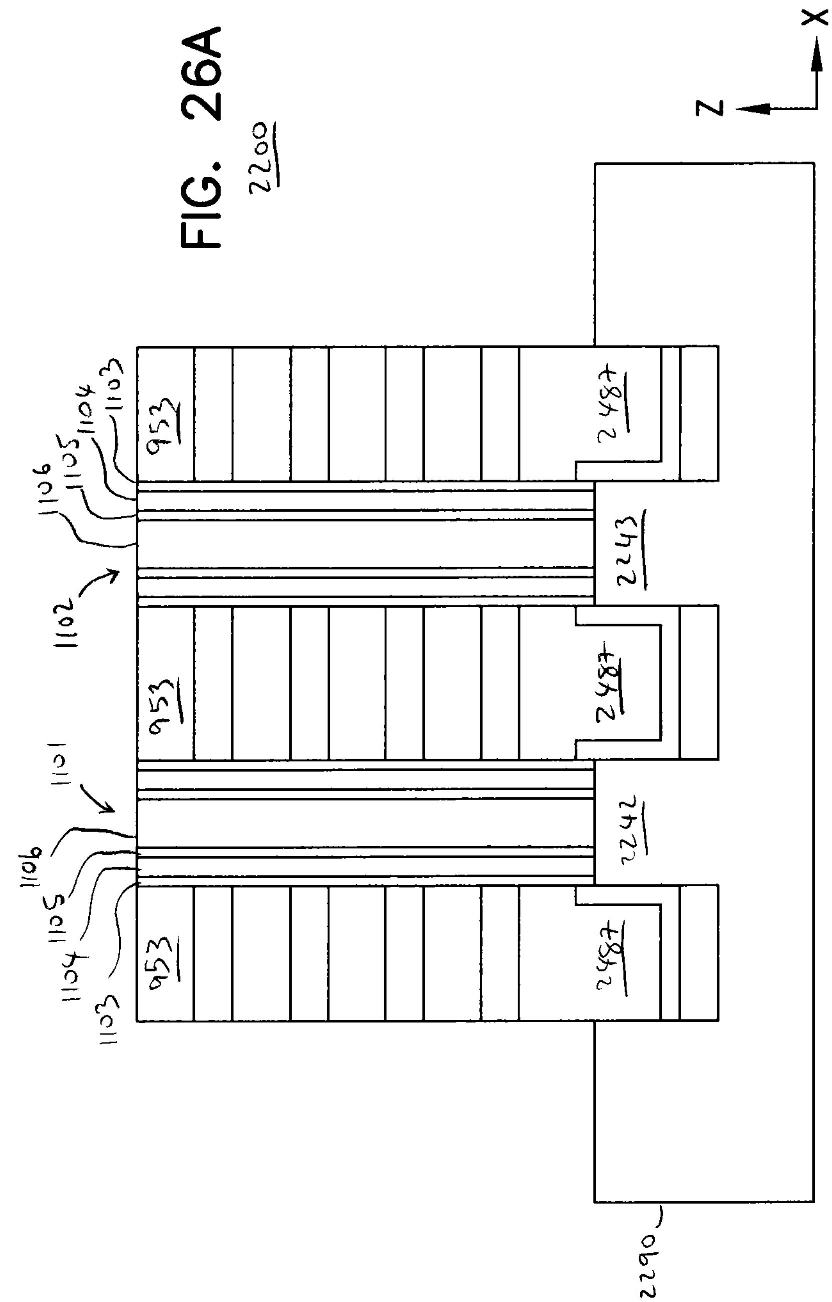
Figure 26B:
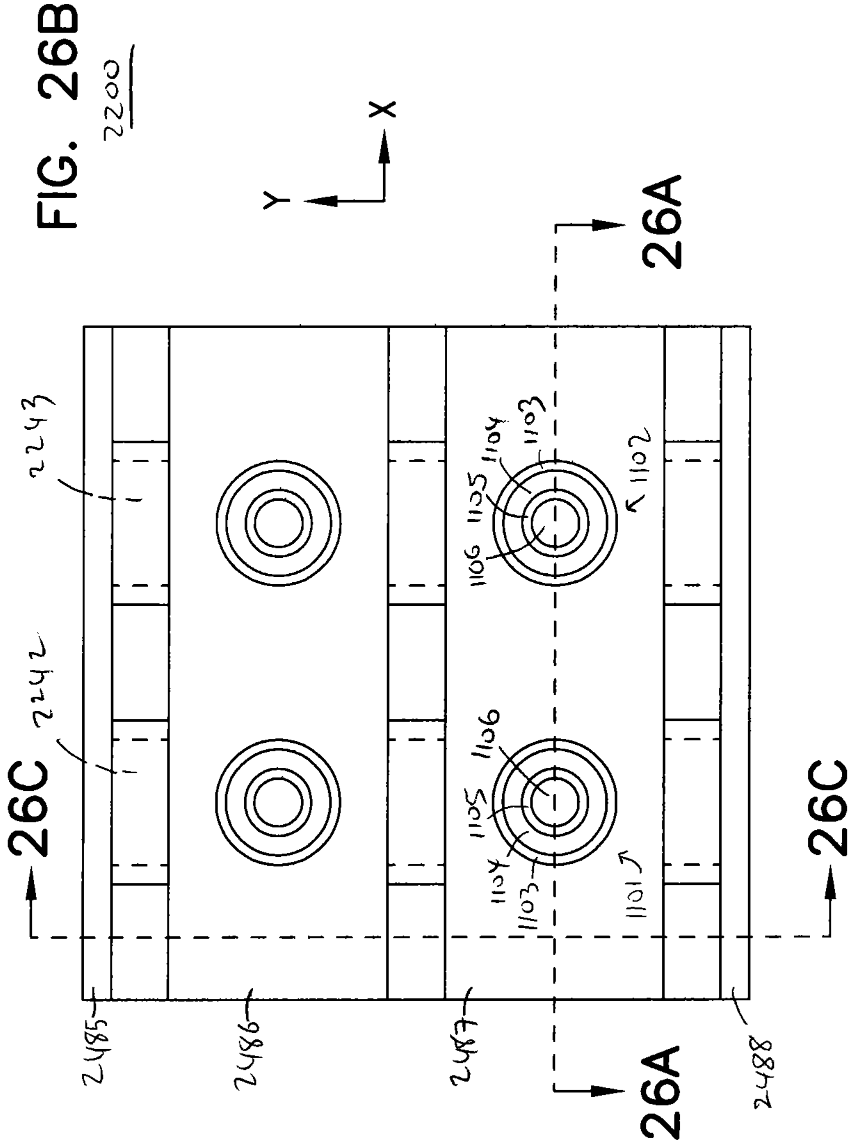
Figure 26C:
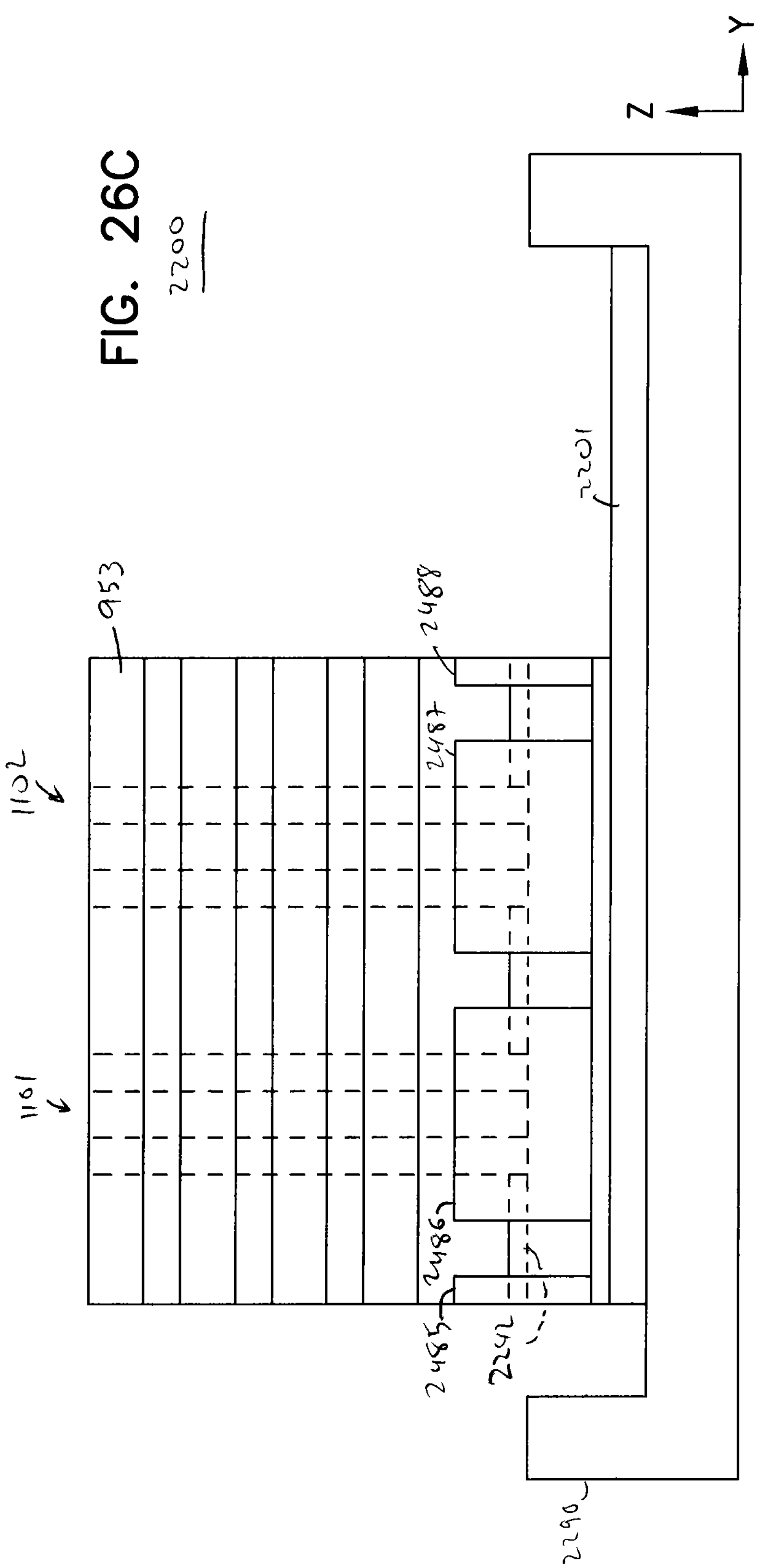

FIG. 26A, FIG. 26B, and FIG. 26C show memory device 2200 after pillars 1101 and 1102 have been formed. FIG. 26B shows a top view of memory device 2200 of FIG. 26A. FIG. 26C shows another view of memory device 2200 along line 26C of FIG. 26B. As shown in FIG. 26A, each of pillars 1101 and 1102 can include materials 1103, 1104, 1105 and 1106.

In the figures associated with this application, some materials or features are omitted from a view (e.g., top view) in the figure, so that other materials (e.g., underneath materials) or features can be shown, in order to focus on some materials or features of the structures described herein. For example, in FIG. 26B, materials 901, 902, 903, 904, 950, 951, 952, and 953 (in FIG. 26A) are omitted, so that other materials, such as material portions 2485, 2486, 2487, and 2488, can be shown. The processes associated with forming pillars 1101 and 1102 in FIG. 26A can be similar to or identical to those described above with reference to FIG. 11A and FIG. 11B.

Figure 27:
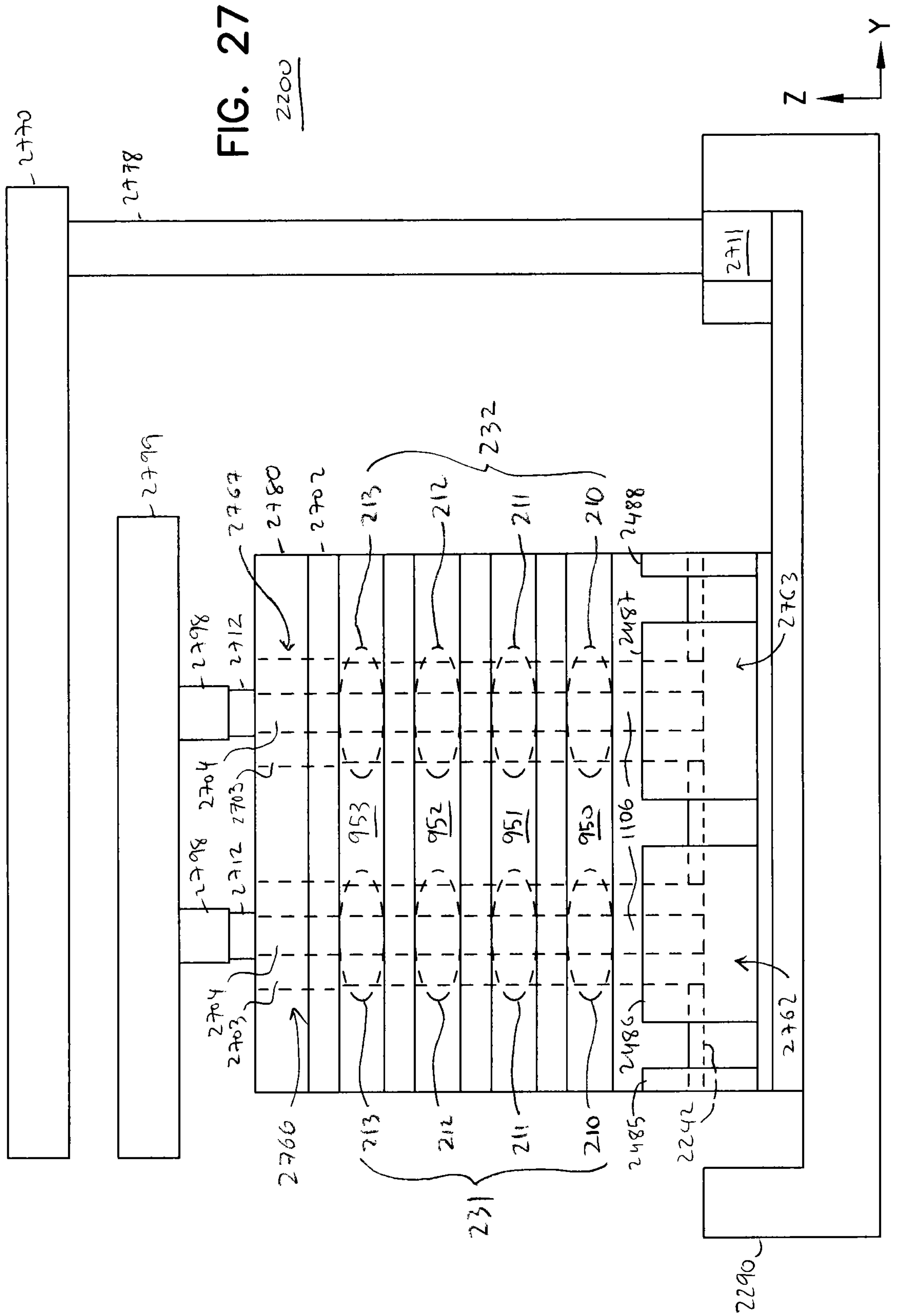
Figure 28A:
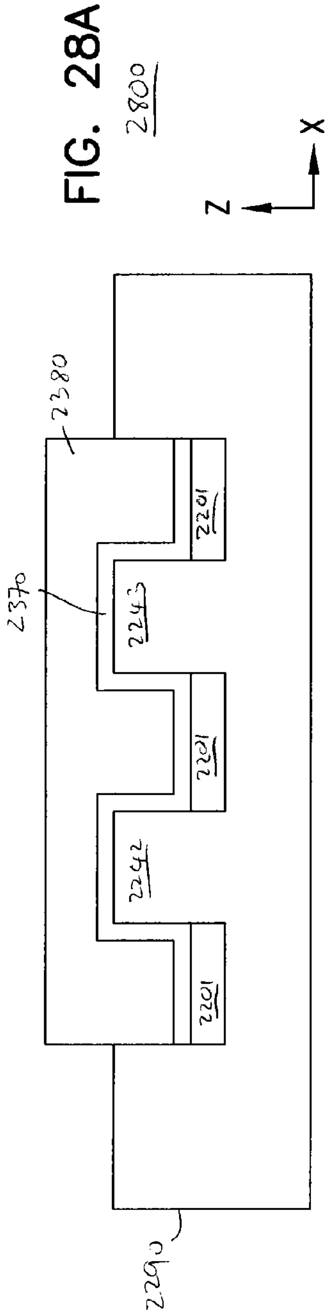
FIG. 28A through FIG. 32 show processes of forming a memory device (e.g., the memory device of FIG. 3B) with a shared bottom drain select gate, according to an embodiment of the invention.
Figure 28B:
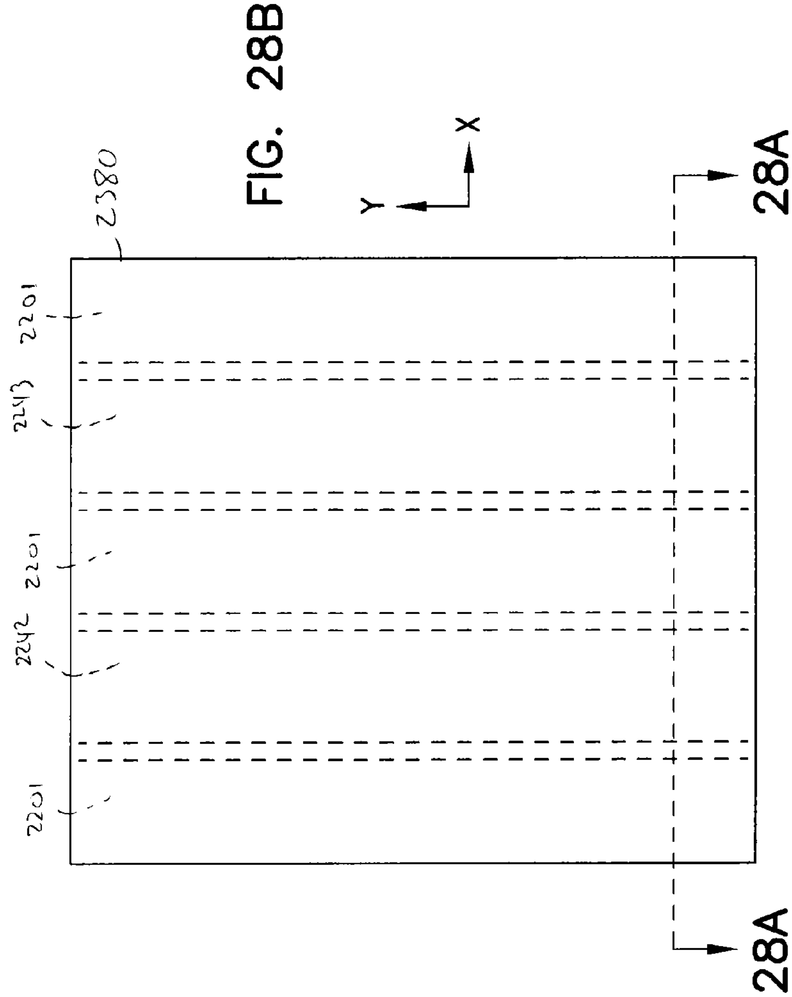

FIG. 27 shows memory device 2200 after materials 2702, 2703, 2704, 2711, 2712, and 2780, conductive contacts 2778 and 2798, and conductive lines 2770 and 2799 have been formed. Materials 2702, 2703, 2704, and 2780 can include materials similar to or identical to those of materials 1202, 1203, 1204, and 1289, respectively, described above with reference to FIG. 20A and FIG. 20B. Materials 2711 and 2712, conductive contacts 2778 and 2798, and conductive lines 2770 and 2799 can include materials similar to or identical to those of materials 1401 and 1402, conductive contacts 1498 and 1478, and conductive lines 1470 and 1499, respectively, described above with reference to FIG. 21A and FIG. 21B.

As shown in FIG. 27, memory device 2200 can include memory cells 210, 211, 212, and 213 located in different levels of memory device 2200, such as different levels in the z-direction. Memory cells 210, 211, 212, and 213 can be arranged in memory cell strings 231 and 232 that overlie different locations of substrate portion 2242. Memory cell strings 231 and 232 in FIG. 27 can correspond to memory cell strings 231 and 232 of memory device 300A of FIG. 3A. In FIG. 27, each of memory cell strings 231 and 232 can include a body (e.g., body located between materials 2704 and substrate portion 2242) formed at least in part by material 1106 and contacting substrate portion 2242.

Conductive lines 2770 and 2799 can correspond to lines 270 and 299, respectively, of memory device 300A of FIG. 3A.

Materials 950, 951, 952, and 953 in FIG. 27 can form control gates that are located along the body (e.g., body formed at least in part by material 1106) of each of memory cell strings 231 and 232. These control gates (e.g., formed by materials 950, 951, 952, and 953) can correspond to control gates 250, 251, 252, and 253, respectively, associated with corresponding memory cell strings 231 and 232 of memory device 300A of FIG. 3A.

Material 2780 in FIG. 27 can form a gate (e.g., source select gate) of memory device 2200 that can correspond to gate 280 of memory device 300A of FIG. 3A. Material portions 2485, 2486, 2487, and 2488 in FIG. 27 can form gates (e.g., drain select gates) of memory device 2200 that can correspond to gates 285, 286, 287, and 288, respectively, of memory device 300A of FIG. 3A.

Memory device 2200 in FIG. 27 can include transistors 2762 and 2763. Transistor 2762 can include at least a part of substrate portion 2242 that can form a body region of transistor 2762. Transistor 2763 can include at least a part of substrate portion 2242 that can form a body region of transistor 2763. Transistors 2762 and 2763 can include separate gates. For example, at least a part of material portion 2486 can form a gate of transistor 2762. At least a part of material portion 2487 can form a gate of transistor 2763. As shown in FIG. 27, at least a portion of the gate (e.g., formed by material portion 2486) of transistor 2762 can be located in substrate 2290 and can surround at least a portion of the body region (e.g., body region formed by at least a part of substrate portion 2242) of transistor 2762. At least a portion of the gate (e.g., formed by material portion 2487) of transistor 2763 can be located in substrate 2290 and can surround at least a portion of the body region (e.g., body region formed by at least a part of substrate portion 2242) of transistor 2763. Transistors 2762 and 2763 can correspond to transistors 262 and 263, respectively, associated with corresponding memory cell strings 231 and 232 of memory device 300A of FIG. 3A.

Memory device 2200 in FIG. 27 can include transistors 2766 and 2767. Transistor 2766 can include at least a part of material 2704 (coupled to memory cell string 231) that can form a body region of transistor 2766. Transistor 2767 can include part of material 2704 (coupled to memory cell string 232) that can form a body region of transistor 2767. Transistors 2766 and 2767 can share the same gate (e.g., source select gate), which can be formed by material 2780. Transistor 2766 and 2767 can correspond to transistors 266 and 267, respectively, associated with corresponding memory cell strings 231 and 232 of memory device 300A of FIG. 3A.

FIG. 28A through FIG. 32 show processes of forming a memory device 2800, according to an embodiment of the invention. The processes described with reference to 28A through FIG. 32 can also be used to form memory device 300B of FIG. 3B with a shared bottom drain select gate (e.g., gate 289 in FIG. 3B).

Some of the processes used to form memory device 2200 described above with reference to FIG. 22A through FIG. 27 can be used to form memory device 2800 described herein with reference to FIG. 22A through FIG. 27. Thus, for simplicity, the same reference numbers are given to similar or identical materials and features associated with forming memory device 2200 (FIG. 22A through FIG. 27) and forming memory device 2800 (FIG. 28A through FIG. 32). Detailed description of the processes associated with forming such similar or identical materials and features is not repeated in the description of FIG. 28A through FIG. 32. For example, materials and features in FIG. 28A and FIG. 28B can be similar to those in FIG. 23A and FIG. 23B, including substrate 2290, material 2201, substrate portions 2242 and 2243, and materials 2370 and 2380. The processes associated with forming the materials and features in FIG. 28A and FIG. 28B can be similar to or identical to those described above with reference to FIG. 23A through FIG. 23B.

Figure 29:
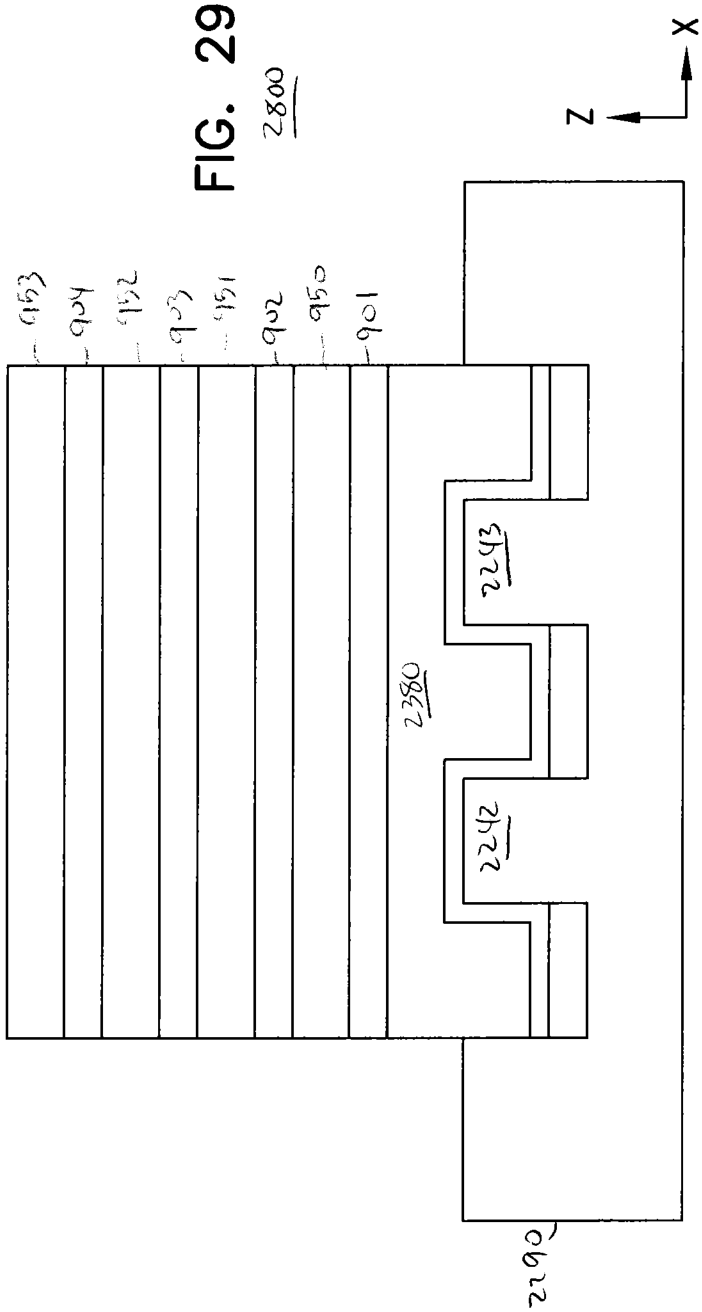

FIG. 29 shows memory device 2800 after materials 901, 902, 903, 904, 950, 951, 952, and 953 have been formed over material 2380. The processes associated with forming materials 901, 902, 903, and 904 and materials 950, 951, 952, and 953 in FIG. 29 can be similar to or identical to those described above with reference to FIG. 25. As a comparison to between the processes of forming memory devices 2200 (FIG. 22A through FIG. 27) and 2800 (FIG. 28A through FIG. 32), the processes of separating material 2380 (into material portions 2485, 2486, 2487, and 2488 in FIG. 24A, FIG. 24B, and FIG. 24C) are omitted from the processes of forming memory device 2800. Thus, as shown in FIG. 29, materials 901, 902, 903, 904, 950, 951, 952, and 953 can be formed over material 2380 (which is not separated).

Figure 30A:
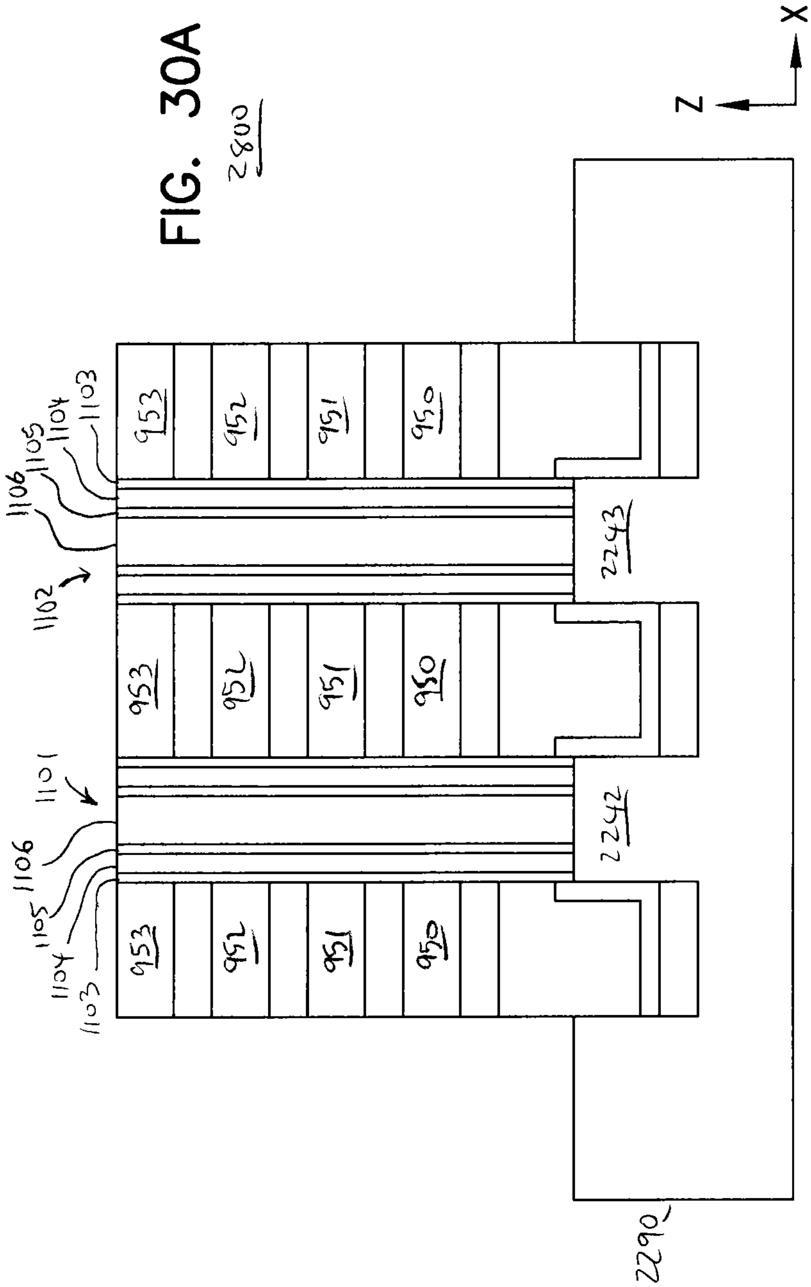
Figure 30B:
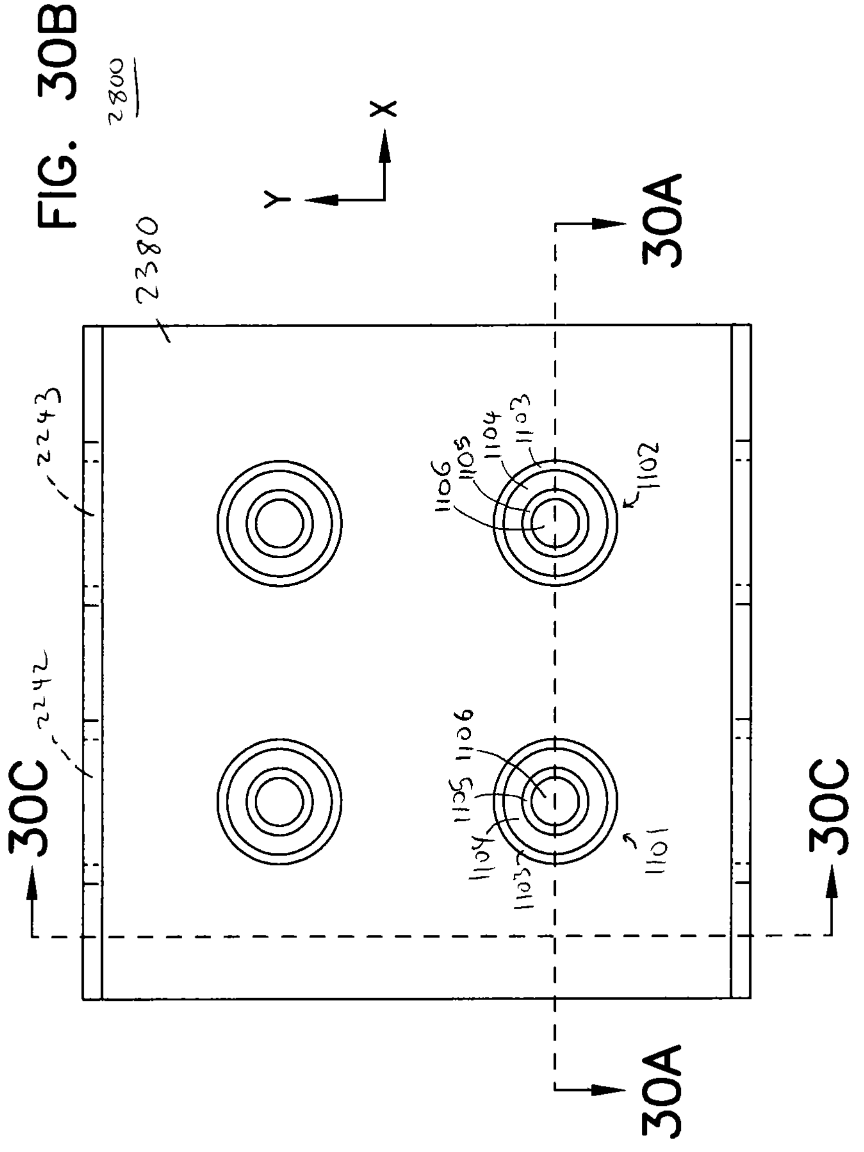
Figure 30C:
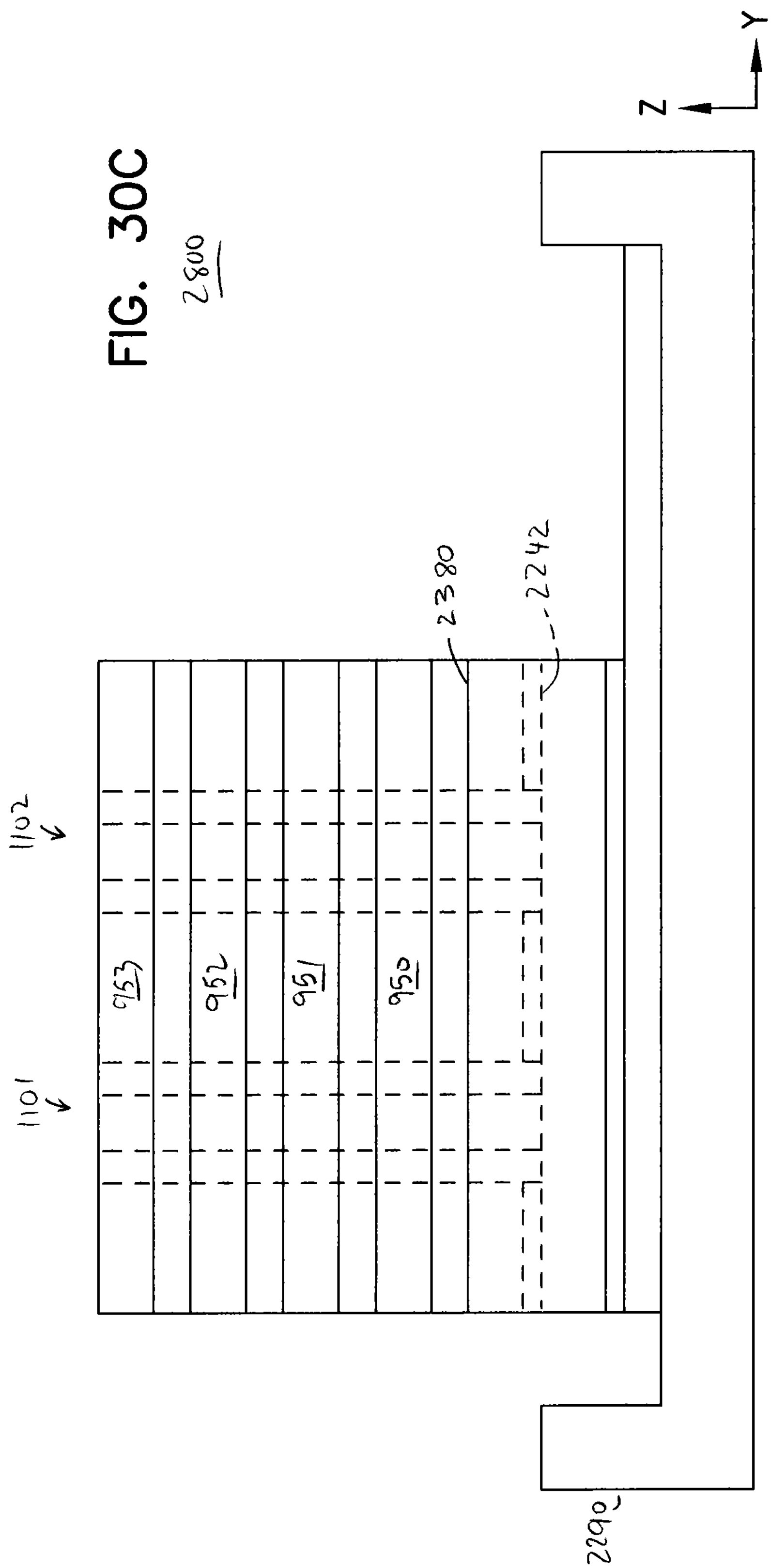

FIG. 30A, FIG. 30B, and FIG. 30C show memory device 2800 after pillars 1101 and 1102 have been formed. FIG. 30B shows a top view of memory device 2800 of FIG. 11A. FIG. 30C shows another view of memory device 2800 along line 30C of FIG. 30B. As shown in FIG. 30A, each of pillars 1101 and 1102 can include materials 1103, 1104, 1105 and 1106. In FIG. 30B, materials 901, 902, 903, 904, 950, 951, 952, and 953 (in FIG. 30A) are omitted in order to show material 2380 and substrate portions 2242 and 2243 (under material 2380). The processes associated with forming pillars 1101 and 1102 in FIG. 30A, FIG. 30B, and FIG. 30C can be similar to or identical to those described above with reference to FIG. 26A and FIG. 26B.

Figure 31:
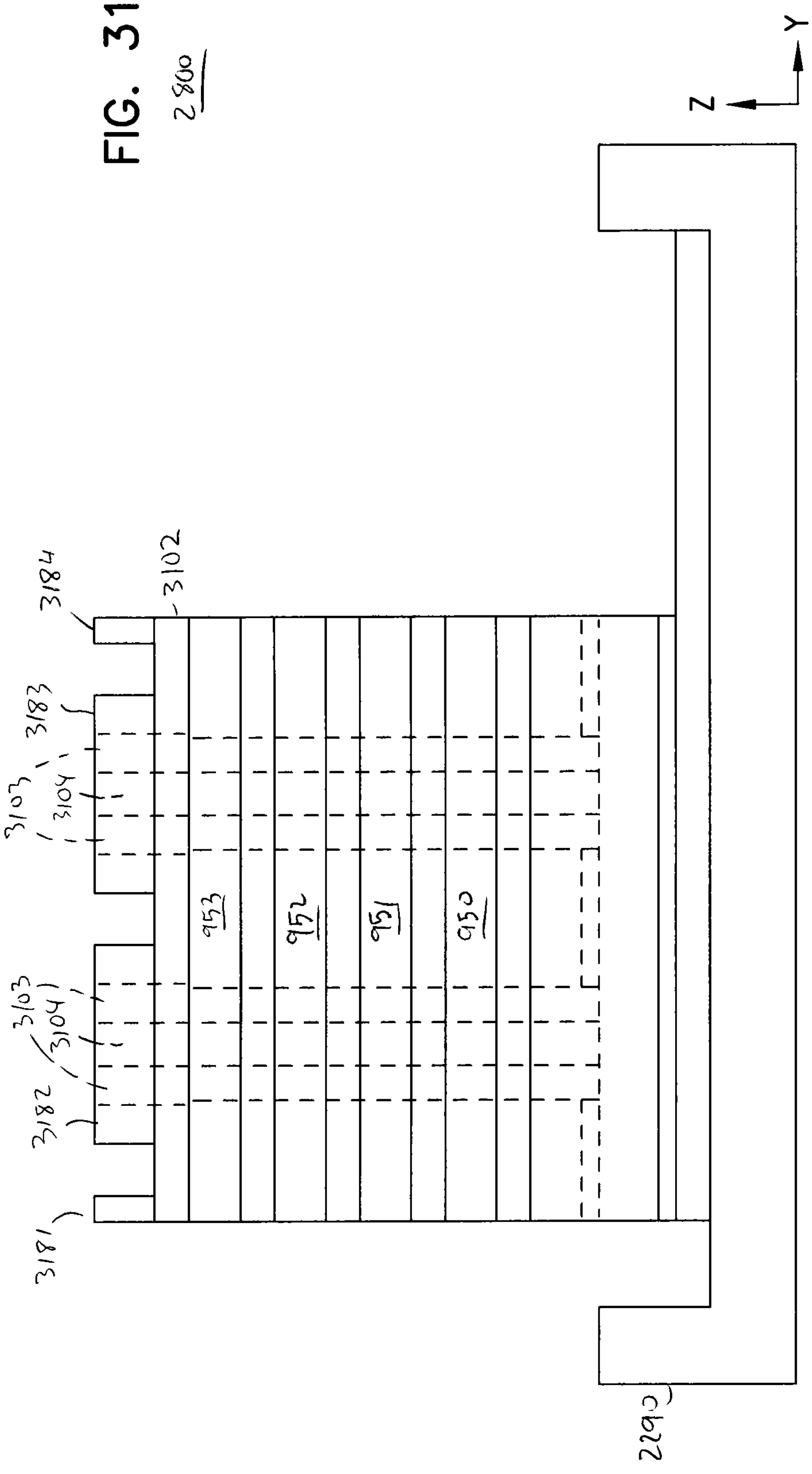

FIG. 31 shows memory device 2800 after materials 3102, 3103, and 3104 and material portions 3181, 3182, 3183, and 3184 have been formed. The materials and the processes of forming materials 3102, 3103, 3104 and material portions 3181, 3182, 3183, and 3184 can be similar to or identical those of material 1202, 1203, and 1204, material portions 1385, 1386, 1387, and 1388, respectively, described above with reference to FIG. 12A, FIG. 12B, FIG. 13A, and FIG. 13B.

Figure 32:
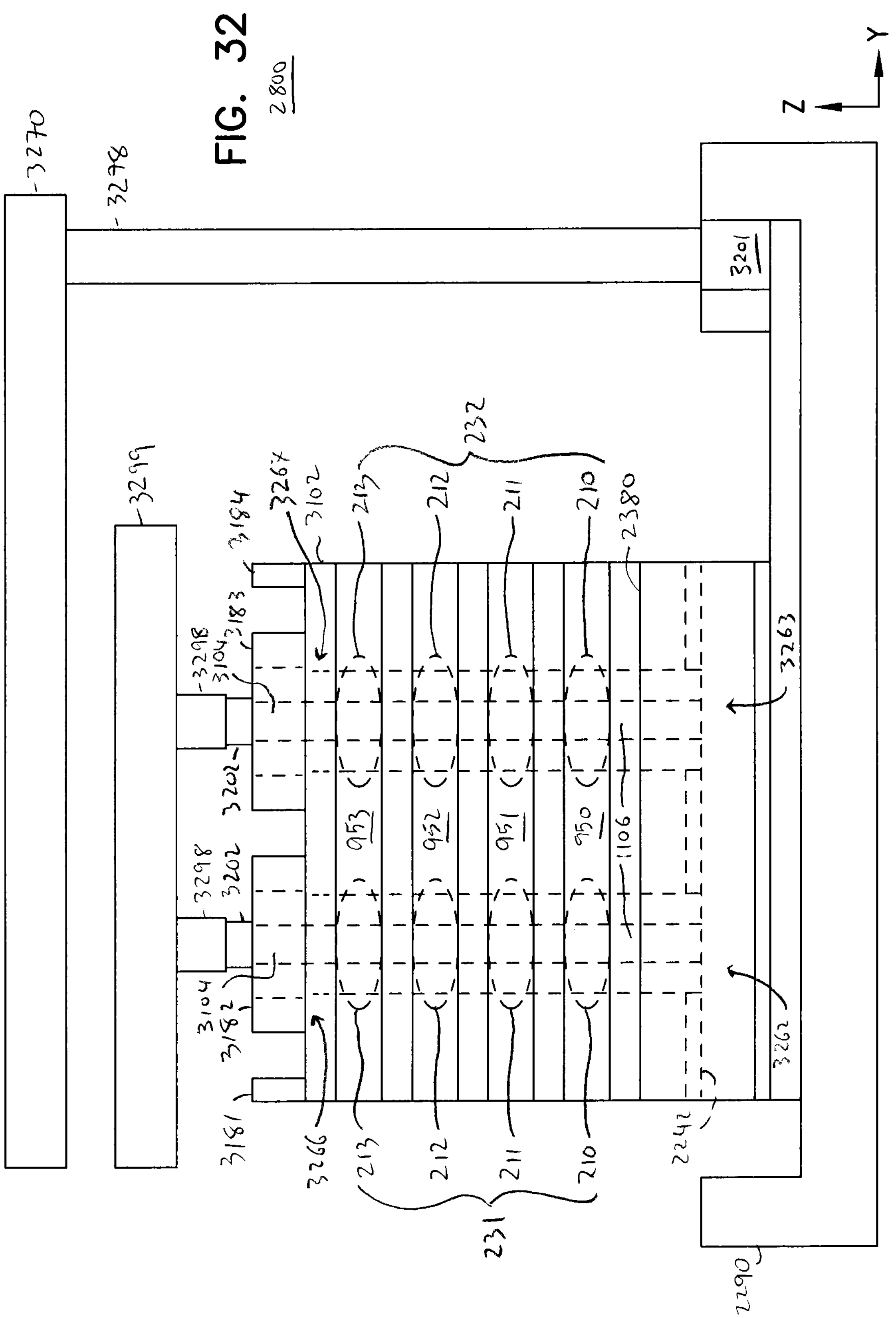
Figure 33A:
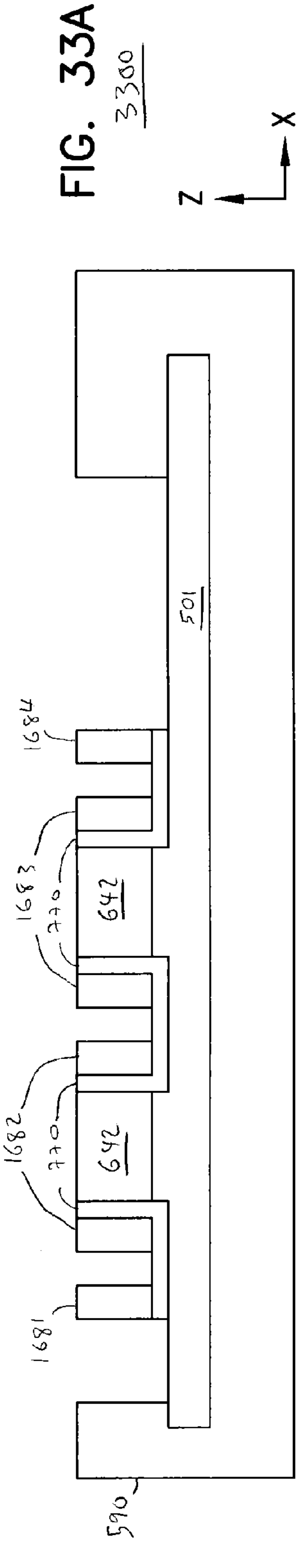
FIG. 33A through FIG. 37B show processes of forming a memory device (e.g., the memory device of FIG. 4A) with separate top drain select gates and separate bottom source select gates, according to an embodiment of the invention.
Figure 33B:
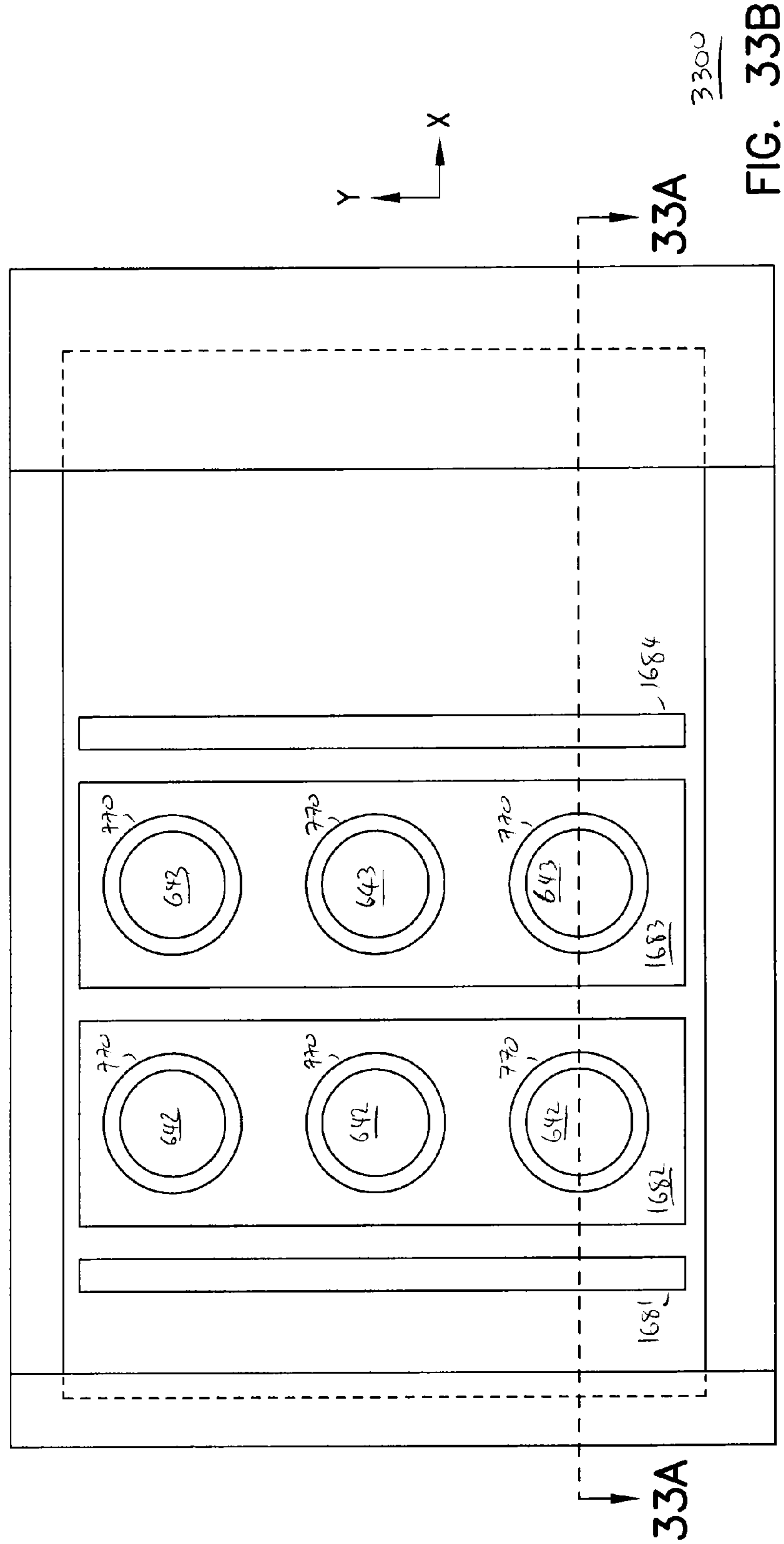

FIG. 32 shows memory device 2800 after materials 3201 and 3202, conductive contacts 3278 and 3298, and conductive lines 3270 and 3299 have been formed. The material and processes associated with forming materials 3201 and 3202, conductive contacts 3278 and 3298, and conductive lines 3270 and 3299 in FIG. 32 can be similar to or identical to those of materials 2711 and 2712, conductive contacts 2778 and 2798, and conductive lines 2770 and 2799, respectively, described above with reference to FIG. 27.

As shown in FIG. 32, memory device 2800 can include memory cells 210, 211, 212, and 213 located in different levels of memory device 2800, such as different levels in the z-direction. Memory cells 210, 211, 212, and 213 can be arranged in memory cell strings 231 and 232. Memory cell strings 231 and 232 in FIG. 32 can correspond to memory cell string 231 and 232 of memory device 300B of FIG. 3B. In FIG. 32, each of memory cell strings 231 and 232 can include a body (e.g., body located between materials 3104 and substrate portion 2242) formed at least in part by material 1106.

Conductive lines 3270 and 3299 can correspond to lines 270 and 299, respectively, of memory device 300B of FIG. 3B.

Materials 950, 951, 952, and 953 in FIG. 32 can form control gates that are located along the body (e.g., body formed at least in part by material 1106) of each of memory cell strings 231 and 232. These control gates (e.g., formed by materials 950, 951, 952, and 953) can correspond to control gates 250, 251, 252, and 253, respectively, associated with corresponding memory cell strings 231 and 232 of memory device 300B of FIG. 3B.

Material portions 3181, 3182, 3183, and 3184 in FIG. 32 can form gates (e.g., source select gates) of memory device 2800 that can correspond to gates 281, 282, 283, and 284, respectively, of memory device 300B of FIG. 3B. Material 2380 in FIG. 32 can form a gate (e.g., drain select gate) of memory device 2800 that can correspond to gate 289 of memory device 300B of FIG. 3B.

Memory device 2800 in FIG. 32 can include transistors 3262 and 3263. Transistor 3262 can include at least a part of substrate portion 2242 (e.g., portion coupled to memory cell string 231) that can form a body region of transistor 3262. Transistor 3263 can include at least a part of substrate portion 2242 (e.g., portion coupled to memory cell string 232) that can form a body region of transistor 3263. Transistors 3262 and 3263 can share the same gate (e.g., drain select gate), which can be formed by material 2380. As shown in FIG. 32, at least a portion of the shared gate (e.g., formed by material 2380) of transistors 3262 and 3263 can be located in substrate 2290 and can surround at least a portion of each of the body regions of transistors 3262 and 3263 (e.g., body regions formed by at least a part of substrate portion 2242). Transistors 3262 and 3263 can correspond to transistors 262 and 263, respectively, associated with corresponding memory cell strings 231 and 232 of memory device 300B of FIG. 3B.

Memory device 2800 in FIG. 32 can include transistors 3266 and 3267. Transistor 3266 can include at least a part of material 3104 (coupled to memory cell string 231) that can form a body region of transistor 3266. Transistor 3267 can include part of material 3104 (coupled to memory cell string 232) that can form a body region of transistor 3267. Transistors 3266 and 3267 can include separate gates. For example, at least a part of material portion 3182 can form a gate of transistor 3266. At least a part of material portion 3183 can form a gate of transistor 3267. Transistor 3266 and 3267 can correspond to transistors 266 and 267, respectively, associated with corresponding memory cell strings 231 and 232 of memory device 300B of FIG. 3B.

FIG. 33A through FIG. 37B show processes of forming a memory device 3300, according to an embodiment of the invention. The processes described with reference to FIG. 33A through FIG. 37B can also be used to form memory device 400A of FIG. 4A with separate top drain select gates and separate bottom source select gates (e.g., gates (top) 285, 286, 287, and 288 and gates (bottom) 281, 282, 283, and 284 in FIG. 4A).

Some of the processes used to form memory devices 500 and 1500 described above with reference to FIG. 5 though FIG. 21B can be used to form memory device 3300 described herein with reference to FIG. 33A through FIG. 37B. Thus, for simplicity, the same reference numbers are given to similar or identical materials and features associated with forming memory devices 500 and 1500 and forming memory device 3300 (FIG. 33A through FIG. 37B). Detailed description of the processes associated with forming such similar or identical materials and features is not repeated in the description of FIG. 33A through FIG. 37B. For example, materials and features in FIG. 33A and FIG. 33B can be similar to those in FIG. 16A and FIG. 16B, including substrate 590, material 501, pedestals 642 and 643, material 770, and material portions 1681, 1682, 1683, and 1684. FIG. 33B shows a top view memory device 3300 of FIG. 33A.

Figure 34:
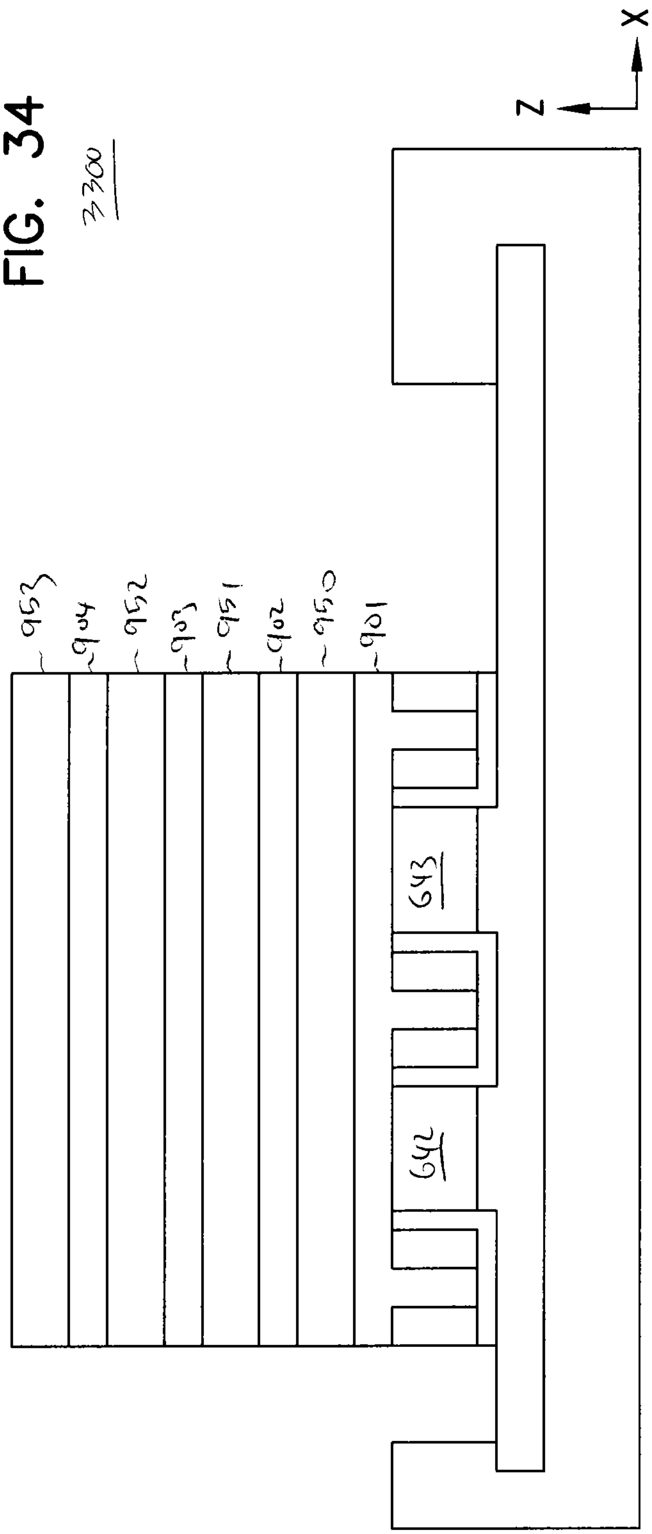

FIG. 34 shows memory device 3300 after materials 901, 902, 903, 904, 950, 951, 952, and 953 have been formed.

Figure 35A:
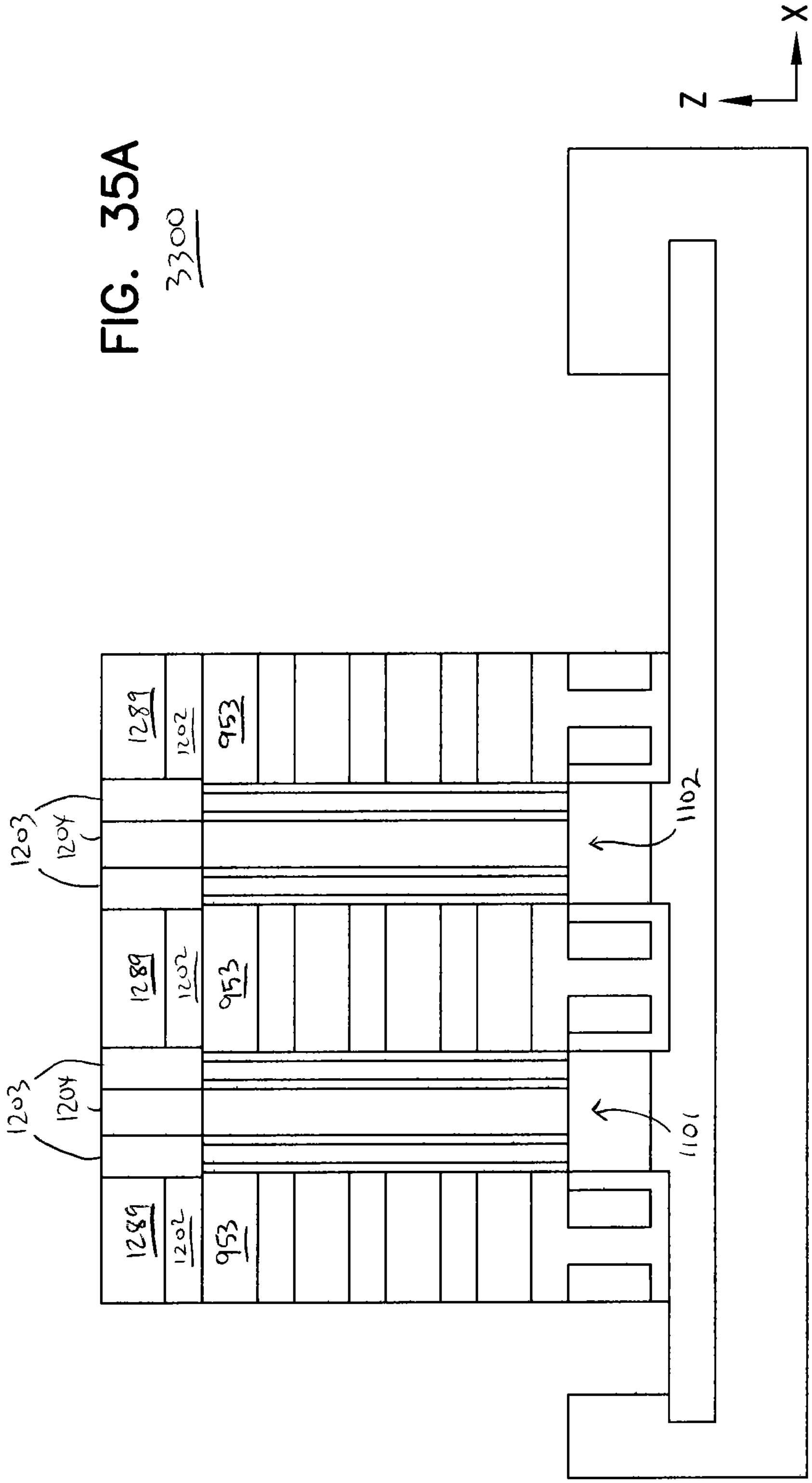
Figure 35B:
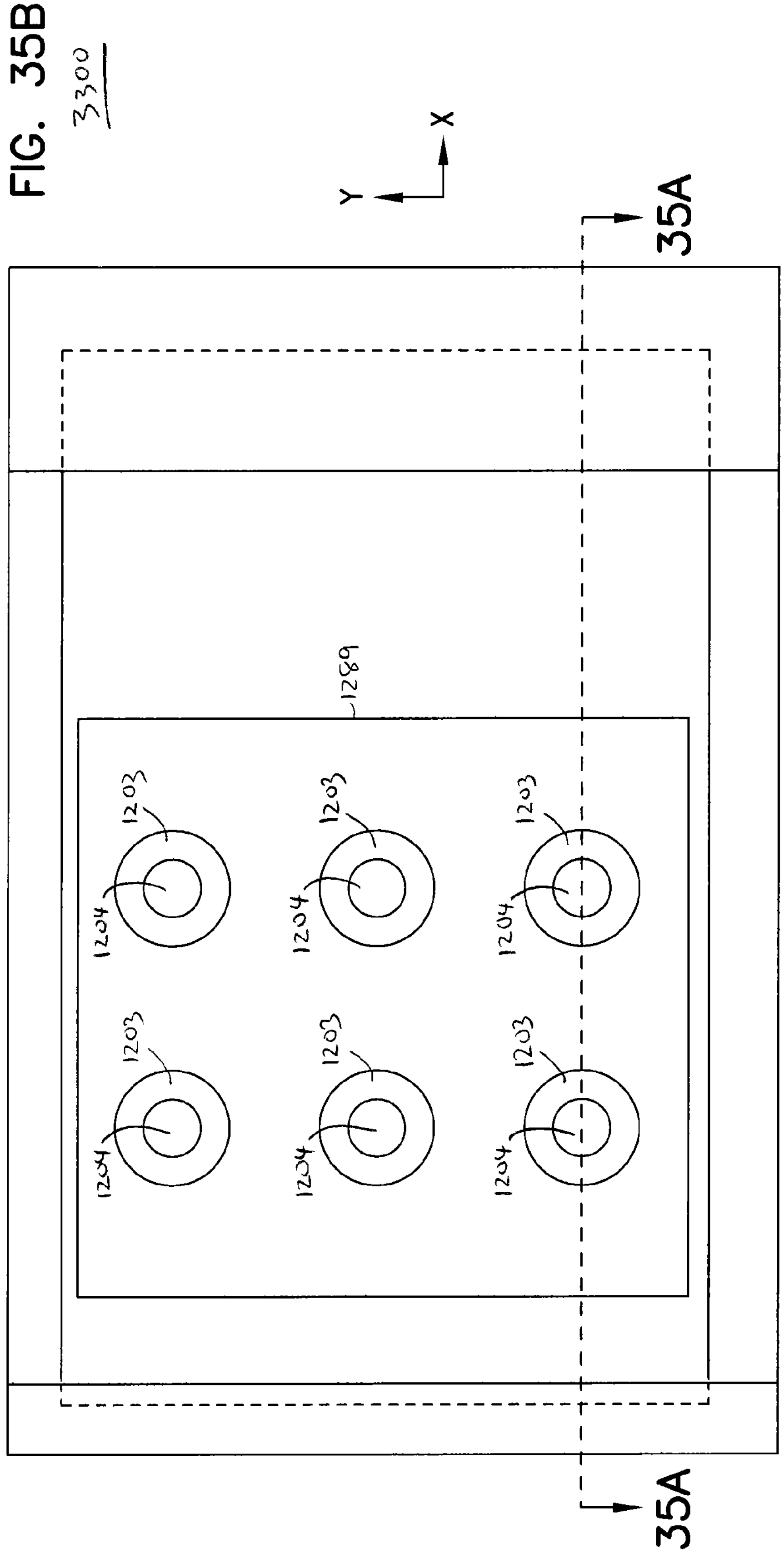

FIG. 35A and FIG. 35B show memory device 3300 after pillars 1101 and 1102, and materials 1202, 1203, 1204, and 1289 have been formed.

Figure 36A:
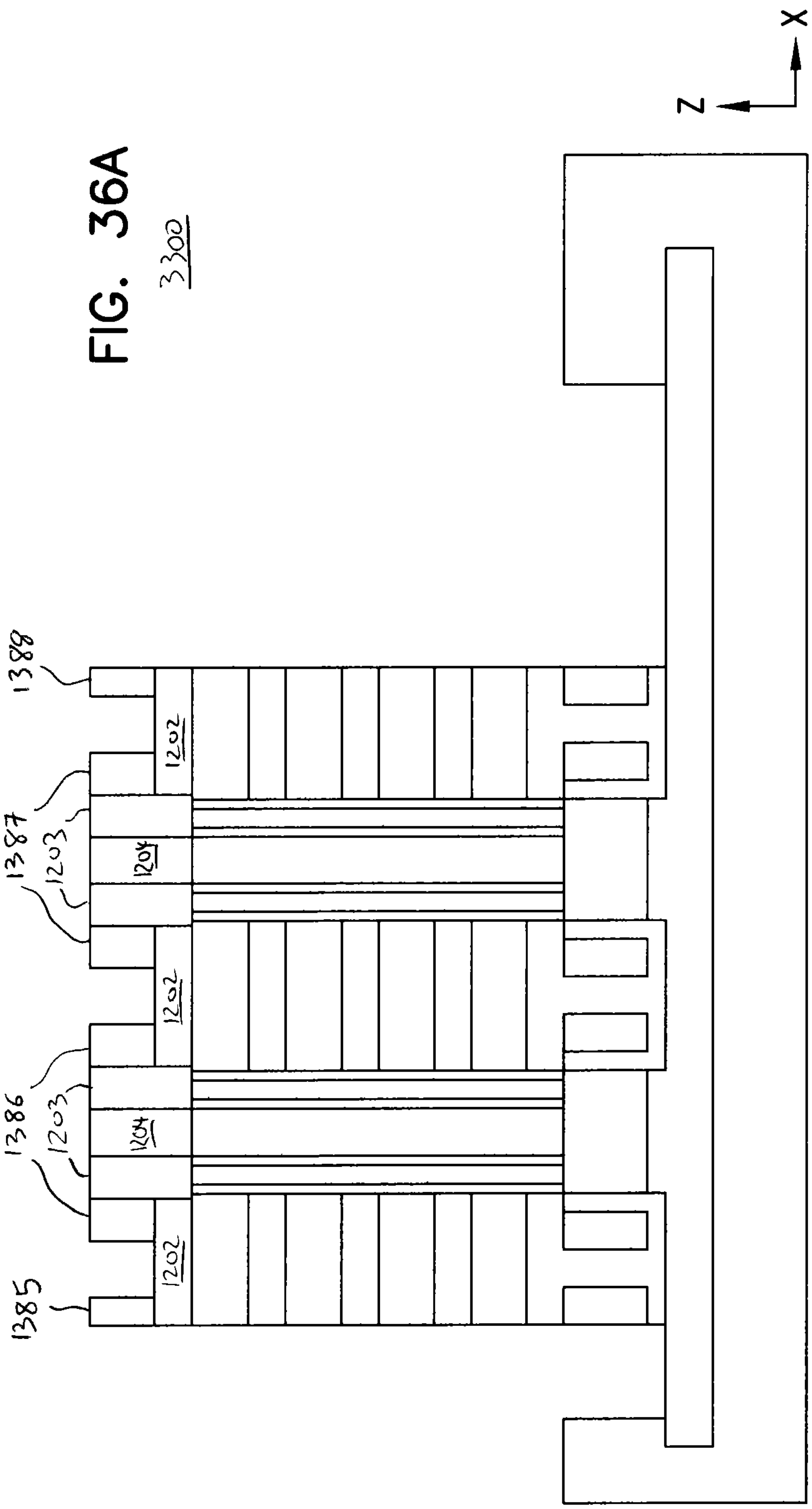
Figure 36B:
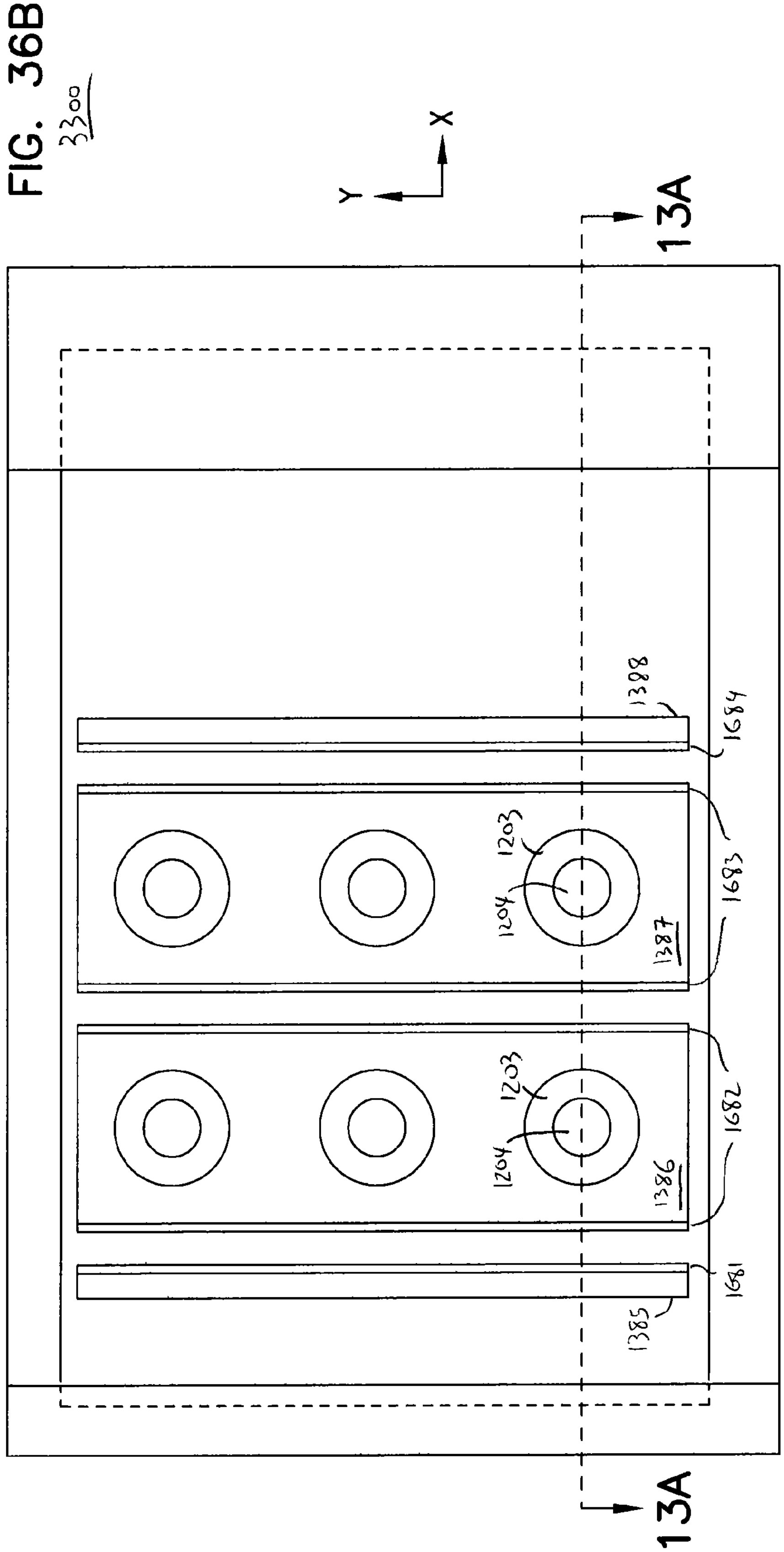

FIG. 36A and FIG. 36B show memory device 3300 after material portions 1385, 1386, 1387, and 1388 have been formed. FIG. 36B shows a top view of memory device 3300 of FIG. 36A.

Figure 37A:
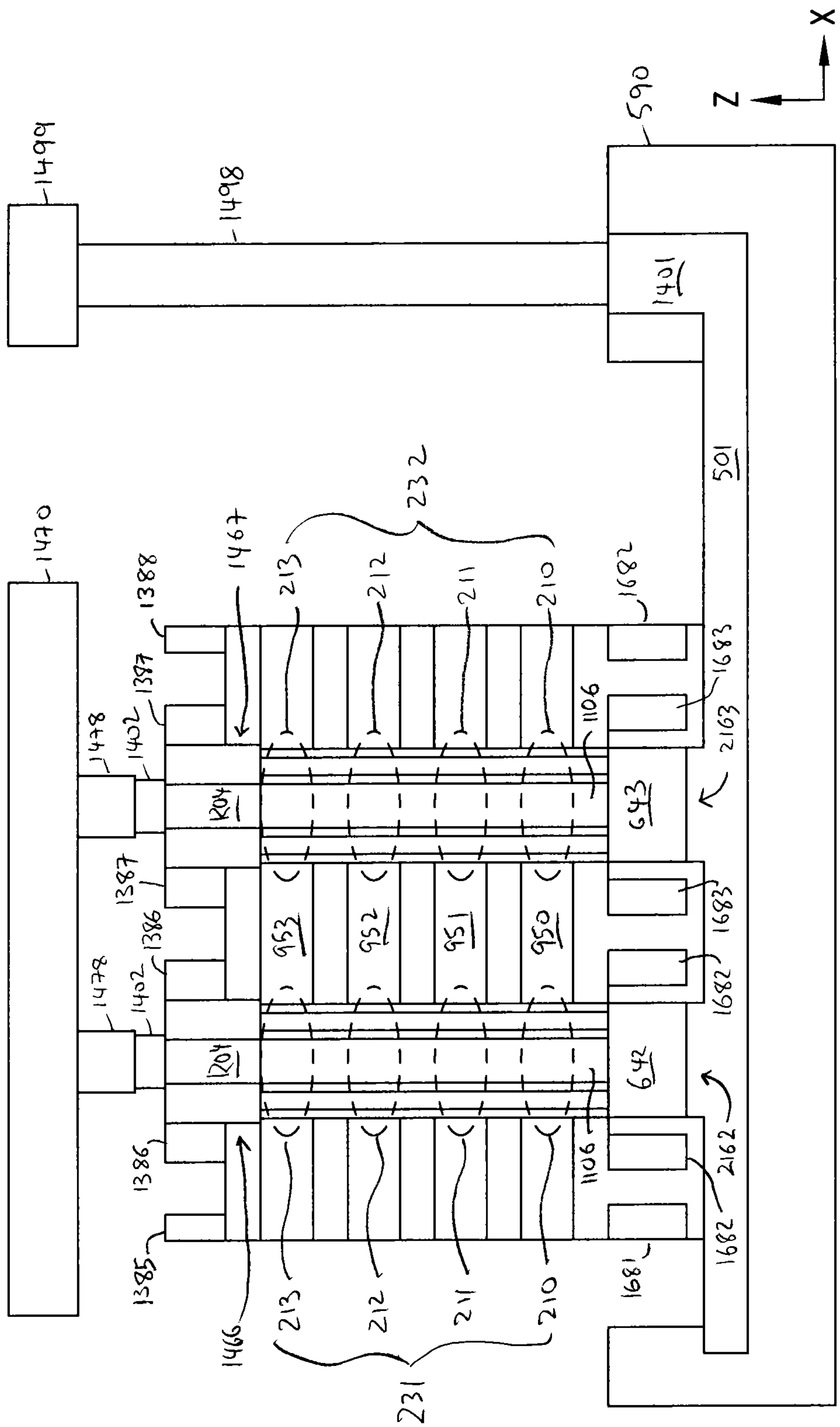
Figure 37B:
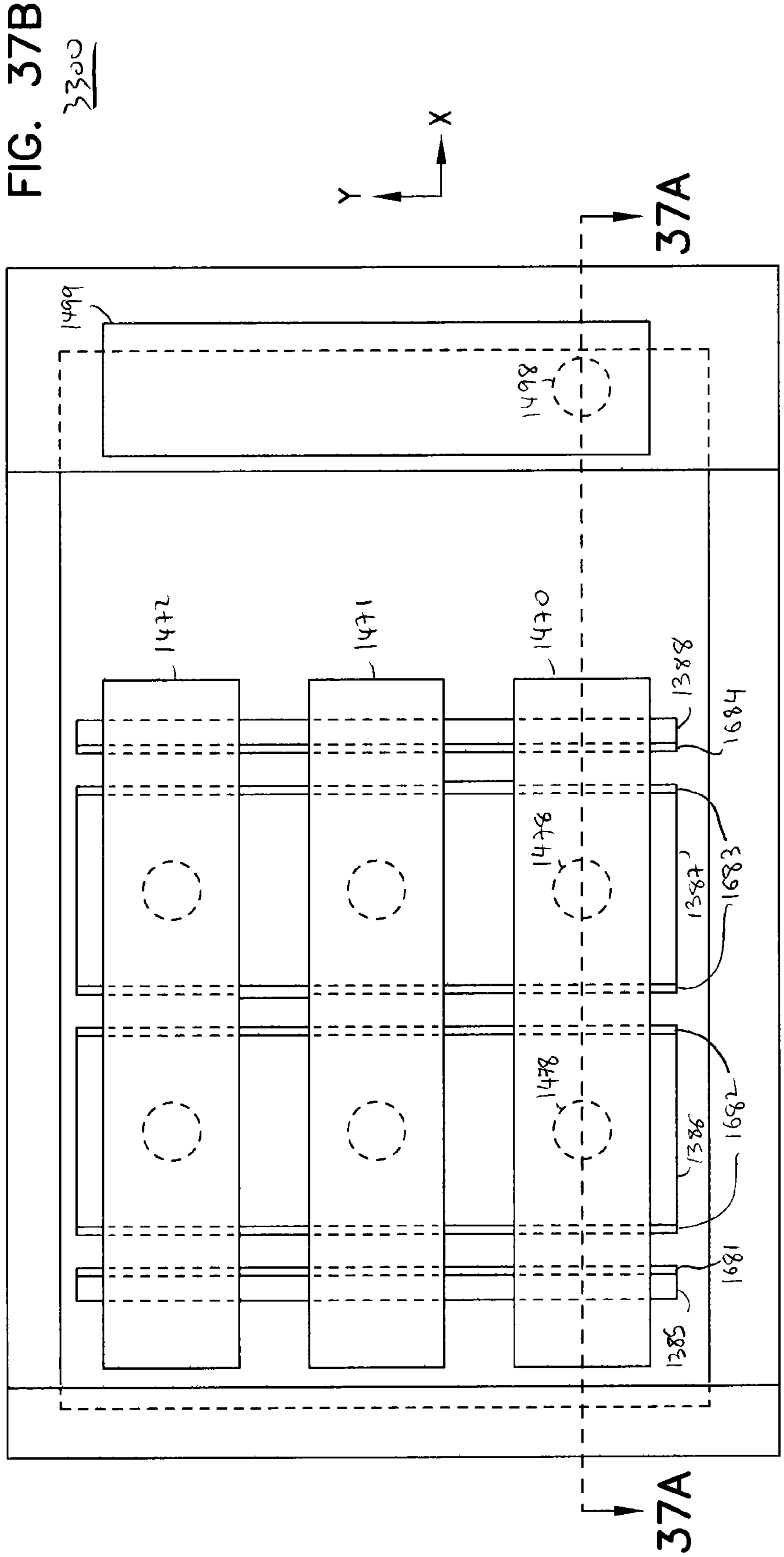

FIG. 37A and FIG. 37B show memory device 3300 after materials 1401 and 1402, conductive contacts 1478 and 1498, and conductive lines 1470, 1471, 1472, and 1499 have been formed. FIG. 37B shows a top view of memory device 3300 of FIG. 37A.

Conductive lines 1470, 1471, 1472, and 1499 can correspond to lines 270, 271, 272, and 299, respectively, of memory device 400A of FIG. 4A.

Material portions 1385, 1386, 1387, and 1388 in FIG. 37A can form gates (e.g., drain select gates) of memory device 3300 that can correspond to gates 285, 286, 287, and 288, respectively, of memory device 400A of FIG. 4A. Material portions 1681, 1682, 1683, and 1684 in FIG. 37A can form gates (e.g., source select gates) of memory device 3300 that can correspond to gates 281, 282, 283, and 284, respectively, of memory device 400A of FIG. 4A.

As shown in FIG. 37A, memory device 3300 can include features similar to those of memory device 500 shown in FIG. 14A and memory device 1500 show in FIG. 21A. For example, memory device 3300 in FIG. 37A can include memory cells 210, 211, 212, and 213 arranged in memory cell strings 231 and 232, and transistors 1466, 1467, 2162, and 2163.

Memory cell strings 231 and 232 in FIG. 37A can correspond to memory cell string 231 and 232 of memory device 400A of FIG. 4A. Transistors 1466 and 1466 in FIG. 37A can correspond to transistors 266 and 267, respectively, associated with corresponding memory cell strings 231 and 232 of memory device 400A of FIG. 4A. Transistors 2162 and 2163 in FIG. 37A can correspond to transistors 262 and 263, respectively, associated with corresponding memory cell strings 231 and 232 of memory device 400A of FIG. 4A.

Figure 38:
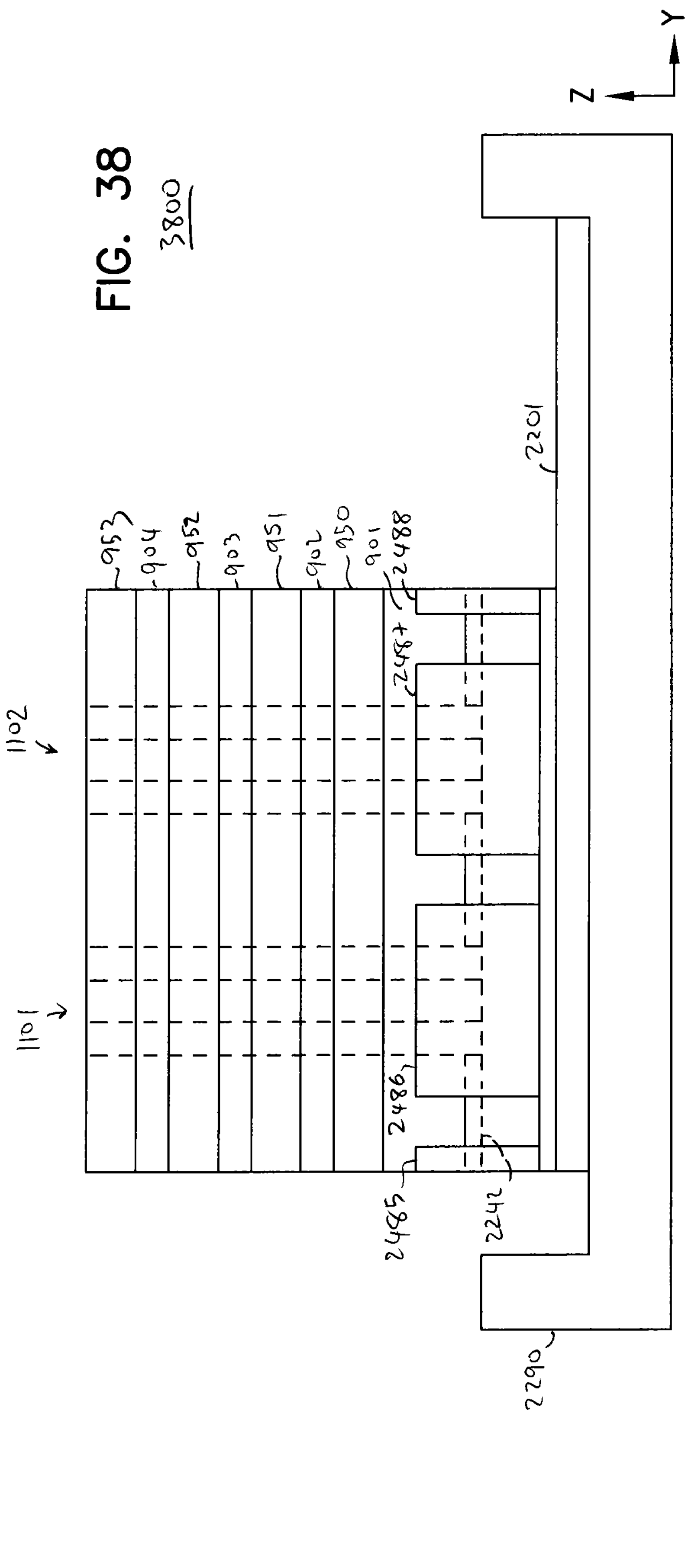
FIG. 38 through FIG. 40 show processes of forming a memory device (e.g., the memory device of FIG. 4B) with separate top source select gates and separate bottom drain select gates, according to an embodiment of the invention.
Figure 39:
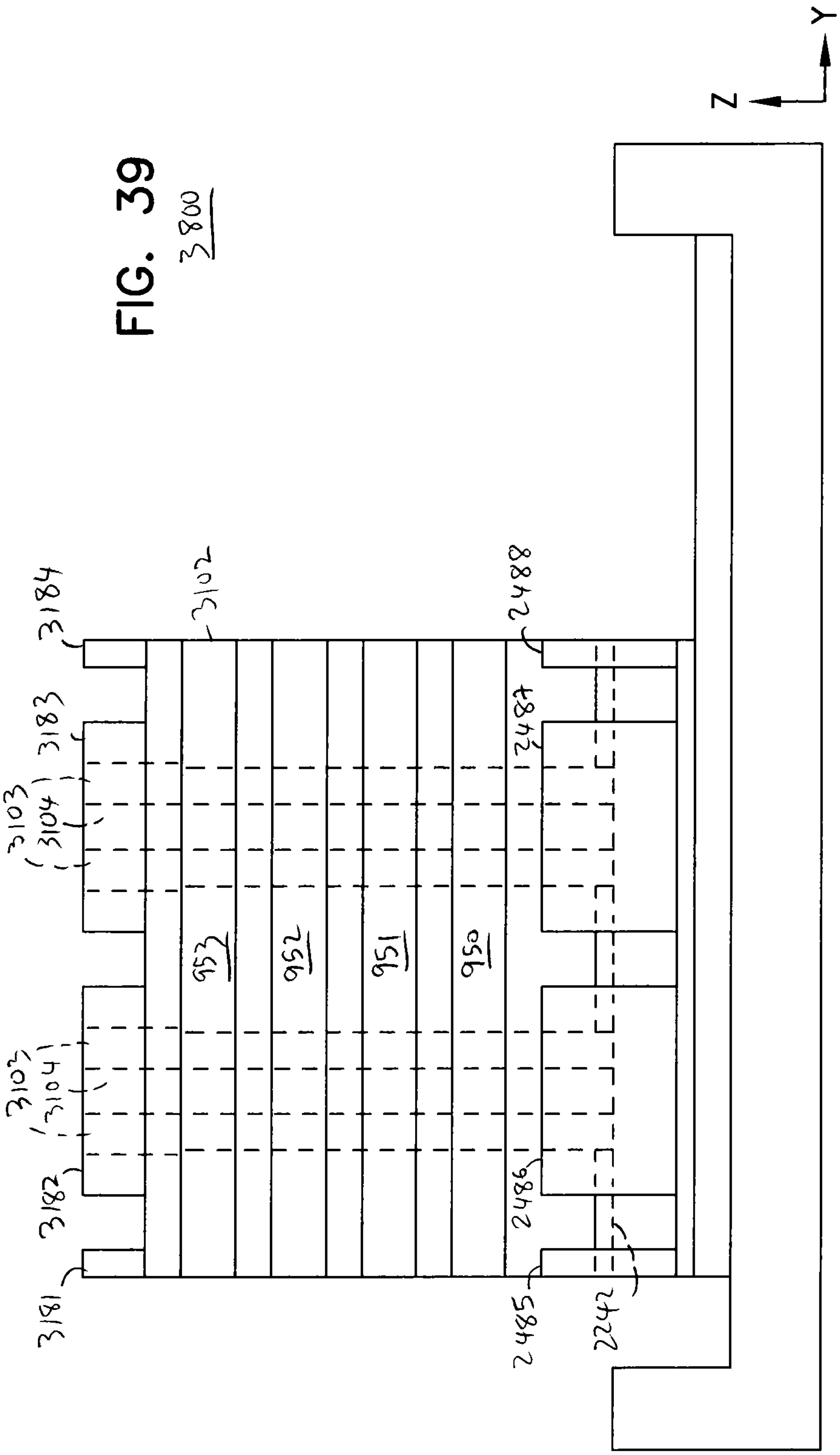
Figure 40:
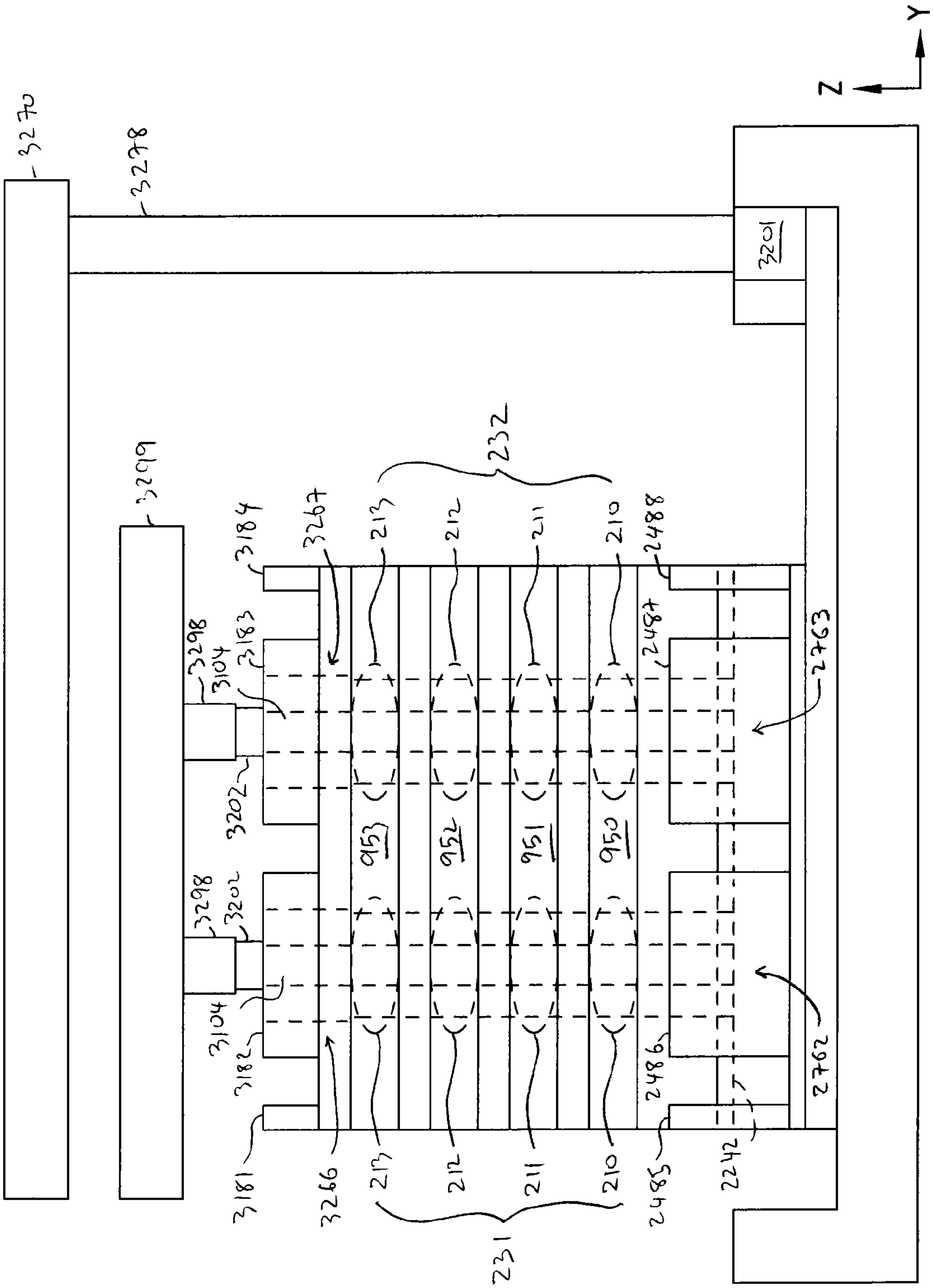

FIG. 38 through FIG. 40 show processes of forming a memory device 3800, according to an embodiment of the invention. The processes described with reference to FIG. 38 through FIG. 40 can also be used to form memory device 400B of FIG. 4B with separate top source select gates and separate bottom drain select gates (e.g., gates (top) 281, 282, 283, and 284 and gates (bottom) 285, 286, 287, and 288 in FIG. 4B).

Some of the processes used to form memory devices 500 and 1500 described above with reference to FIG. 22A though FIG. 32 can be used to form memory device 3800 described herein with reference to FIG. 38 through FIG. 40. Thus, for simplicity, the same reference numbers are given to similar or identical materials and features associated with forming memory devices 2200 and forming memory device 3800 (FIG. 38 through FIG. 40). Detailed description of the processes associated with forming such similar or identical materials and features is not repeated in the description of FIG. 38 through FIG. 40. For example, materials and features in FIG. 38 can be similar to those in FIG. 26C, including substrate 2290, material 2201, substrate portion 2242, material portions 2485, 2486, 2487, and 2488, materials 901, 902, 903, 904, 950, 951, 952, and 953, and pillars 1101 and 1102.

FIG. 39 shows memory device 3800 after materials 3102, 3103, and 3104 and material portions 3181, 3182, 3183, and 3184 have been formed.

FIG. 40 shows memory device 3800 after materials 3201 and 3202, conductive contacts 3278 and 3298, and conductive lines 3270 and 3299 have been formed.

Material portions 3181, 3182, 3183, and 3184 in FIG. 40 can form gates (e.g., source select gates) of memory device 3800 that can correspond to gates 281, 282, 283, and 284, respectively, of memory device 400B of FIG. 4B. Material portions 2485, 2486, 2487, and 2488 in FIG. 40 can form gates (e.g., drain select gates) of memory device 3800 that can correspond to gates 285, 286, 287, and 288, respectively, of memory device 400B of FIG. 4B.

As shown in FIG. 40, memory device 3800 can include features similar to those of memory device 2200 shown in FIG. 27 and memory device 2800 show in FIG. 32. For example, memory device 3800 in FIG. 40 can include memory cells 210, 211, 212, and 213 arranged in memory cell strings 231 and 232, and transistors 2762, 2763, 3266, and 3267.

Memory cell strings 231 and 232 in FIG. 40 can correspond to memory cell string 231 and 232 of memory device 400B of FIG. 4B. Transistors 2762 and 2763 in FIG. 40 can correspond to transistors 262 and 263, respectively, associated with corresponding memory cell strings 231 and 232 of memory device 400B of FIG. 4B. Transistors 3266 and 3267 in FIG. 40 can correspond to transistors 266 and 267, respectively, associated with corresponding memory cell strings 231 and 232 of memory device 400B of FIG. 4B.

The illustrations of apparatuses (e.g., memory devices 100, 200A, 200B, 300A, 300B, 400A, 400B, 500, 1500, 2200, 2800, 3300, and 3800) and methods (e.g., processes associated with FIG. 5 through FIG. 40) are intended to provide a general understanding of the structure of various embodiments and are not intended to provide a complete description of all the elements and features of apparatuses that might make use of the structures described herein. An apparatus herein refers to, for example, either a device (e.g., memory devices 100, 200A, 200B, 300A, 300B, 400A, 400B, 500, 1500, 2200, 2800, 3300, and 3800) or a system (e.g., a computer, a cellular phone, or other electronic system) that includes a device such as memory devices memory devices 100, 200A, 200B, 300A, 300B, 400A, 400B, 500, 1500, 2200, 2800, 3300, and 3800.

Any of the components described above with reference to FIG. 1 through FIG. 40 can be implemented in a number of ways, including simulation via software. Thus, apparatuses (e.g., memory devices 100, 200A, 200B, 300A, 300B, 400A, 400B, 500, 1500, 2200, 2800, 3300, and 3800) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200A, 200B, 300A, 300B, 400A, 400B, 500, 1500, 2200, 2800, 3300, and 3800 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 40 include apparatuses and methods having a memory cell string with memory cells located in different levels of the apparatuses and a select transistor coupled to the memory cell string. In at least one of such apparatuses, the select transistor can include a body region including a monocrystalline semiconductor material. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

a memory cell string including memory cells located in different levels of the apparatus; and a select transistor coupled to the memory cell string, the select transistor including a body region, wherein the body region includes a monocrystalline semiconductor material, and the body region comprises at least a part of a pedestal formed of the monocrystalline semiconductor material, the memory cell string overlying the pedestal.

2. The apparatus of claim 1, wherein a gate of the select transistor surrounds at least a portion of the body region.

3. The apparatus of claim 2, wherein at least a portion of the gate is located in a substrate that includes the monocrystalline semiconductor material.

4. The apparatus of claim 2, wherein the select transistor shares the gate with another select transistor coupled to an adjacent memory cell string, wherein the memory cell string and the adjacent memory cell string can be selectively coupled to a same data line.

5. The apparatus of claim 4, wherein the select transistor comprises a source select transistor.

6. The apparatus of claim 2, wherein the select transistor does not share the gate with another select transistor coupled to an adjacent memory cell string, wherein the memory cell string and the adjacent memory cell string can be selectively coupled to a same data line.

7. An apparatus comprising:

a memory cell string including memory cells located in different levels of the apparatus; and a select transistor coupled to the memory cell string, the select transistor including a body region, wherein the body region includes a monocrystalline semiconductor material, and the body region comprises at least a part of a portion of a substrate comprising the monocrystalline semiconductor material, the memory cell string overlying a location of the portion of the substrate.

8. The apparatus of claim 7, wherein a gate of the select transistor surrounds at least a portion of the body region.

9. The apparatus of claim 7, wherein the select transistor comprises a source select transistor.

10. The apparatus of claim 7, wherein the select transistor comprises a drain select transistor.

11. The apparatus of claim 7, further comprising a source coupled to the select transistor, wherein the select transistor is located between the source and the memory cell string.

12. The apparatus of claim 7, further comprising a data line coupled to the select transistor, wherein the select transistor is located between the data line and the memory cell string.

13. An apparatus comprising:

a memory cell string including memory cells located in different levels of the apparatus;

a select transistor coupled to the memory cell string, the select transistor including a body region, wherein the body region includes a monocrystalline semiconductor material;

an additional memory cell string; and an additional select transistor coupled to the additional memory cell string, the additional select transistor including an additional body region, the additional body region including a monocrystalline semiconductor material, wherein the transistor and the additional transistor share a gate.

14. An apparatus comprising:

a memory cell string including memory cells located in different levels of the apparatus;

a select transistor coupled to the memory cell string, the select transistor including, a body region, wherein the body region includes a monocrystalline semiconductor material;

an additional memory cell string; and an additional select transistor coupled to the additional memory cell string, the additional select transistor including an additional body region, the additional body region including a monocrystalline semiconductor material, wherein the transistor and the additional transistor include separate gates.

15. The apparatus of claim 13, wherein the apparatus comprises a memory device including the memory cell string and the select transistor.

16. The apparatus of claim 14, wherein the apparatus comprises a system including a memory device that includes the memory cell string and the select transistor.

17. An apparatus comprising:

a substrate;

a select transistor including a gate, wherein at least a portion of the gate is located in the substrate; and a memory cell string coupled to the select transistor.

18. The apparatus of claim 17, wherein the select transistor includes a body region, wherein the gate surrounds at least a portion of the body region.

19. The apparatus of claim 17, wherein the select transistor includes a body region, and the body region includes a monocrystalline semiconductor material.

20. The apparatus of claim 17, wherein the select transistor includes a body region, and the body region and the substrate have a same material.

* * * * *

UNITED STATES PATENT AND TRADEMARK OFFICE

CERTIFICATE OF CORRECTION

PATENT NO. : 8,837,222 B2
APPLICATION NO. : 13/282237
DATED : September 16, 2014
INVENTOR(S) : Toru Tanzawa It is certified that error appears in the above-identified patent and that said Letters Patent is hereby corrected as shown below:

In the Claims,

In column 20, line 32, in Claim 14, delete "including," and insert -- including --, therefor.

Signed and Sealed this
Eighteenth Day of November, 2014

Michelle K. Lee

Michelle K. Lee
*Deputy Director of the United States Patent and Trademark Office*